(12) United States Patent
Takachi et al.

(10) Patent No.: US 12,349,482 B2
(45) Date of Patent: Jul. 1, 2025

(54) BACKSIDE ILLUMINATION TYPE SOLID-STATE IMAGING DEVICE, MANUFACTURING METHOD FOR BACKSIDE ILLUMINATION TYPE SOLID-STATE IMAGING DEVICE, IMAGING APPARATUS AND ELECTRONIC EQUIPMENT

(71) Applicant: SONY SEMICONDUCTOR SOLUTIONS CORPORATION, Kanagawa (JP)

(72) Inventors: Taizo Takachi, Kanagawa (JP); Yuichi Yamamoto, Kanagawa (JP); Suguru Saito, Kanagawa (JP); Satoru Wakiyama, Kanagawa (JP); Yoichi Ootsuka, Kumamoto (JP); Naoki Komai, Kanagawa (JP); Kaori Takimoto, Kanagawa (JP); Tadashi Iijima, Kanagawa (JP); Masaki Haneda, Kanagawa (JP); Masaya Nagata, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 175 days.

(21) Appl. No.: 16/758,535

(22) PCT Filed: Oct. 16, 2018

(86) PCT No.: PCT/JP2018/038423
§ 371 (c)(1),
(2) Date: Apr. 23, 2020

(87) PCT Pub. No.: WO2019/087764
PCT Pub. Date: May 9, 2019

(65) Prior Publication Data
US 2020/0258924 A1    Aug. 13, 2020

(30) Foreign Application Priority Data

Oct. 30, 2017 (JP) ................................ 2017-208864
Mar. 28, 2018 (JP) ................................ 2018-062477

(51) Int. Cl.
*H10F 39/12* (2025.01)
*H10F 39/00* (2025.01)

(52) U.S. Cl.
CPC ......... *H10F 39/199* (2025.01); *H10F 39/802* (2025.01); *H10F 39/811* (2025.01)

(58) Field of Classification Search
CPC .......... H01L 27/1464; H01L 27/14603; H01L 27/14636; H01L 25/0657; H01L 25/043;
(Continued)

(56) References Cited

U.S. PATENT DOCUMENTS

| 8,906,781 B2 | 12/2014 | Jeon |
| 2008/0093721 A1 | 4/2008 | Kang et al. |

(Continued)

FOREIGN PATENT DOCUMENTS

| CN | 104064574 A | 9/2014 |
| CN | 105940493 A | 9/2016 |

(Continued)

OTHER PUBLICATIONS

English translation JP2014187166 A.*
(Continued)

*Primary Examiner* — Latanya N Crawford Eason
(74) *Attorney, Agent, or Firm* — SHERIDAN ROSS P.C.

(57) ABSTRACT

The present disclosure relates to a backside illumination type solid-state imaging device, a manufacturing method for a backside illumination type solid-state imaging device, an imaging apparatus, and electronic equipment by which the manufacturing cost can be reduced. A singulated memory
(Continued)

circuit and a singulated logic circuit are laid out in a horizontal direction and are embedded by an oxide film and flattened, and then are stacked so as to be contained in a plane direction under a solid-state imaging element. The present disclosure can be applied to an imaging apparatus.

22 Claims, 52 Drawing Sheets

(58) Field of Classification Search
CPC . H01L 25/0652; H01L 25/065; H10F 39/199; H10F 39/811; H10F 39/802; H04N 25/70
See application file for complete search history.

(56) References Cited

U.S. PATENT DOCUMENTS

| | | | |
|---|---|---|---|
| 2010/0238331 | A1 | 9/2010 | Umebayashi |
| 2012/0018879 | A1 | 1/2012 | Shin |
| 2012/0056288 | A1* | 3/2012 | Yoshihara ......... H01L 27/14636 257/431 |
| 2012/0098133 | A1* | 4/2012 | Yang ................. H01L 21/02304 438/758 |
| 2012/0199930 | A1 | 8/2012 | Hayashi |
| 2014/0284744 | A1 | 9/2014 | Fujil et al. |
| 2015/0162371 | A1* | 6/2015 | Fujii ................. H01L 27/14634 257/431 |
| 2015/0200222 | A1* | 7/2015 | Webster ............... H01L 31/107 250/208.1 |
| 2015/0270307 | A1 | 9/2015 | Umebayashi |
| 2015/0348943 | A1 | 12/2015 | Chen |
| 2015/0349003 | A1* | 12/2015 | Lin ................... H01L 27/14645 438/65 |
| 2016/0284753 | A1* | 9/2016 | Komai .............. H01L 27/14645 |
| 2017/0323920 | A1* | 11/2017 | Kumar ................ H01L 27/1464 |
| 2018/0040584 | A1 | 2/2018 | Kang et al. |
| 2018/0091723 | A1* | 3/2018 | Funaki .................... H04N 5/363 |
| 2018/0233526 | A1* | 8/2018 | Kumar .............. H01L 27/14698 |
| 2018/0301443 | A1* | 10/2018 | Kim ...................... H01L 23/367 |
| 2018/0350785 | A1* | 12/2018 | Fong .................... H01L 21/8221 |
| 2019/0103425 | A1* | 4/2019 | Yoon ................. H01L 27/14634 |
| 2020/0161201 | A1 | 5/2020 | Park et al. |
| 2020/0194474 | A1* | 6/2020 | Meynants ......... H01L 27/14665 |

FOREIGN PATENT DOCUMENTS

| | | |
|---|---|---|
| CN | 106133912 A | 11/2016 |
| CN | 107278328 A | 10/2017 |
| DE | 102018122234 A | 4/2019 |
| EP | 2528093 | 11/2012 |
| JP | H01-218042 | 8/1989 |
| JP | H06252341 A | 9/1994 |
| JP | 2004-008406 | 1/2004 |
| JP | 2006128196 A | 5/2006 |
| JP | 2012134231 A | 7/2012 |
| JP | 2012164870 A | 8/2012 |
| JP | 2013187529 A | 9/2013 |
| JP | 2014-099582 | 5/2014 |
| JP | 2014-103395 | 6/2014 |
| JP | 2014187166 A | 10/2014 |
| JP | 2016171297 A | 9/2016 |
| JP | 2017/139325 | 8/2017 |
| KR | 20100091362 A | 8/2010 |
| KR | 20110047133 A | 5/2011 |
| KR | 101334220 B1 | 11/2013 |
| KR | 20150066527 A | 6/2015 |
| TW | 200810054 A | 2/2008 |
| TW | 200824058 A | 6/2008 |
| TW | 201108387 A | 3/2011 |
| TW | 201241999 A | 10/2012 |
| TW | 201421658 A | 6/2014 |
| TW | 201541621 A | 11/2015 |
| TW | 201607011 A | 2/2016 |
| TW | 201630176 A | 8/2016 |
| TW | 201703221 A | 1/2017 |
| WO | WO-2012133760 A1 | 10/2012 |
| WO | WO 2015/004867 | 1/2015 |
| WO | WO-2016143288 A1 | 9/2016 |
| WO | WO 2016/170833 | 10/2016 |
| WO | WO 2017/149983 | 9/2017 |
| WO | WO 2017/169480 | 10/2017 |

OTHER PUBLICATIONS

International Search Report and Written Opinion prepared by the Japanese Patent Office on Dec. 10, 2018, for International Application No. PCT/JP2018/038423.
Official Action for U.S. Appl. No. 17/841,513, dated Jul. 20, 2023, 11 pages.
Extended European Search Report for Europe Patent Application No. 18872679.8, dated Nov. 16, 2020, 9 pages.
Article 94(3) Communication for Europe Patent Application No. 18872679.8, dated Apr. 5, 2024, 6 pages.

* cited by examiner

BACKSIDE ILLUMINATION TYPE SOLID-STATE IMAGING DEVICE, MANUFACTURING METHOD FOR BACKSIDE ILLUMINATION TYPE SOLID-STATE IMAGING DEVICE, IMAGING APPARATUS AND ELECTRONIC EQUIPMENT

CROSS REFERENCE TO RELATED APPLICATIONS

This application is a national stage application under 35 U.S.C. 371 and claims the benefit of PCT Application No. PCT/JP2018/038423 having an international filing date of 16 Oct. 2018, which designated the United States, which PCT application claimed the benefit of Japanese Patent Application Nos. 2017-208864 filed 30 Oct. 2017 and 2018-062477 filed 28 Mar. 2018, the entire disclosures of each of which are incorporated herein by reference.

TECHNICAL FIELD

The present disclosure relates to a backside illumination type solid-state imaging device, a manufacturing method for a backside illumination type solid-state imaging device, an imaging apparatus and electronic equipment, and particularly to a backside illumination type solid-state imaging device, a manufacturing method for a backside illumination type solid-state imaging device, an imaging apparatus and electronic equipment by which the manufacturing cost can be reduced.

BACKGROUND ART

A solid-state imaging device achieves high picture quality in the form of Hi-Vision, 4 k×2 k Super Hi-Vision and a super slow-motion function, and together with this, the number of pixels increases and a high frame rate and a high gradation are attained.

Since the transmission rate is calculated by the number of pixels×frame rate×gradation, for example, in the case of 4 k×2 k=8M pixels, a frame rate of 240 f/s and a gradation of 14 bits, the transmission rate is 8M×240 f/s×14 bits=26 Gbps.

After signal processing by the succeeding stage of a solid-state imaging element, RGB signals of a color coordinate are outputted, and therefore, higher-speed transmission of 26 G×3=78 Gbps is required.

If high-speed transmission is performed with a reduced number of connection terminals, then the signal rate per one connection terminal becomes high and the difficulty for impedance matching of a high-speed transmission path increases. Further, since not only the clock frequency but also the loss increases, power consumption increases.

In order to avoid this, it is sufficient if the number of connection terminals is increased such that transmission is divided to decrease the signal rate. However, increase of the number of connection terminals increases the package size of individual circuits because terminals necessary for connection between a solid-state imaging element and a signal processing circuit or a memory circuit on the following stage are arranged.

Also, as a substrate for electric wiring necessary for a signal processing circuit or a memory circuit on the succeeding stage, a substrate having a finer wire density based on stacked wiring is required, and this further increases the wiring path length. Together with this, the power consumption increases.

If the package size of individual circuits becomes great, then also the size of a substrate itself for mounting becomes great, and the imaging apparatus configuration itself in which the solid-state imaging element is to be incorporated finally becomes great.

Therefore, as a technology for downsizing the configuration of an imaging apparatus, a technology is proposed by which a solid-state imaging element and a circuit such as a signal processing circuit or a memory circuit are stacked by WoW (Wafer on Wafer) for connecting the circuits both in the form of a wafer (refer to PTL 1).

Since, by a stacking technology using the WoW, a semiconductor can be connected by many fine wires, the transmission speed per one wire becomes low and the power consumption can be suppressed.

CITATION LIST

Patent Literature

PTL 1
Japanese Patent Laid-Open No. 2014-099502

SUMMARY

Technical Problem

However, in the case of the WoW, if chips of wafers to be stacked have a same size, there is no problem. However, if the sizes of the chips configured as wafers are different from each other, then the sizes must be adjusted to that of the greatest chip, and the theoretical yield for each circuit is degraded and the cost increases.

Further, in regard to the yield of each of wafers to foe stacked, by a defect of a chip of each wafer, also a chip of the stacked wafers is treated as a defect, and since the yield of the wafers in the entire stacked layers is given by the product (cross) of the yields of the wafers, the yield is degraded and the cost increases.

Also, a technology has been proposed by which chips whose sizes are different from each other are connected to each other by forming small bumps on them. In this case, since chips selected as good products and having different, sizes are connected through the bumps, the influence of the theoretical yield difference between the wafers and the yield of the chips is small.

However, since it is difficult to form small bumps and the connection pitch is limited, a greater number of connection terminals than that by the WoW cannot be obtained. Further, since the connection is performed by a mounting process, if the number of connection terminals increases, then the cost increases due to yield degradation by the connection. Further, since also connection in the mounting process is performed for individual wires, long time is required for the connection and the process cost increases.

The present disclosure has been made in view of such a situation as described above and specifically makes it possible to reduce the manufacturing cost of a solid-state imaging device.

Solution to Problem

A solid-state imaging element of one aspect of the present disclosure is a backside illumination type solid-state imaging device including: a first semiconductor element including an imaging element configured to generate a pixel signal in a unit of a pixel; a second semiconductor element in which signal processing circuits necessary for signal processing of the pixel signal are embedded by an embedding member; and a wire that electrically connects the first semiconductor element and the second semiconductor element; the first semiconductor element and the second semiconductor element being stacked by oxide film joining.

The first semiconductor element may be greater than the second semiconductor element.

The first semiconductor element may smaller than the second semiconductor element.

The backside illumination type solid-state imaging device may be configured such that the signal processing circuits include a first signal processing circuit and a second signal processing circuit, and the second semiconductor element has therein the first signal processing circuit and the second signal processing circuit arranged in a juxtaposed relation in a horizontal direction and embedded by the embedding member.

The backside illumination type solid-state imaging device may be configured such that the signal processing circuits include a first signal processing circuit and a second signal processing circuit, the wire includes a first wire and a second wire, the second semiconductor element has therein the first signal processing circuit embedded by the embedding member, the solid-state imaging device includes a third semiconductor element in which the second signal processing circuit is embedded by the embedding member, the first wire electrically connects the first semiconductor element and the second semiconductor element to each other, the second wire electrically connects the second semiconductor element and the third semiconductor element to each other, and the second semiconductor element and the third semiconductor element are stacked by oxide film joining.

The wire, may be joined by CuCu joining.

The wire may the first semiconductor element and the second semiconductor element through a through-via.

The wire may electrically connect the first semiconductor element and the second semiconductor element through a through-via formed from an imaging face side of the imaging element.

The wire may electrically connect the first semiconductor element and the second semiconductor element through a through-via formed from a face on an opposite side to an imaging face of the imaging element.

The embedding member may include an oxide film.

The embedding member may include an organic material.

The backside illumination type solid-state imaging device may be configured such that, in the second semiconductor element, the signal processing circuits are laid out such that a gap between the signal processing circuits is minimized, and the gap is filled with the embedding member including the organic material.

In the second semiconductor element, in addition to the signal processing circuits, a dummy circuit configured from a semiconductor element and including a dummy wire may be embedded by the embedding member.

A heat, dissipation member that includes a member having a thermal conductivity higher than a predetermined thermal conductivity and dissipates heal may be stacked on a face of the second semiconductor element opposite to a face on which the first semiconductor element is stacked.

The heat dissipation member may include Sic, AlN, SIN, Cu, Al, and C.

The heat dissipation member may include a waterway for circulating cooling water.

The signal processing circuits may include a logic circuit, a memory circuit, a power supply circuit, an image signal compression circuit, a clock circuit, and an optical communication conversion circuit.

The signal processing circuits may be embedded in the first semiconductor element by the embedding member.

The signal processing circuits may be each embedded by the embedding member after contacted at part thereof in a positioned state with the first semiconductor element and gradually joined to the first semiconductor element beginning with a portion around the contacted portion.

The part may include an end side and an end point of the signal processing circuit.

The signal processing circuit may be smaller than the first semiconductor element.

The signal processing circuits may be each embedded by the embedding member after contacted at part thereof in a positioned state with the second semiconductor element and gradually joined to the second semiconductor element beginning with a portion around the contacted portion.

The part may include an end side and an end point of the signal processing circuit.

A manufacturing method for a solid-state imaging device of one aspect of the present disclosure is a manufacturing method for a backside illumination type solid-state imaging device that includes a first semiconductor element including an imaging element configured to generate a pixel signal in a unit of a pixel, a second semiconductor element in which signal processing circuits necessary tor signal processing of the pixel signal are embedded by an embedding member, and a wire that electrically connects the first semiconductor element and the second semiconductor element, the first semi conductor element and the second semi conductor element being stacked by oxide film joining. A first wafer including the imaging element formed by a semiconductor process and a second wafer in which the signal processing circuit decided as a good product by electric inspection from among the signal processing circuits formed by a semiconductor process is rearranged and embedded by the embedding member are stacked by oxide film joining such that the wire between the first semiconductor element and the second semiconductor element is electrically connected and then are singulated.

An imaging apparatus of one aspect of the present disclosure is an imaging apparatus including a backside illumination type solid-state imaging device that includes a first semiconductor element including an imaging element configured to generate a pixel signal in a unit of a pixel, a second semiconductor element in which signal processing circuits necessary for signal processing of the pixel signal are embedded by an embedding member, and a wire that electrically connects the first, semiconductor element, and the second semiconductor element, the first semiconductor element and the second semiconductor element being stacked by oxide film joining.

Electronic equipment of one aspect of the present disclosure is electronic equipment including a backside illumination type solid-state imaging device that includes a first semiconductor element including an imaging element configured to generate a pixel signal in a unit of a pixel, a second semiconductor element in which signal processing circuits necessary for signal processing of the pixel signal are embedded by an embedding member, and a wire that electrically connects the first semiconductor element and the second semiconductor element, the first semiconductor element and the second semiconductor element being stacked by oxide film joining.

According to one aspect of the present disclosure, the first semiconductor element including the imaging element configured to generate a pixel signal in a unit of a pixel and the second semiconductor device in which signal processing circuits necessary for signal processing of the pixel signal are embedded by the embedding member are electrically connected by the wire, and the first semiconductor element and the second semiconductor element are stacked by oxide film joining.

Advantageous Effect of the Invention

According to one aspect of the present disclosure, the manufacturing cost especially of the solid-state imaging device can be decreased.

DESCRIPTION OF EMBODIMENTS

In the following, a mode for carrying out the present disclosure is described. It is to be noted that, in the present specification and the drawings, components having substantially same functional configurations are denoted by same reference signs, and overlapping description of them is omitted.

The description is given in the following order.
1. Overview of the Present Disclosure
2. First Embodiment
3. Second Embodiment
4. Third Embodiment
5. Fourth Embodiment
6. Fifth Embodiment
7. Modification of Fifth Embodiment
8. Sixth embodiment
9. Example of Connection to Solid-State Imaging Element
10. Modification of Example of Connection to Solid-State Imaging Element
11. Heat Dissipation Structure
12. Example of Application to Electronic Equipment
13. Example of Use of Imaging Element
14. Example of Application to Endoscopic Surgery System
15. Example of Application to Mobile Body

1. Overview of the Present Disclosure

The present disclosure reduces the manufacturing cost of a solid-state imaging device.

Here, before the present disclosure is described, the WoW (Wafer on Wafer) disclosed in PTL 1 is described.

Figure 1:
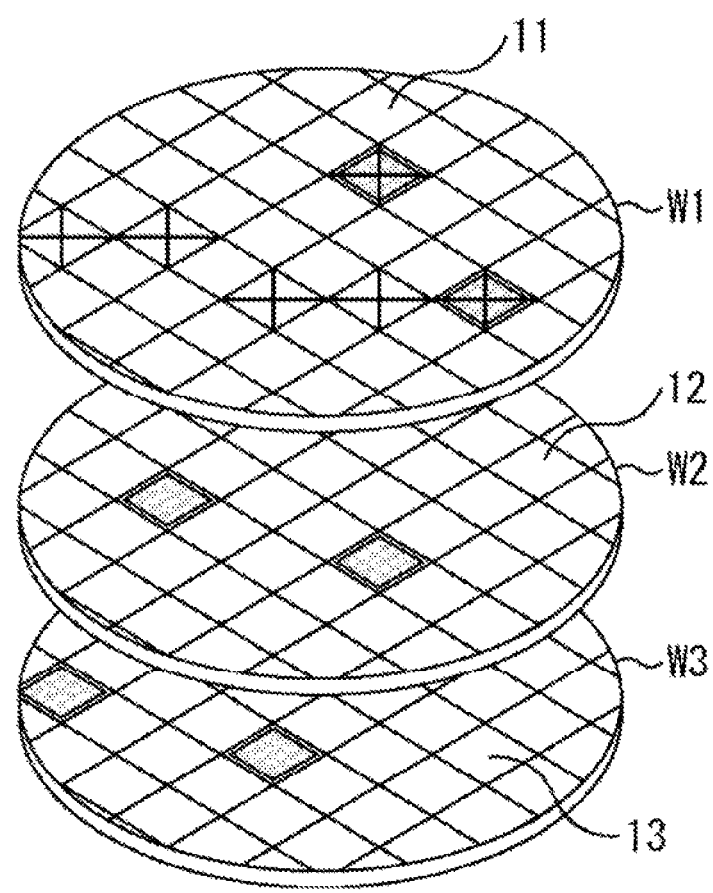
FIG. 1 is a view illustrating the yield.

The WoW is a technology and stacking a solid-state imaging device, a signal processing circuit, and circuits including ICs such as memory circuits each in the form of wafer, for example, as depicted in FIG. 1.

FIG. 1 schematically represents a WoW in which a wafer W1 on which a plurality of solid-state imaging elements 11 is formed, a wafer W2 on which a plurality of memory circuits 12 is formed, and a wafer W3 on which a plurality of logic circuits is formed are joined to and stacked on each other in a state in which they are positioned accurately relative to each other.

Figure 2:
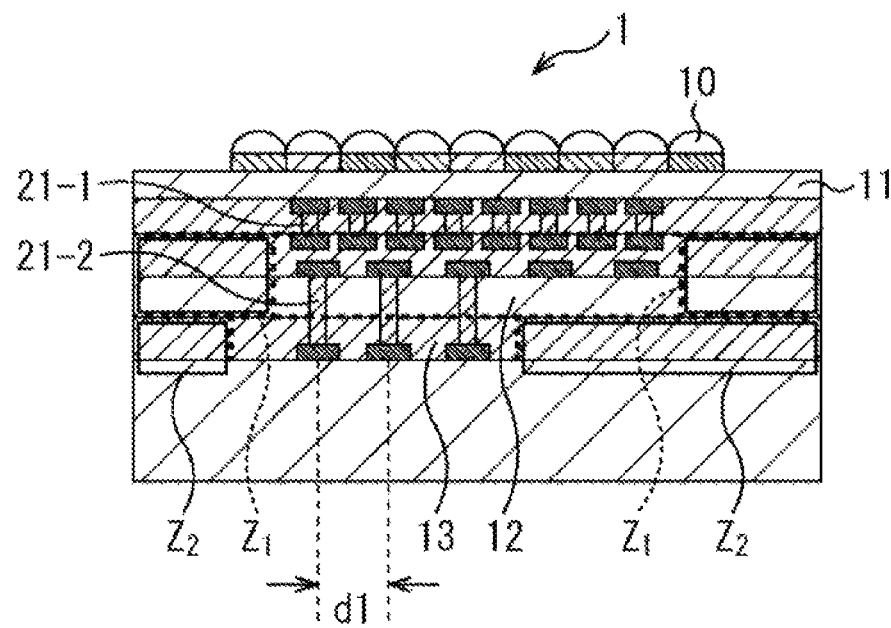
FIG. 2 is a view illustrating reduction of the theoretical yield.

By singulating the wafers stacked in this manner, such a solid-state imaging device as depicted, for example, in FIG. 2 is formed.

The solid-state imaging device 1 of FIG. 2 is configured such that an on-chip lens and on-chip color filter 10, a solid-state imaging element 11, a memory circuit 12, logic circuit 13 and a support substrate 14 are stacked in this order from above.

Here, by applying the technology of the WoW, wires 21-1 for electrically connecting the solid-state imaging element 11 and the memory circuit 12 and wires 21-2 for electrically connecting the memory circuit 12 and the logic circuit 13 can be connected at a fine pitch.

As a result, since the number of wires can be increased, the transmission speed in signal lines can be reduced and power saving can be anticipated.

However, since the areas necessitated for the solid-state imaging element 11, memory circuit 12 and logic circuit 13 to be stacked are different from one another, a space Z1 in which neither circuit nor wire are formed appears on the left and right in the figure of the memory circuit 12 that has an area smaller than that of the solid-state imaging element 11 that is greatest. Further, on the left and right of the logic circuit that has an area smaller than that of the memory circuit 12, a space Z2 in which neither circuit nor wire are formed appears.

In particular, the spaces Z1 and Z2 appear arising from that the areas necessitated by the solid-state imaging element 11, memory circuit 12 and logic circuit 13 are different from one another and, in FIG. 2, arising from that the they are stacked with reference to the solid-state imaging element 11 for which the largest area is necessitated.

This decreases the theoretical yield relating to manufacture of the solid-state imaging device 1 and, as a result, increases the cost required for manufacture.

Further, in FIG. 1, elements that are defective in the solid-state imaging element 11, the memory circuit 12, and the logic circuit 13 formed on the wafers W1 to W3, respectively, are individually represented by filled cells. In particular, FIG. 1 depicts that two defective elements appear in each of the wafers W1 to W3.

As depicted in FIG. 1, the defective elements appearing in the solid-state imaging element 11, the memory circuit 12, and the logic circuit 13 formed on the waters W1 to W3, respectively, are not necessarily termed at same positions. Therefore, as depicted in FIG. 1, in the solid-state imaging device 1 formed from the stack suffer from six defectives each indicated by a cross mark applied to the wafer W1 of the solid-state imaging element 11.

Consequently, in the six defective solid-state imaging devices 1, although at least two parts from among the three parts of the solid-state imaging element 11, memory circuit 12 and logic circuit 13 are not defective, they are treated as six defectives. Thus, although it is sufficient if the yield in regard to each part is two, the yield in regard to each part becomes six that is equal to an integrated number by the number of wafers.

As a result, the yield of the solid-state imaging devices 1 is decreased and the manufacturing cost is increased.

Figure 3:
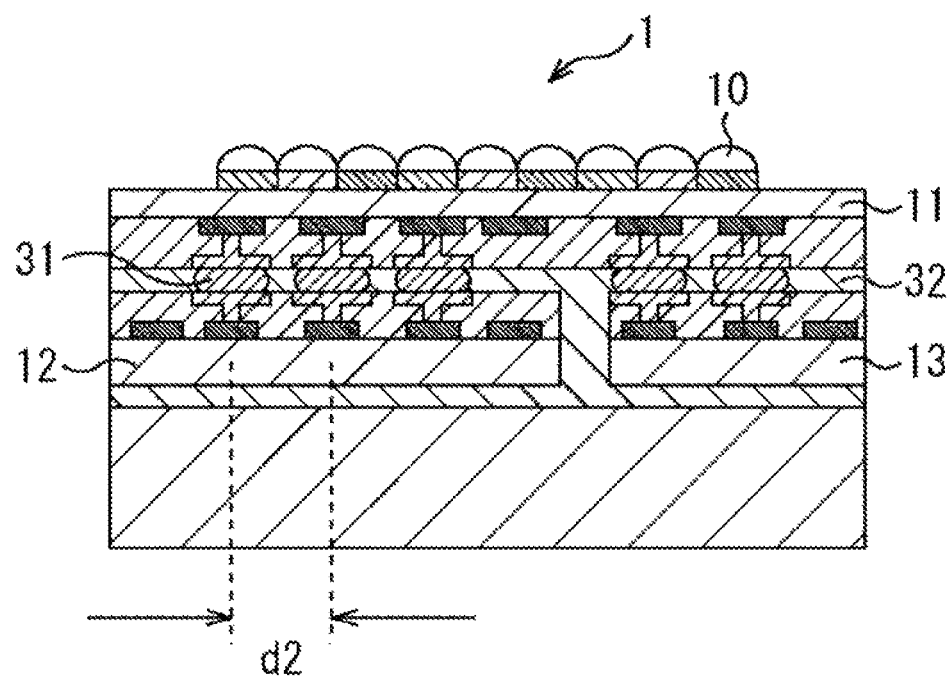
FIG. 3 is a view illustrating connection using a bump.

Further, as depicted in FIG. 3, it is conceivable to singulate solid-state imaging elements 11, memory circuits 12 and logic circuits 13 having chip sizes different from each other, selectively arrange only good products and form small bumps to connect them.

In the solid-state imaging device 1 of FIG. 3, an on-chip lens and on-chip color filter 10 and a solid-state imaging element 11 are stacked from above, and below them, a memory circuit 12 and a logic circuit 13 are stacked in a same layer, under which a support substrate 14 is provided and stacked. Further, the solid-state imaging element 11 and the memory circuit 12 and logic circuit 13 that are arranged in the same layer are electrically connected to each other through small-sized bumps 31.

In the solid-state imaging device 1 of FIG. 3, chips of sizes selected as good products are connected through the bumps 31 and the theoretical yield difference between the wafers and the influence of the yields the chips are reduced.

However, formation of the small-sized bumps 31 is difficult, and since there is a limitation to decrease of the connection pitches d2 as depicted in FIG. 3, the connection pitches d2 cannot be made smaller than the connection pitches d1 of FIG. 2 in the case where the WoW is used.

Therefore, the solid-state imaging device 1 of FIG. 3 in which the chips are stacked using bumps cannot have a great number of connection terminals in comparison with the solid-state imaging device 1 of FIG. 2 stacked by the WoW. Further, in the case of the connection that uses bumps like the solid-state imaging device 1 of FIG. 3, if the connection terminal number increases, then since the connection terminals are joined by a mounting process, reduction of the yield relating to joining occurs and increases the cost. Further, since the connection of the bumps in the mounting process is performed by individual works, each process requires long time and also the process cost increases.

From the foregoing, the imaging element of the present disclosure decreases the cost for manufacture in terms of the theoretical yield, implementation cost and process cost.

2. First Embodiment

Figure 4:
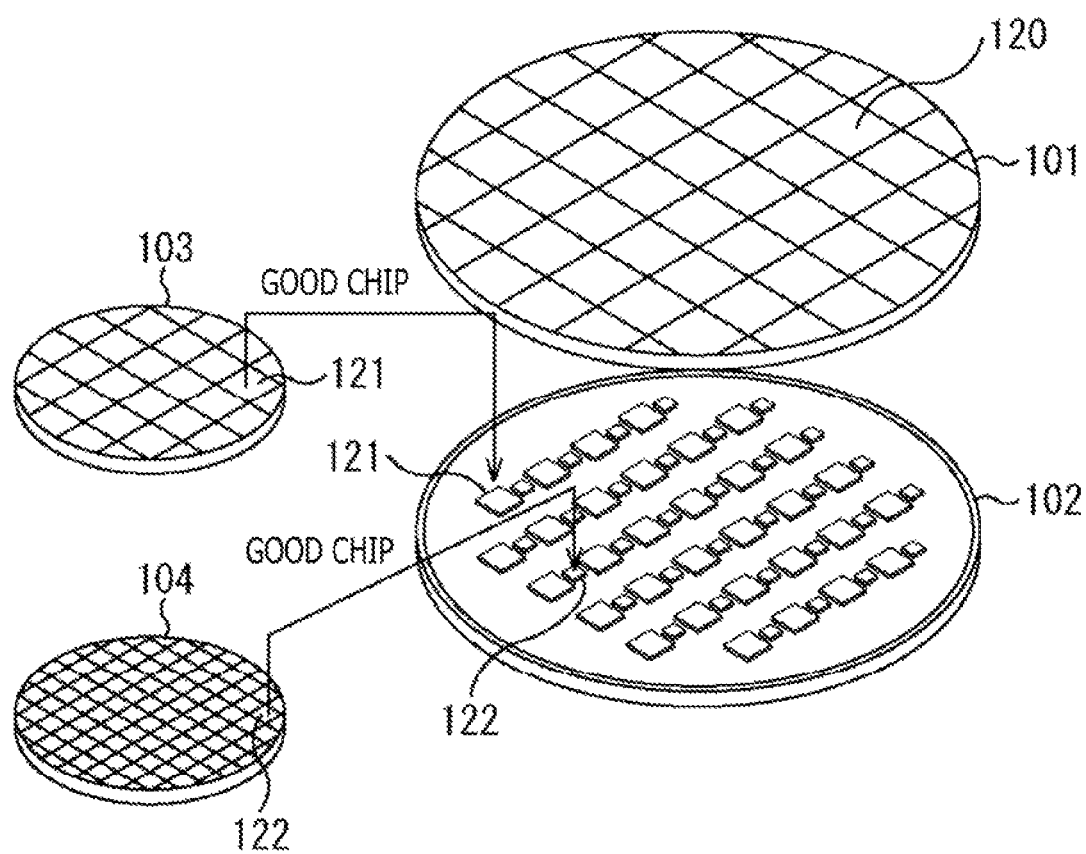
FIG. 4 is a view illustrating an overview of a manufacturing method for a solid-state imaging device of a first embodiment of the present disclosure.

FIG. 4 is a view illustrating a structure in which a plurality of wafers is stacked by the WoW technology that is applied when the solid-state imaging device of the present disclosure is to be manufactured.

In manufacturing the solid-state imaging device of the present disclosure, two wafers including a wafer 101 on which a plurality of solid-state imaging element (CMOS (Complementary Metal Oxide Semiconductor)) image sensors and CCDs (Charge Coupled Devices) 120 are formed and a wafer 102 on which memory circuits 121 and logic circuits 122 are rearranged are stacked in a state in which wires are positioned accurately relative to each other.

The wafer 101 has a plurality of solid-state imaging elements 120 formed thereon by a semiconductor process.

The wafer 102 has rearranged thereon a plurality of memory circuits 121 that has been subjected, after the memory circuits 121 have been formed on a wafer 103 by a semiconductor process and singulated, to electric inspection individually and has been confirmed as good chips through the electric inspection.

The wafer 102 has rearranged thereon a plurality of logic circuits 122 that has been subjected, after the logic circuits 122 have been formed on a wafer 104 by a semiconductor process and singulated, to electric inspection individually and has been confirmed as good chips through the electric inspection.

<Example of Configuration of Solid-State Imaging Device Including Wafers Stacked by WoW Technology of FIG. 4>

After a plurality of wafers is stacked by such a WoW technology as depicted in FIG. 4, the wafers are singulated to configure a solid-state imaging device 111 (FIG. 5) of the present disclosure.

Figure 5:
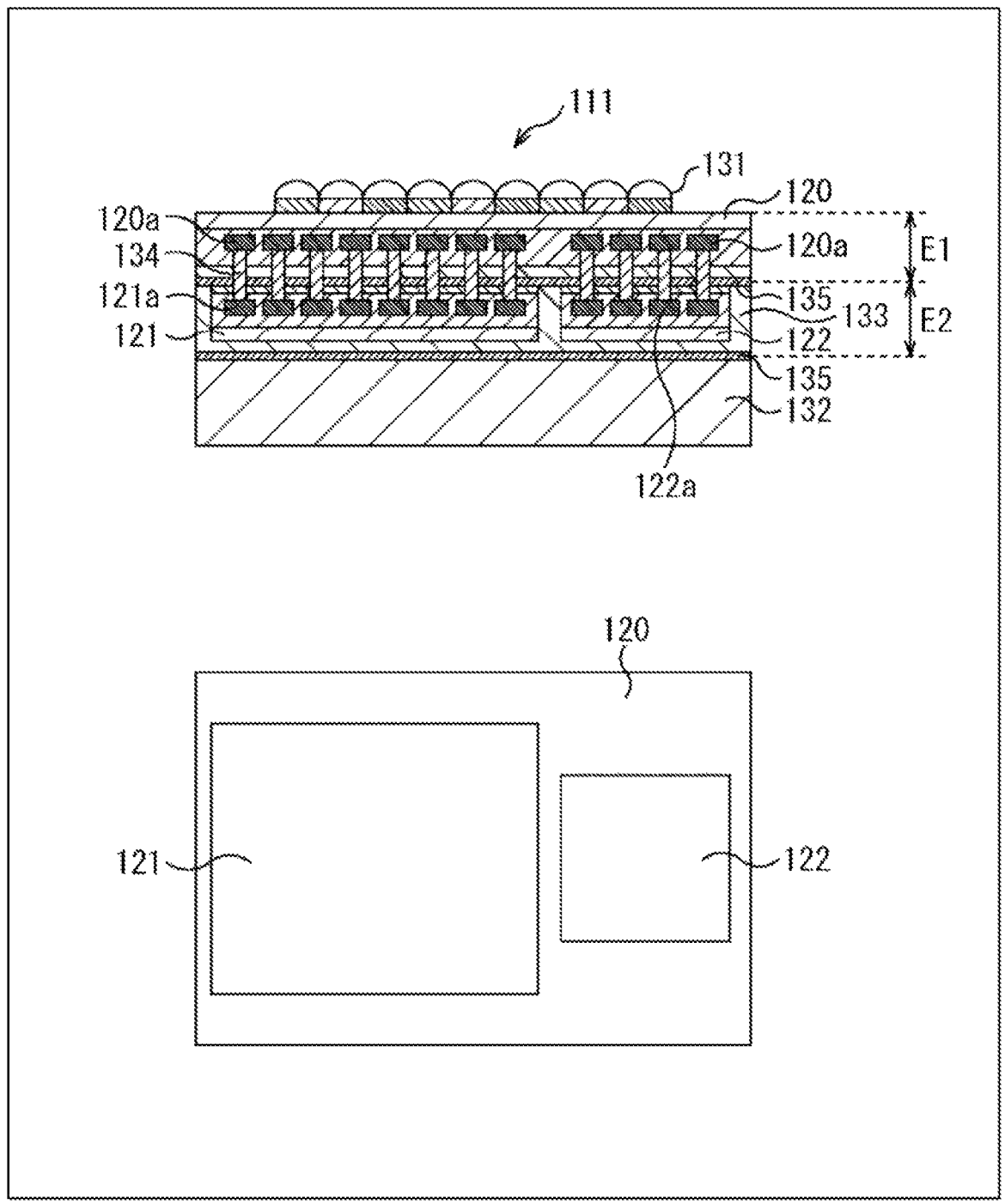
FIG. 5 is a view illustrating an example of a configuration of the solid-state imaging device of the first embodiment of the present disclosure.

The solid-state imaging device of the present disclosure has such a configuration, for example, as depicted in FIG. 5. It is to be noted that, in FIG. 5, an upper stage is a side elevational sectional view and a lower stage is a view illustrating an arrangement relation in a horizontal direction when the solid-state imaging element 120, memory circuit 121 and logic circuit 122 are viewed from above.

In the solid-state imaging device 11 at the upper stage of FIG. 5, an on-chip lens and on-chip color filter 131 and a solid-state imaging element 120 are stacked from above in the figure, and below them, a memory circuit 121 and a logic circuit 122 are arranged left and right and stacked in a same layer, below which a support substrate 132 is termed. In other words, as depicted by the upper stage of FIG. 5, the solid-state imaging device 111 of FIG. 5 has: a semiconductor device element E1 including the solid-state imaging element 120 including the wafer 101; and a semiconductor element layer E2 formed on the wafer 102 and including the memory circuit 121 and the logic circuit 122.

Of terminals 120a of the solid-state imaging element 120, the terminals 120a on the memory circuit 121 are electrically connected to wires 134 connected by CuCu connection to terminals 121a of the memory circuit 121.

Further, of the terminals 120a of the solid-state imaging element 120, the terminals 120a on the logic circuit 122 are electrically connected to wires 134 connected to terminals 122a of the logic circuit 122 by CuCu connection.

A space around the memory circuit 121 and the logic circuit 122 in the semiconductor element layer E2 in which memory circuit 121 and the logic circuit 122 are formed is in a state in which it is filled with an oxide film 133. Consequently, in the semiconductor element layer E2, the memory circuit 121 and the logic circuit 122 are in a state in which they are embedded in the oxide film 133. Further, on the boundary between the semiconductor element layer E1 in which the solid-state imaging element 120 is formed and the semiconductor element, layer E2 in which the memory circuit 121 and the logic circuit 122 are formed, an oxide film joining layer 135 is formed and joins them together by oxide film joining. Furthermore, the semiconductor element layer E2 of the memory circuit 121 and the logic circuit 122 and the support substrate 132 are joined together by an oxide film joining layer 135 formed between them by oxide film joining.

Further, as depicted at the lower stage of FIG. 5, the memory circuit 121 and the logic circuit 122 are arranged such that they are included in a range in which the solid-state imaging element 120 of the uppermost layer is contained as viewed from above. By such arrangement, in the layer of the memory circuit 121 and the logic circuit 122, the free space other than the memory circuit 121 and the logic circuit 122 is reduced, and therefore, theoretical yield can be improved.

On the wafer 102 of FIG. 4, when each solid-state imaging device 111 is singulated, the memory circuit 121 and the logic circuit 122 are rearranged in an elaborately adjusted state such that they are arranged in a range of the solid-state imaging element 120 as viewed from above.

<Manufacturing Method of Solid-State Imaging Device of FIG. 5>

Now, a manufacturing method of the solid-state imaging device 111 of FIG. 5 is described with reference to FIGS. 6 to 9. It is to be noted that side elevational sectional views 6A to 6L of FIGS. 6 to 9 depict side elevational sectional views of the solid-state imaging device 111.

Figure 6:
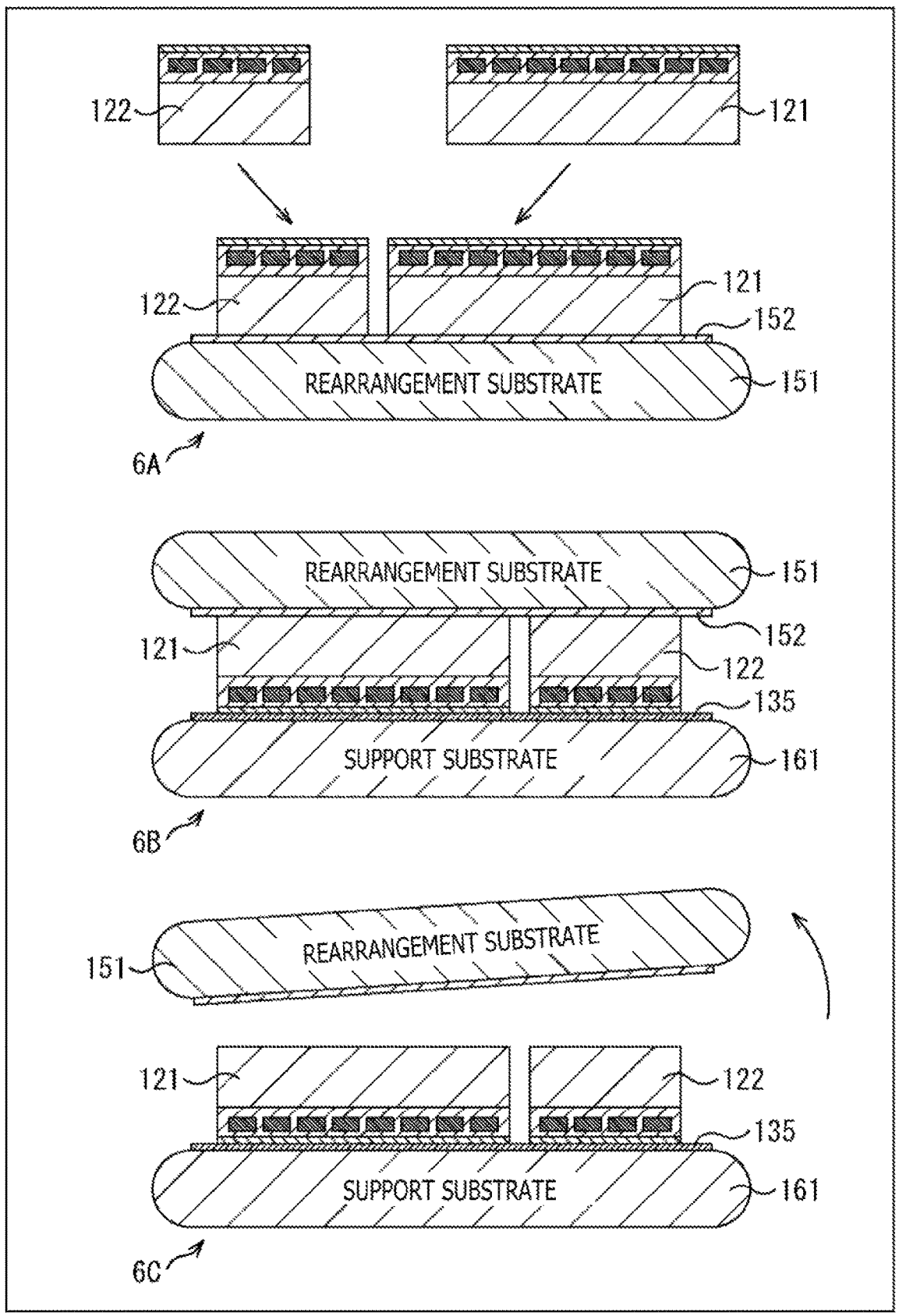
FIG. 6 is a view illustrating the manufacturing method for a solid-state imaging device of FIG. 5.

At a first step, as depicted by the side elevational sectional view 6A of FIG. 6, after electric inspection is performed, a memory circuit 121 and a logic circuit 122 that have been confirmed as good products are rearranged on a rearrangement substrate 151 such that they have such a layout as depicted at the lower stage of FIG. 5. On the rearrangement substrate 151, adhesive 152 is applied, and the memory circuit 121 and the logic circuit 122 are rearranged on and fixed to the rearrangement substrate 151 by the adhesive 152.

At a second step, as depicted by the side elevational sectional view 63 of FIG. 6, the memory circuit 121 and the logic circuit 122 depicted in the side elevational sectional view 6A are reversed such that the upper face thereof becomes a lower face, and an oxide film joining layer 135 is formed on a support substrate 161 flattened by an oxide film formed thereon and is joined by oxide film joining.

At a third step, the rearrangement substrate 151 is debonded, exfoliated, and removed together with the adhesive 152 as depicted in the side elevational sectional view 6C of FIG. 6.

Figure 7:
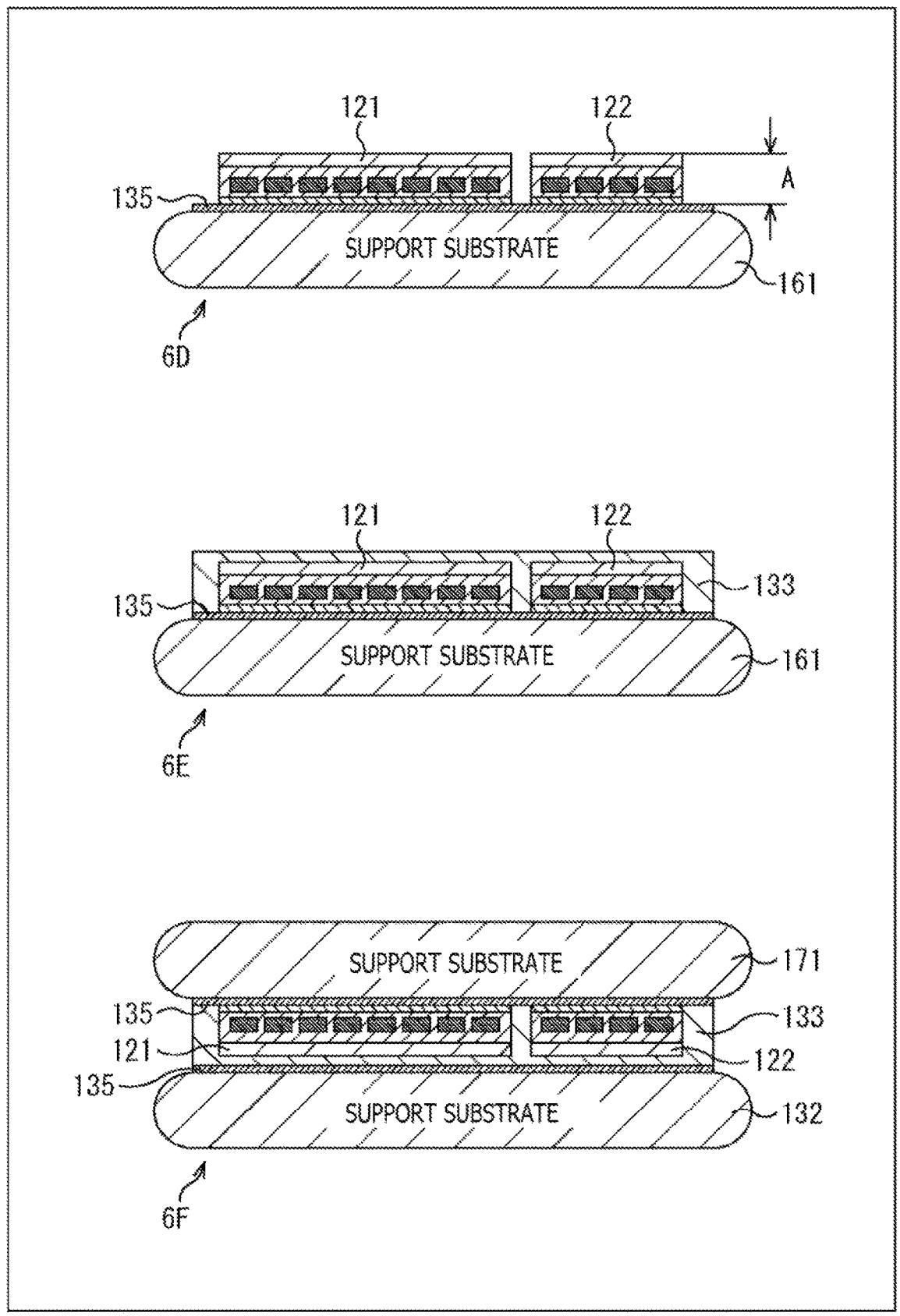
FIG. 7 is a view illustrating the manufacturing method for a solid-state imaging device of FIG.

At a fourth step, as depicted in the side elevational sectional view 6D of FIG. 7, the silicon layer at the upper face portion in the figure of the memory circuit 121 and the logic circuit 122 is thinned to such a height H that does not have an influence on a property of the devices.

At a fifth step, as depicted by the side elevational sectional view 6E of FIG. 7, an oxide film 133 that functions as an insulating film is formed to embed the chip including the rearranged memory circuit 121 and logic circuit 122. At this time, the face of the oxide film 133 is flattened at a height corresponding to the memory circuit 121 and the logic circuit 122.

At a sixth step, as depicted by the side elevational sectional view of FIG. 6F of FIG. 7, an oxide film joining layer 135 is formed on the flattened oxide film 133 and a support substrate 171 is joined to the oxide film 133 by oxide film joining.

Figure 8:
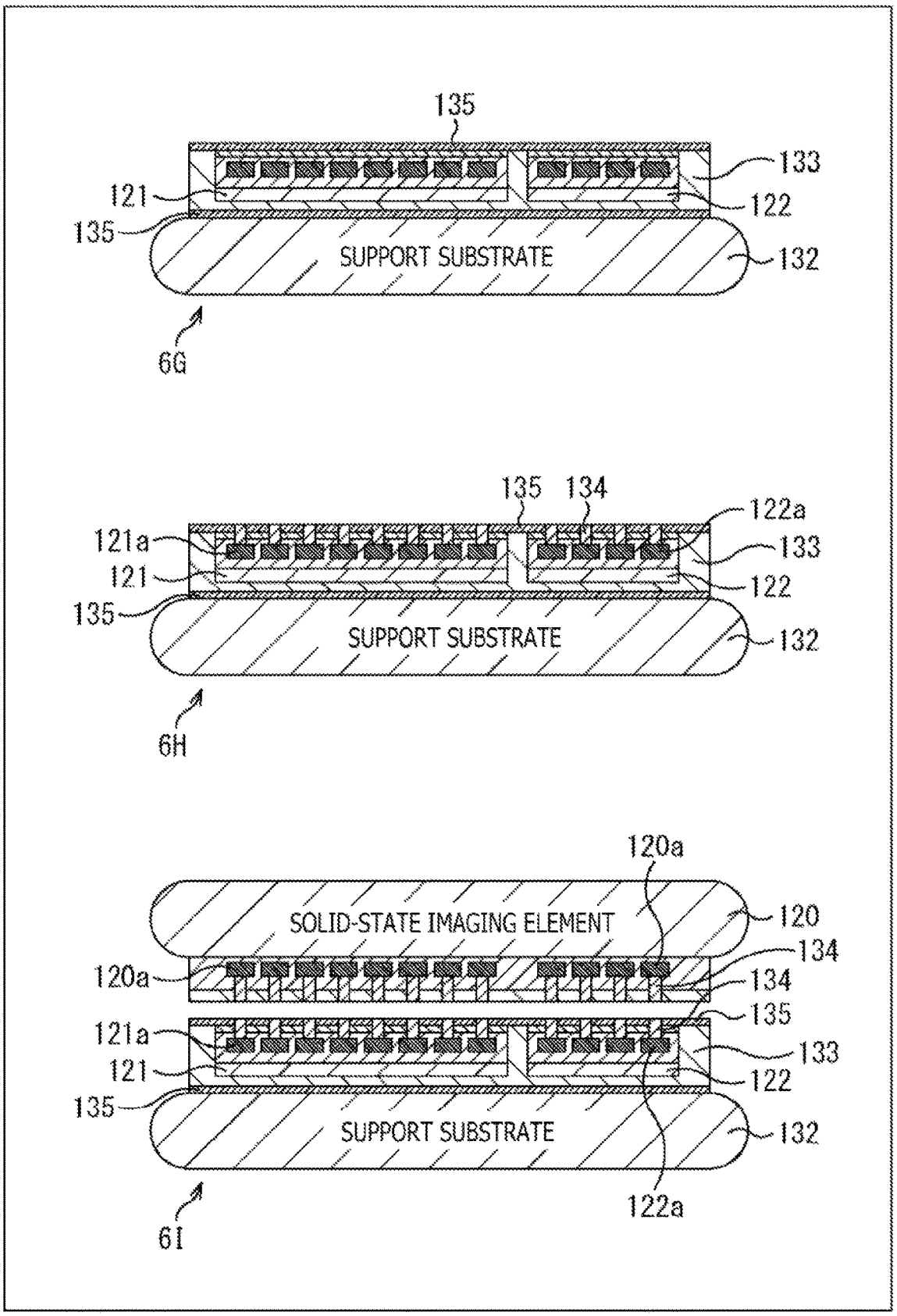
FIG. 8 is a view illustrating the manufacturing method for a solid-state imaging device of FIG. 5.

At a seventh step, as depicted by the side elevational sectional view 6G of FIG. 8, the support substrate 171 is removed by debonding or etching. By the processes from the first step to the seventh step, the wafer 102 is placed into a completed state in which the memory circuit 121 and the logic circuit 122 are rearranged in the layout depicted at the lower stage of FIG. 5 and filled with the insulating film including the oxide film 133 and has the oxide film joining layer 135 formed on the flattened uppermost face.

At an eighth step, as depicted by the side elevational sectional view 6H of FIG. 8, wires 134 are formed for terminals 121a of the memory circuit 121 and terminals 122a of the logic circuit 122 for electrically connecting to the solid-state imaging element 120.

At a ninth step, as depicted by the side elevational sectional view 6I of FIG. 8, positioning is performed such that the wires 134 from the terminals 121a of the memory circuit 121 and the terminals 122a of the logic circuit 122 of the wafer 102 and the wires 134 from the terminals 120a of the solid-state imaging element 120 of the wafer 101 are positioned in an appropriately opposing relation to each other.

Figure 9:
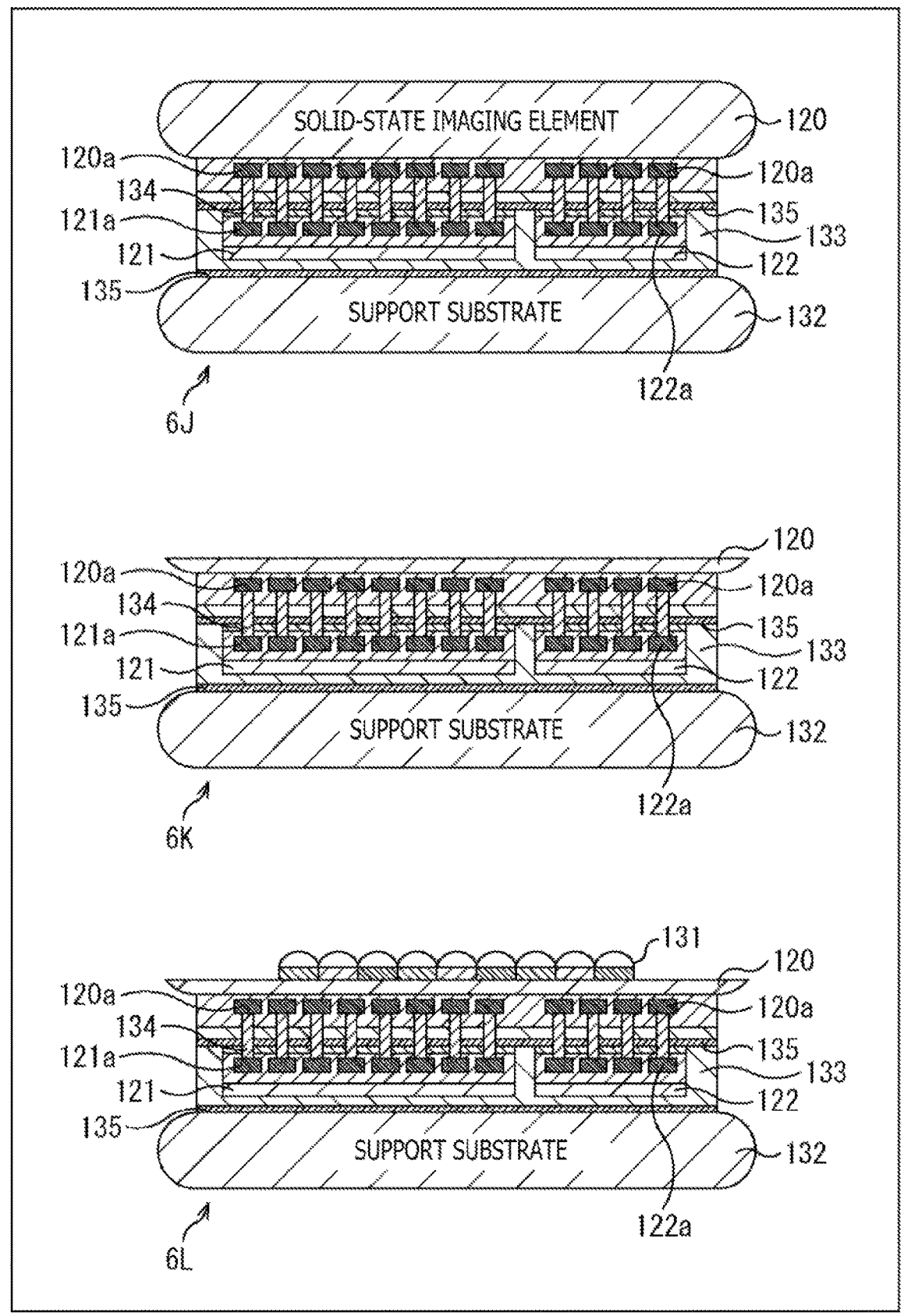
FIG. 9 is a view illustrating the manufacturing method for a solid-state imaging device of FIG. 5.

At a tenth step, as depicted by the side elevational sectional view 6J of FIG. 9, the wafers 101 and 102 are pasted to each other by the WoW such that the wires 134 from the terminals 121a of the memory circuit 121 and the terminals 122a of the logic circuit 122 of the wafer 102 and the wires 134 from the terminals 120a of the solid-state imaging element 120 of the wafer 101 are connected by CuCu joining. By this process, the memory circuits 121 and the logic circuits 122 of the wafer 102 are placed into an electrically connected state to the individual solid-state imaging elements 120 of the wafer 101.

At an eleventh step, as depicted by the side elevational sectional view 6K of FIG. 9, the silicon layer that is an upper layer in the figure of the solid-state imaging element 120 is thinned.

At a twelfth step, as depicted by the side elevational sectional view 6L of FIG. 9, an on-chip lens and on-chip color filter 131 is provided on the solid-state imaging element 120 and singulation is performed to form the solid-state imaging device 111.

By such steps as described above, the solid-state imaging device 111 including the first layer on which the solid-state imaging element 120 is formed and the second layer on which the memory circuit 121 and the logic circuit 122 are formed is manufactured.

By such configuration as described above, since circuit connection between the solid-state imaging element 120 and the memory circuit 121 and the logic circuit 122 can be established through terminals formed in a wire density of fine wires by a lithography technique of semiconductors similarly as in the WoW, the number of connection terminals can be increased and the signal processing speed by each wire can be reduced. Therefore, reduction of the power consumption can be anticipated.

Further, since the memory circuit 121 and the logic circuit 122 are connected only where they are good chips, defective wafers that are a defect of the WoW decrease, and therefore, occurrence of the yield loss can be reduced.

Furthermore, since the memory circuit 121 and the logic circuit to be connected can be formed, different from the WoW, in a size as small as possible irrespective of the chip size of the solid-state imaging element 120 and arranged each in the shape of an independent island as indicated by the lower stage of FIG. 5, the theoretical yield of the memory circuit 12 and the logic circuit 122 to be connected can be improved.

In this regard, since the solid-state imaging element 120 necessitates a requisite minimum pixel size for reacting with optical light, the manufacturing process for the solid-state imaging element 120 does not necessarily require a fine wiring process, and therefore, the process cost can be reduced. Further, if the manufacturing process for the logic circuit 122 uses a state-of-the-art fine wiring process, then the power consumption can be reduced. Furthermore, it is possible to improve the theoretical yield of the memory circuit 121 and the logic circuit 122. As a result, the cost required for the manufacture of the solid-state imaging device 111 can be reduced.

Further, since the solid-state imaging element 120 is structured such that chips can be rearranged on and joined to a wafer, heterogeneous processes by which analog circuits such as a power supply IC and a clock circuit and the logic circuits 122 can be stacked in one chip even by heterogeneous processes by which it is difficult to manufacture circuits configured by processes quite different from each other in the same wafer or even if there is a difference in wafer size.

Further, although the foregoing description is directed to an example in which the memory circuit 121 and the logic circuit 122 are used as circuits to be connected to the solid-state imaging element 120, any signal processing circuit other than the memory circuit 121 and the logic circuit 122 may be connected if it is a signal processing circuit necessitated for operation of the solid-state imaging element 120 such as a circuit that relates to control of the solid-state imaging element 120 or a circuit relating to processing of a captured pixel signal. The signal processing circuit necessitated for operation of the solid-state imaging element 120 may be, for example, a power supply circuit, an image signal compression circuit, a clock circuit, an optical communication conversion circuit or the like.

3. Second Embodiment

Although the foregoing description is given of the solid-state imaging device 111 having a two-layer structure in which a layer in which the solid-state imaging element 120 is formed and a layer in which the memory circuit 121 and the logic circuit 122 are rearranged are stacked, the solid-state imaging device 111 may otherwise have a three-layer configuration.

Figure 10:
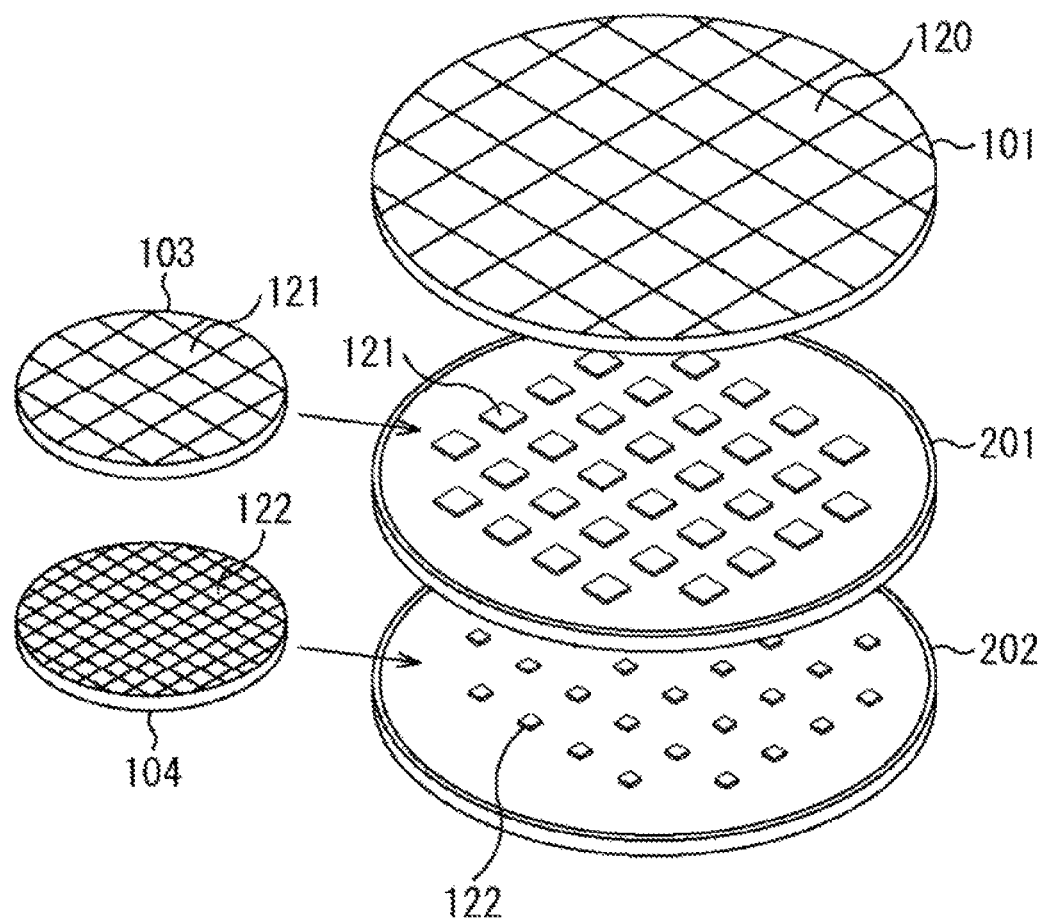
FIG. 10 is a view illustrating an overview of a manufacturing method for a solid-state imaging device of a second embodiment of the present disclosure.

FIG. 10 is a view illustrating a stack structure of wafers configured by the WoW technology that is applied when a solid-state imaging device of a three-layer structure of the present disclosure is manufactured.

In FIG. 10, a wafer 101 on which a solid-state imaging element 120 is formed, a wafer 201 on which a memory circuit 121 is rearranged and a wafer 202 on which a logic circuit 122 is rearranged are stacked in order from above.

The wafer 101 is similar to the wafer 101 of FIG. 4, and a plurality of solid-state imaging elements 120 is formed by a semiconductor process on the wafer 101.

On the wafer 201, a plurality of memory circuits 121 that has been subjected, after the memory circuits 121 have been formed on a wafer 103 by a semiconductor process and singulated, to electric inspection individually and confirmed to be good chips is selected and rearranged.

On the wafer 202, a plurality of logic circuits 122 that has been subjected, after the logic circuits 122 have been formed on a wafer 104 by a semiconductor process and singulated, to electric inspection individually and confirmed to be good chips is selected and rearranged.

<Example of Configuration of Solid-State Imaging Device Including Wafers Stacked by WoW Technology of FIG. 10>

Figure 11:
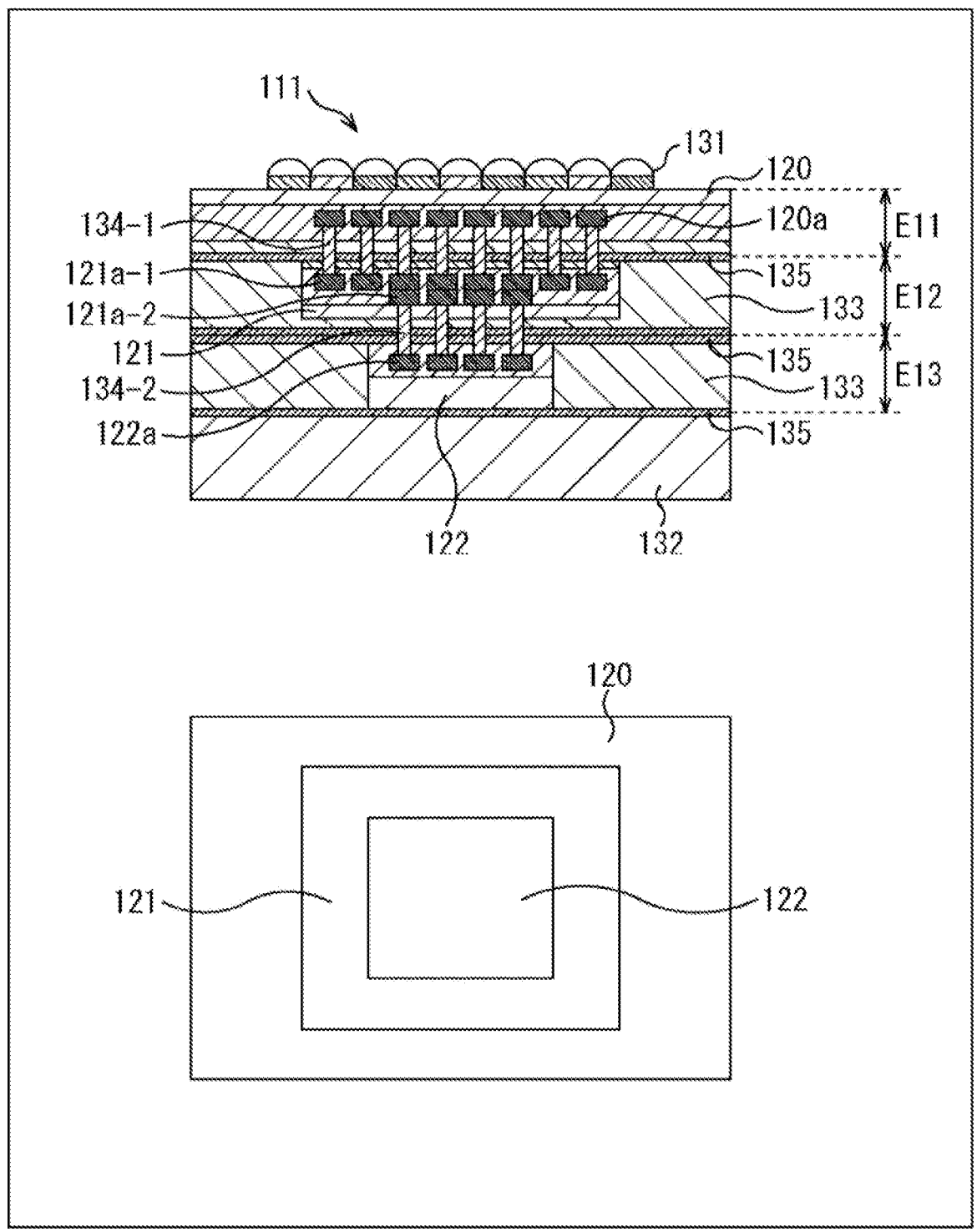
FIG. 11 is a view illustrating an example of configuration of a solid-state imaging=device of the second embodiment of the present disclosure.

The solid-state imaging device of the present disclosure is formed by singulation of such wafers stacked by the WoW technology as depicted in FIG. 10. The solid-state imaging device of the present disclosure is configured, for example, in such a manner as depicted in FIG. 11. It is to be noted that, in FIG. 11, the upper stage is a side elevational sectional view, and the lower stage is an arrangement view of the solid-state imaging element 120, memory circuit 121 and logic circuit 122 as viewed from above.

In particular, in the solid-state imaging device 111 at the upper stage of FIG. 11, an on-chip lens and on-chip color filter 131, a solid-state imaging element 120, a memory circuit 121, a logic circuit 122 and a support substrate 132 are formed in order from above in the figure. In particular, as depicted in the upper stage of FIG. 11, the solid-state imaging device 111 of FIG. 11 has: a semiconductor element layer E11 including a solid-state imaging element 120 including the wafer 101; a semiconductor element layer E12 including a memory circuit 121 formed on the wafer 201; and a semiconductor element layer E13 including a logic circuit 122 formed on the wafer 202.

Terminals 120a of the solid-state imaging element 120 are electrically connected to the terminals 121a-1 of the memory circuit 121 by wires 134-1 connected by CuCu connection to the terminals 121a-1.

Meanwhile, terminals 121a-2 of the memory circuit 121 are electrically connected to the terminals 122a of the logic circuit 122 by wires 134-2 connected by CuCu connection to the terminals 122a.

In a space around the solid-state imaging element 120, the memory circuit 121, the logic circuit 122, and the support substrate 132, an oxide film 133 is formed. Further, on the boundary between the semiconductor element layer E11 in which the solid-state imaging element 120 is formed and the semiconductor element layer E12 in which the memory circuit 121 is formed such that it is embedded in the oxide film 133, an oxide film joining layer 135 is formed and the layers are joined together by oxide film joining. Furthermore, on the boundary between the semiconductor element layer E12 in which the memory circuit 121 is formed in an embedded relation in the oxide film 133 and the semiconductor element layer E13 in which the logic circuit 122 is formed in an embedded relation in the oxide film 133, an oxide film joining layer 135 is formed, and the layers are joined together by oxide film joining. On the boundary between the semiconductor element layer E12 in which the logic circuit 122 is formed and the support substrate 132, an oxide film joining layer 135 is formed, and the layers are joined together by oxide film joining.

Further, as depicted at the lower stage of FIG. 11, the memory circuit 121 is formed at a substantially central position in the layer lower than the solid-state imaging element 120 and the logic circuit 122 is arranged at a substantially central position in the lower layer than the memory circuit 121 as viewed from above.

In particular, on the wafer 201 of FIG. 10, the memory circuit 121 is rearranged so as to coincide with a central position of the solid-state imaging element 120 when each solid-state imaging devices 111 is singulated, and on the wafer 202, the logic circuit 122 is rearranged so as to coincide with a central position of the solid-state imaging element 12C.

<Manufacturing Method of Solid State Imaging Device of FIG. 11>

Now, a manufacturing method of the solid-state imaging device 111 of FIG. 11 is described with reference to FIGS. 12 and 13. It is to be noted that side elevational sectional views 12A to 12F in FIGS. 12 and 13 depict side elevational sectional views of the solid-state imaging device 111.

Figure 12:
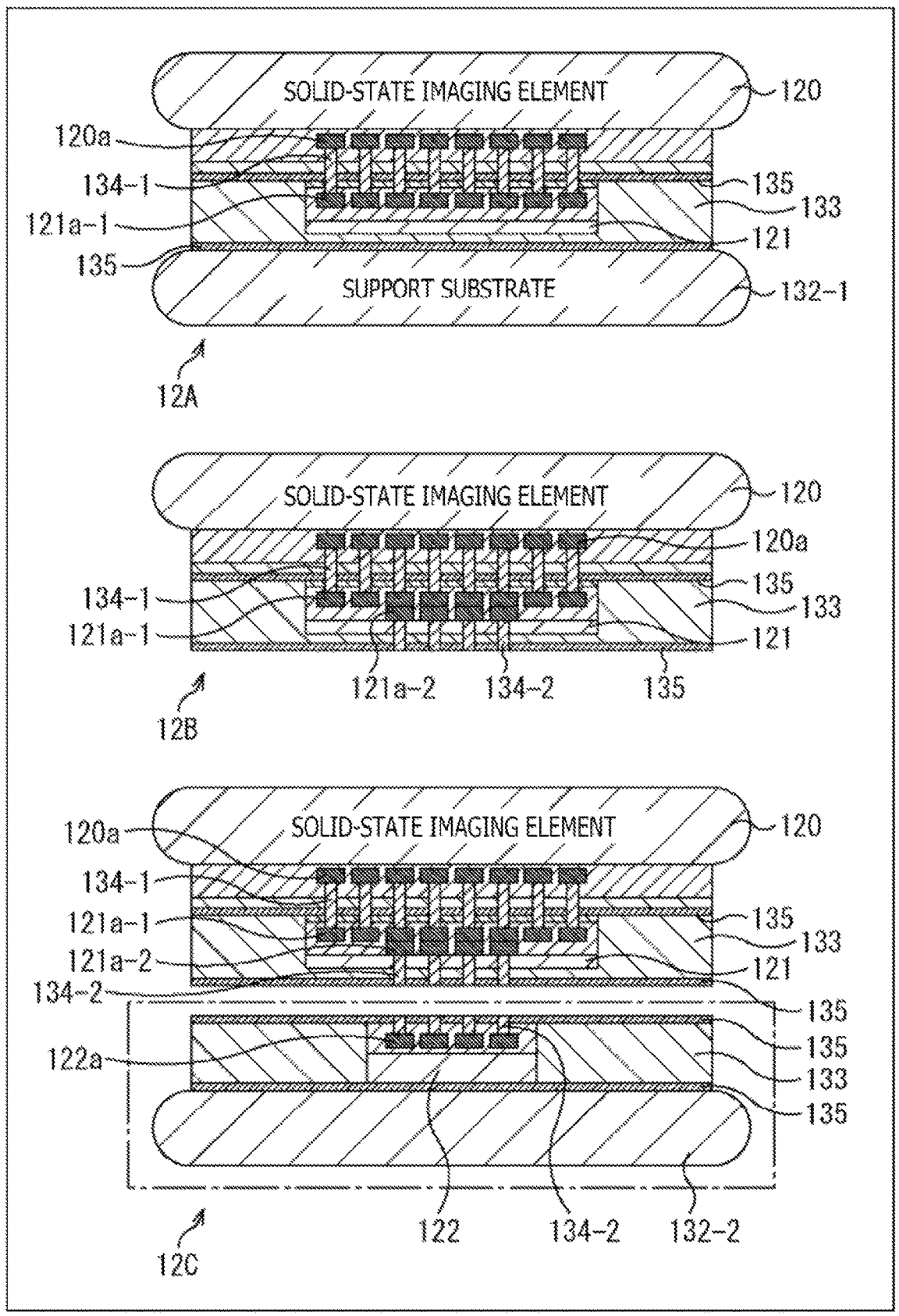
FIG. 12 is a view illustrating the manufacturing method for a solid-state imaging device of FIG. 10.
Figure 13:
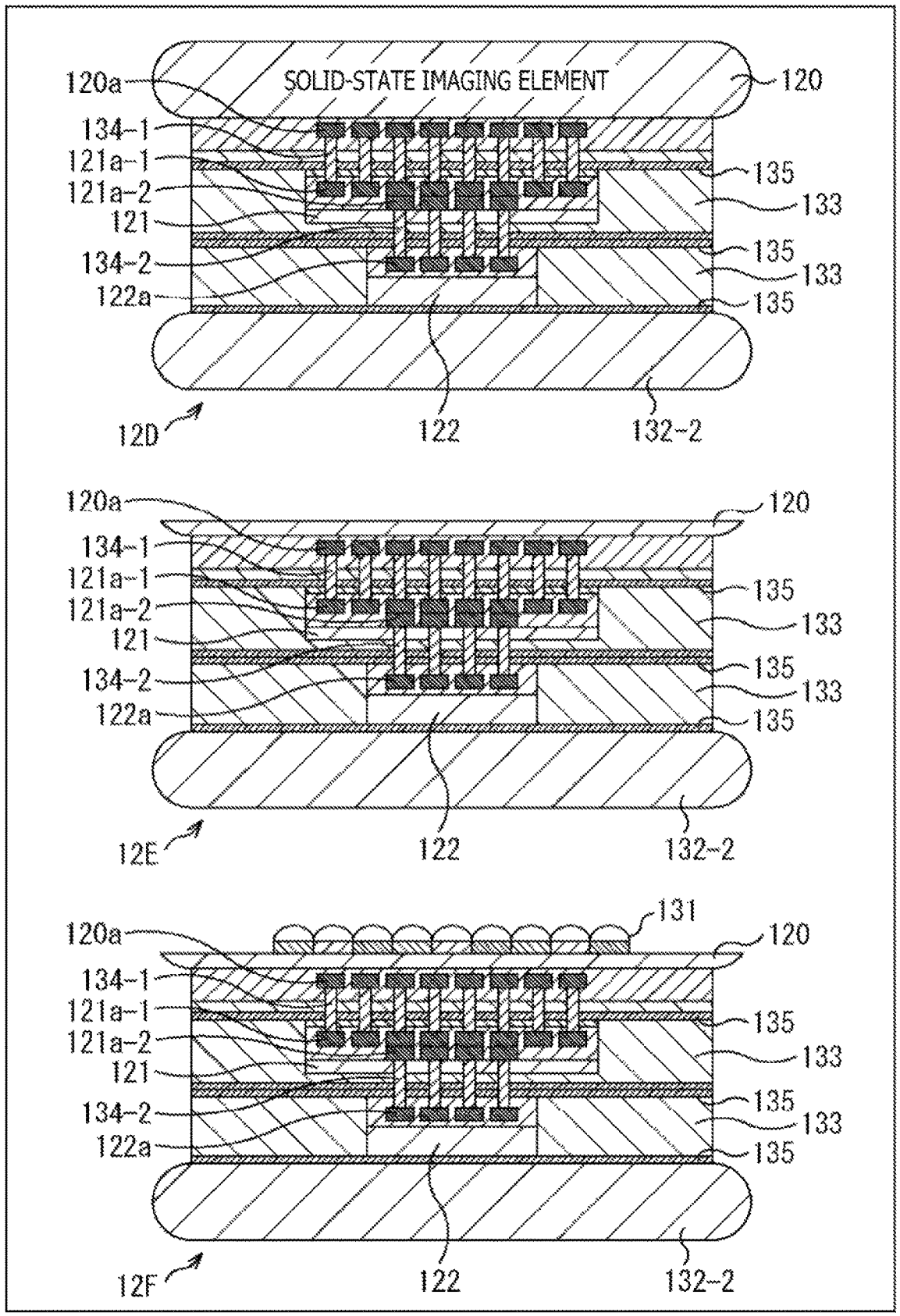
FIG. 13 is a view illustrating the manufacturing method for a solid-state imaging device of FIG.

At a first step, as depicted by the side elevational sectional view 12A of FIG. 12, a solid-state imaging element 120 and a memory circuit 121 are stacked on a support substrate 132-1 from above as depicted by the side elevational sectional view ISA of FIG. 12, and a space between the solid-state imaging element 120 and the memory circuit 121 around the memory circuit 121 is in a state filled with an oxide film 133 such that the memory circuit 121 is filled in the oxide film 133.

It is to be noted that, since steps until the side elevational sectional view 12A of FIG. 12 is formed are similar to those in the case where only the memory circuit 121 is formed by the steps of the side elevational sectional view 6A of FIG. 6 to the side elevational sectional view 6J of FIG. 9, and therefore, description of them is omitted.

At a second step, as depicted in the side elevational sectional view 12B of FIG. 12, the support substrate 132-1 is removed, and wires 134-2 are formed at the terminals 121a-2 or the memory circuit 121.

At a third step, as depicted by a range surrounded by an alternate long and short dashes line in the side elevational sectional view 12C of FIG. 12, the logic circuit 122 on which the wires 134-2 are formed at the terminals 122a and which is provided on a support substrate 132-2 is positioned such that the memory circuits 121 and the wires 134-2 are opposed to each other.

It is to be noted that a portion surrounded by an alternate long and short dashes line in which the memory circuit 121 is configured on the support substrate 132-2 is similar to that in the case where only the logic circuit 122 is formed by the steps of the side elevational sectional view 6A of FIG. 6 to the side elevational sectional view 6H of FIG. 8, and therefore, description of them is omitted.

At a fourth step, as depicted in the side elevational sectional view 12D of FIG. 13, a lower face portion of the memory circuit 121 and an upper face portion of the logic circuit 122 are coupled to each other by oxide film coupling, and the terminals 121a-2 of the memory circuit 121 and the terminals 122a of the logic circuit 122 are connected to each other via the wires 134-2. Consequently, the memory circuit 121, the logic circuit 122, and the solid-state imaging element 120 are electrically connected to each other.

At a fifth step, as depicted by the side elevational sectional view 12E of FIG. 13, the silicon layer of the solid-state imaging element 120 is thinned.

At a sixth step, as depicted by the side elevational sectional view 12F of FIG. 13, the on-chip lens and on-chip color filter 131 is provided on the solid-state imaging element 120 and singulation is performed, thereby to complete the solid-state imaging device 111.

In this manner, the solid-state imaging device 111 of a totaling three layer structure including the first layer in which the solid-state imaging element 120 is formed, the second layer in which the memory circuit 121 is formed and the third layer in which the logic circuit 122 are formed is manufactured.

Also, in such a configuration as described above, since circuit connection between the solid-state imaging element 120, the memory circuit 121, and the logic circuit 122 can be established through terminals formed in a wire density of fine wires by a lithography technique of semi conductors similarly as in the WoW, the number of connection terminals can be increased and reduction of the power consumption can be anticipated.

Further, since the memory circuit 121 and the logic circuit 122 are connected only where they are good chips, the yield of wafers, which is a defect of the WoW, can be decreased and occurrence of the yield loss can be reduced.

Furthermore, as depicted in the side elevational sectional views 12A to 12C of FIG. 12 described above, a configuration of three or more layers can be implemented by forming wires (rear face wires) on a lower face in the figures.

4. Third Embodiment

<Example of Configuration of Solid-State Imaging Device in Case where Solid-State Imaging Element is Smaller than Memory Circuit or Logic Circuit>

Although the foregoing description is given of an example of a case in which the solid-state imaging element 120 is greater than both the memory circuit 121 and the logic circuit 122, it may be configured otherwise such that it is smaller than at least any one of the memory circuit 121 or the logic circuit 122.

Figure 14:
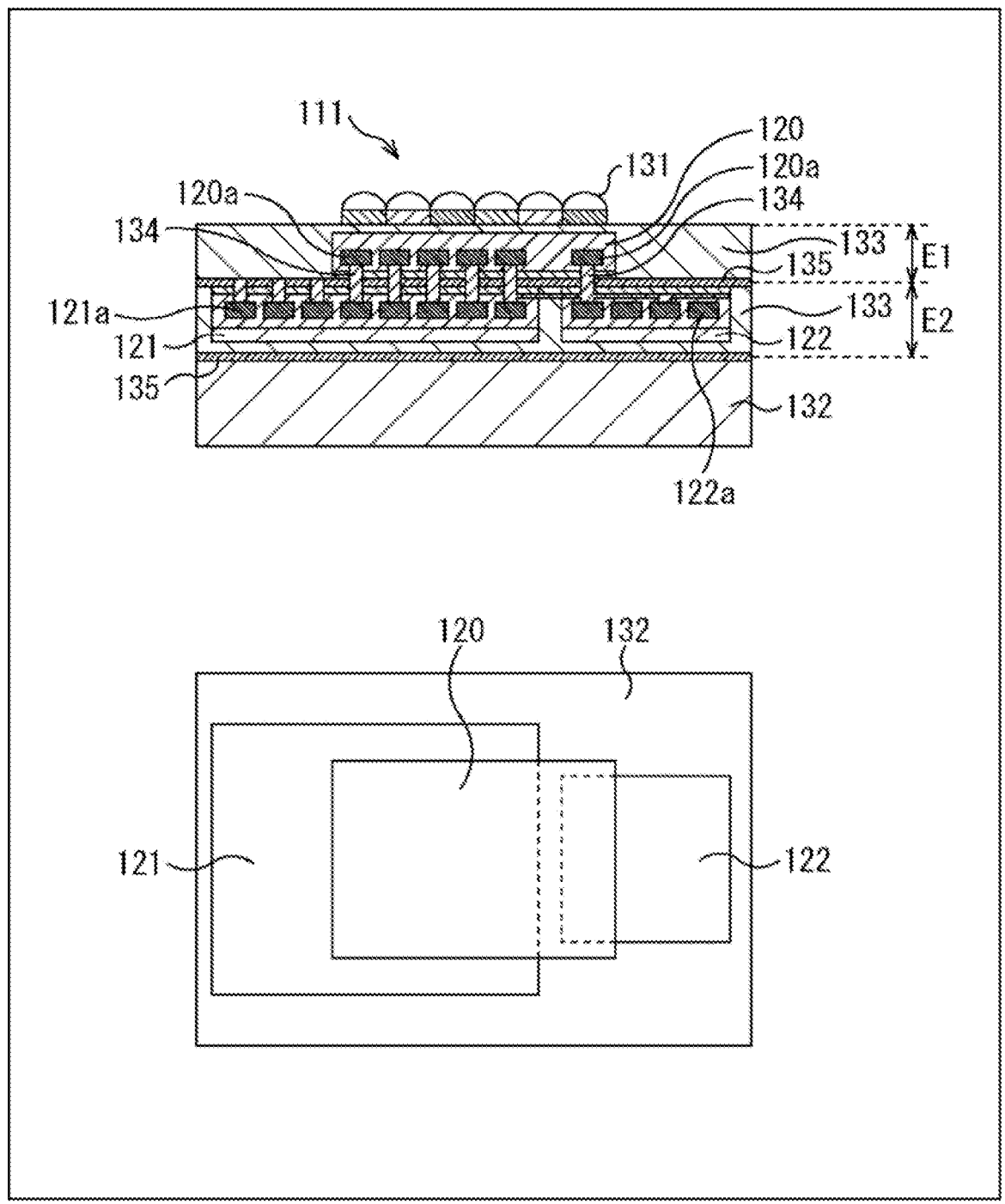
FIG. 14 is a view illustrating an example of a configuration of a solid-state imaging device of a third embodiment of the present disclosure.

FIG. 14 depicts an example of a configuration of the solid-state imaging device 111 having a two-layer configuration in the case where the solid-state imaging element 120 is smaller than the memory circuit. 121 but is greater than the logic circuit 122.

In particular, as depicted at the upper portion of FIG. 14, a solid-state imaging element 120 is formed on a configuration that a layer in which a memory circuit 121 and a logic circuit 122 are formed is provided on a support substrate 132 and wires 134 are formed at terminals 121a and 122a. Further, the solid-state imaging element 120 is provided at a position at which it extends between the memory circuit 121 and the logic circuit 122 as viewed from above as indicated at the lower portion of FIG. 14. In particular, as depicted at the upper stage of FIG. 14, the solid-state imaging device 111 of FIG. 14 has: a semiconductor element layer E1 including the solid-state imaging element 12G including the wafer 101; and a semiconductor element layer E2 including the memory circuit 121 and the logic circuit 122 formed on the water 102.

It is to be noted that an insulating film including an oxide film 133 is formed around the solid-state imaging element 120.

<Manufacturing Method of Solid-State Imaging Device of FIG. 14>

Now, a manufacturing method of the solid-state imaging device 111 of FIG. 14 is described with reference to FIGS. 15 and 16. It is to be noted that side elevational sectional views 15A to 15F of FIGS. 15 and 16 depict side elevational sectional views of the solid-state imaging device 111.

Figure 15:
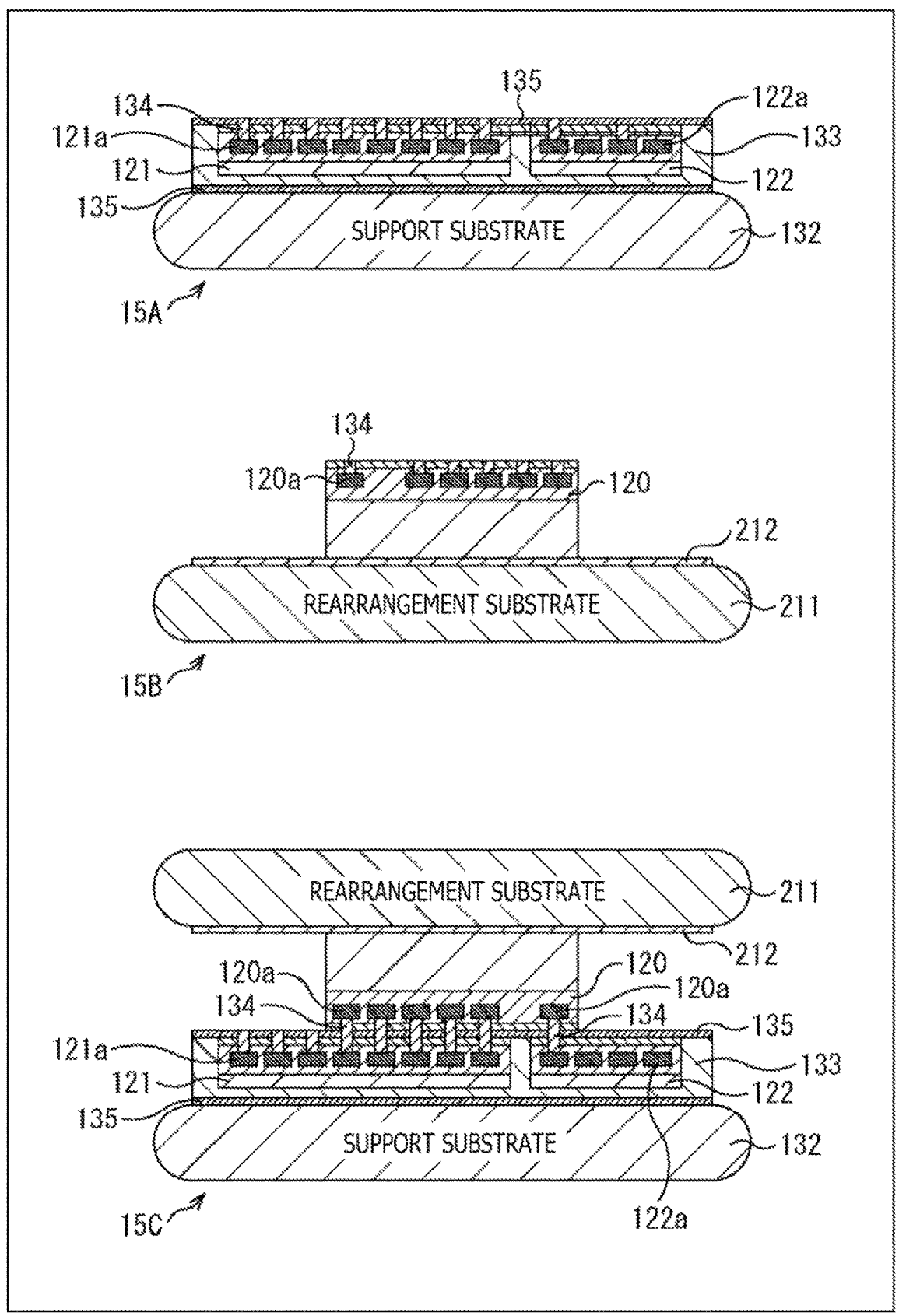
FIG. 15 is a view illustrating the manufacturing method for the solid-state imaging device of FIG. 14.
Figure 16:
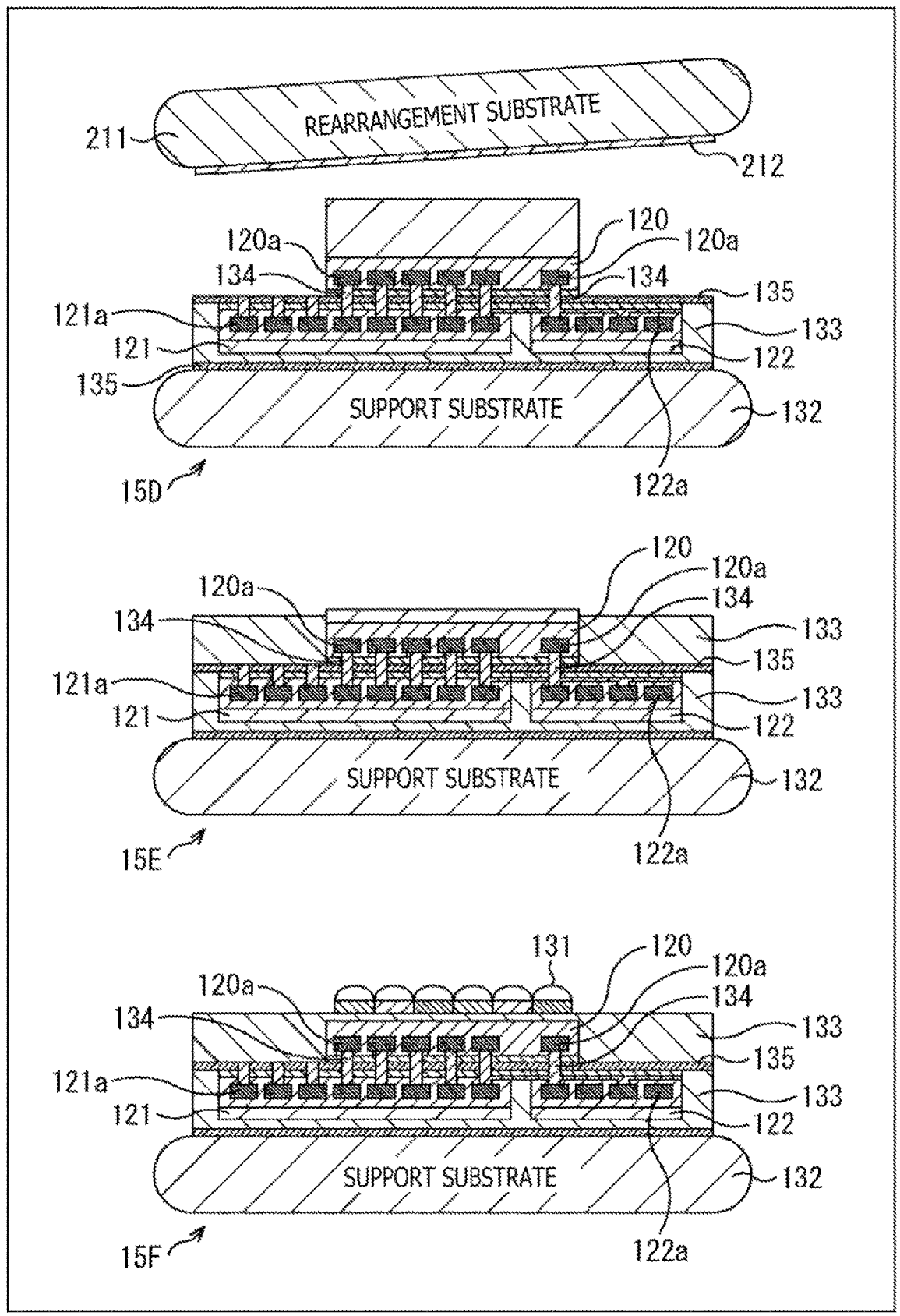
FIG. 16 is view illustrating the manufacturing method for the solid-state imaging device of FIG. 14.

At a first step, as depicted by the side elevational sectional view 15A of FIG. 15, a memory circuit 121 and a logic circuit 122 are formed on a support substrate 132 and are embedded into an insulating film including an oxide film 133, and an oxide film joining layer 135 is formed on the uppermost layer. Further, wires 134 are formed at terminals 121a and 122a.

It is to be noted that the steps up to the formation of the side elevational sectional view 14A of FIG. 15 are similar to those in the case where a memory circuit 121 and a logic circuit 122 are formed on a support substrate 132 by the steps of the side elevational sectional view 6A of FIG. 6 to the side elevational sectional view 6H of FIG. 9, and therefore, description of them is omitted.

At a second step, as depicted by the side elevational sectional view 15B of FIG. 15, a singulated solid-state imaging element 120 is rearranged on a rearrangement substrate 211, to which adhesive 212 is applied, such that the imaging face side thereof is opposed to the rearrangement, substrate 211. Further, as depicted by the lower stage of FIG. 14, the solid-state imaging element 120 is rearranged on the rearrangement substrate 211 at a position at which it extends between the memory circuit 121 and the logic circuit 122 in a plane direction.

At a third step, as depicted by the side elevational sectional view 15C of FIG. 15, the solid-state imaging element 120 having the state of the side elevational sectional view 15B is reversed, and wires 134 of the memory circuit 121 and the logic circuit 122 of the side elevational sectional view 15A are connected by CuCu joining and besides opposing layers are joined together by oxide film joining.

At a fourth step, as depicted by the side elevational sectional view 15D of FIG. 16, the rearrangement substrate 211 is removed.

At a fifth step, as depicted by the side elevational sectional view 15E of FIG. 16, the silicon layer of the solid-state imaging element 120 is thinned.

At a sixth step, as depicted by the side elevational sectional view 15F of FIG. 16, an on-chip lens and on-chip color filter 131 is provided on the solid-state imaging element 120, and the solid-state imaging device 111 is completed therewith. It is to be noted that, in the present example, in the solid-state imaging element 120, memory circuit 121 and logic circuit 122 are all singulated at a stage before they are assembled.

In this manner, also in the case where the size of the solid-state imaging element 120 is smaller than that of the memory circuit 121 but greater than that of the logic circuit 122, the solid-state imaging device 111 of the totaling two-layer structure including the first layer in which the solid-state imaging element 120 is formed and the second layer in which the memory circuit 121 and the logic circuit 122 are formed is manufactured.

Also, in such a configuration as described above, since circuit connection between the solid-state imaging element 120, the memory circuit 121, and the logic circuit 122 can be established through terminals formed in a wire density of fine wires by a lithography technique of semiconductors similarly as in the WoW, the number of connection terminals can be increased and reduction of the power consumption can be anticipated.

Further, since the memory circuit 121 and the logic circuit 122 are connected only where they are good chips, the yield of wafers, which is a defect of the WoW, can be decreased and occurrence of the yield loss can be reduced.

It is to be noted that, also in the case where the solid-state imaging element 120 is smaller than the logic circuit 122 but is greater than the memory circuit 121, the solid-state imaging device 111 can be manufactured by similar steps. Similarly, also in the case where the solid-state imaging element 120 is smaller than both the logic circuit 122 and the memory circuit 121, the solid-state imaging device 111 can be manufactured by similar steps.

5. Fourth Embodiment

<Example of Configuration of Solid-State Imaging Device of Three-Layer Structure in Case where Solid-State Imaging Element is Smaller than Memory Circuit and Logic Circuit>

Although the foregoing description is directed to an example of a configuration of the solid-state imaging device 111 of a two-layer structure in the case where the solid-state imaging element 120 is smaller than the memory circuit 121 but is greater than the logic circuit 122, the solid-state imaging device 111 may have a three-layer structure even in the case where the solid-state imaging element 120 is smaller than the memory circuit 121 but is greater than the logic circuit 122.

Figure 17:
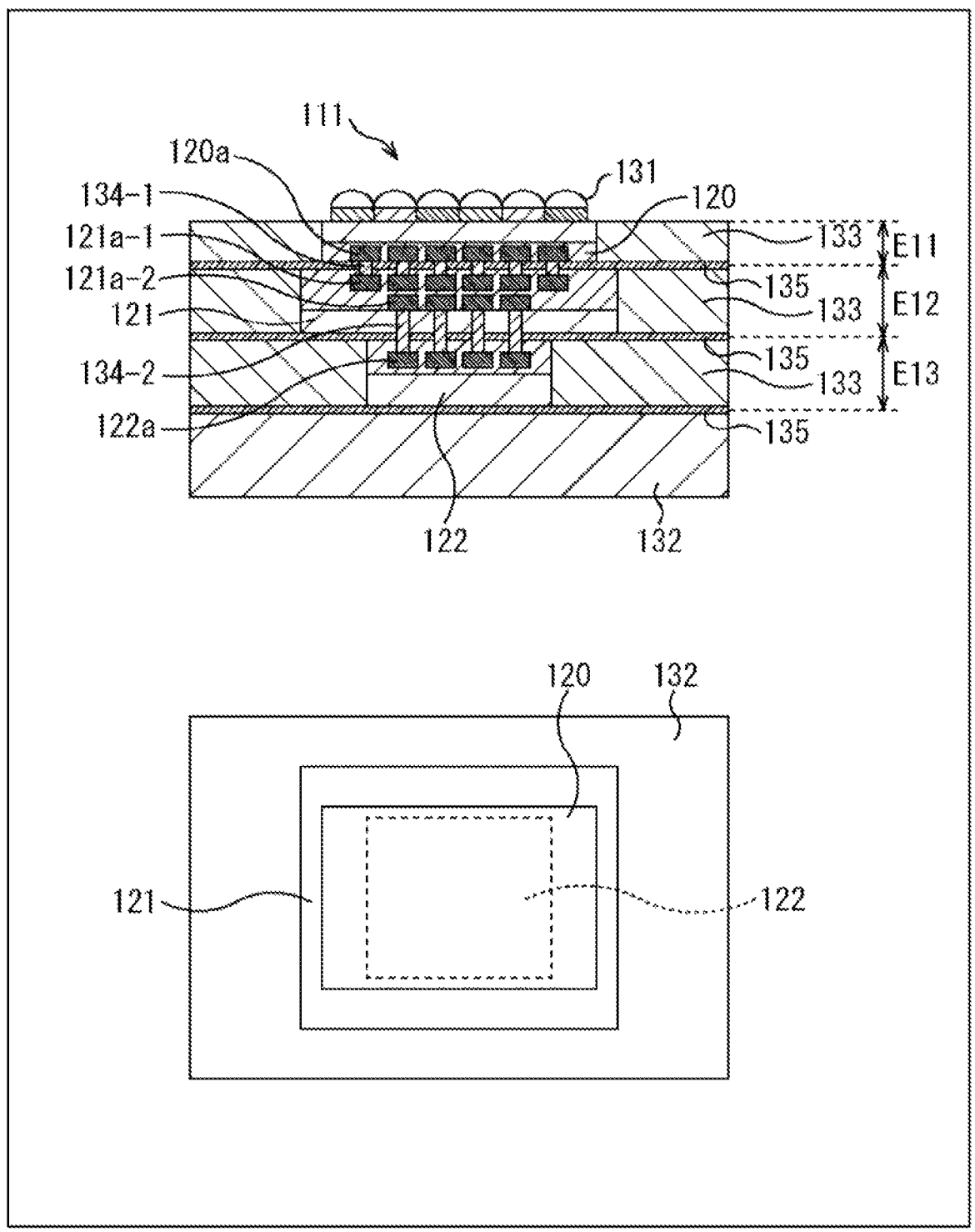
FIG. 17 is a view illustrating an example of a configuration of a solid-state imaging device of a fourth embodiment of the present disclosure.

FIG. 17 depicts an example of a configuration of a solid-state imaging device 111 having a three-layer structure in the case where the solid-state imaging element 120 is smaller than the memory circuit 121 but is greater than the logic circuit 122.

In particular, as depicted by the upper portion of FIG. 17, a logic circuit 122 is formed on a support substrate 132 such that it is oxide-film-coupled by an oxide film joining layer 135, and a memory circuit 121 is formed on the logic circuit 122 such that it is oxide-film-coupled by the oxide film joining layer 135. Further, a solid-state imaging element 120 is formed on the memory circuit 121 such that it is oxide-film-coupled by the oxide film joining layer 135, and an on-chip lens and on-chip color filter 131 is formed on the solid-state imaging element 120. In particular, as indicated by the upper stage of FIG. 17, the solid-state imaging device 111 of FIG. 17 has: a semiconductor element layer E11 including the solid-state imaging element 120 including the wafer 101; a semiconductor element layer E12 including the memory circuit 121 formed on the wafer 201; and a semiconductor element layer E13 including the logic circuit 122 formed on the wafer 202.

Further, terminals 120a of the solid-state imaging element 120 and terminals 121a-1 of the memory circuit 121 are electrically connected to each other by wires 134-1 through CuCu joining, and terminals 121a-2 of the memory circuit 121 and terminals 122a of the logic circuit 122 are electrically connected by wires 134-2 through CuCu joining.

In this case, as indicated by the lower portion of FIG. 17, the solid-state imaging element 120, memory circuit 121 and logic circuit 122 are formed such that the center positions thereof are aligned with one another.

It is to be noted that an insulating film including an oxide film 133 is formed around the solid-state imaging element 120.

As a manufacturing method of the solid-state imaging device 111 in FIG. 17, it is sufficient if only the logic circuit 122 is formed by the steps of the side elevational sectional view 6A of FIG. 6 to the side elevational sectional view 6H of FIG. 8 and then the memory circuit 121 is placed on the rearrangement substrate 211 as indicated by the side elevational sectional view 15B of FIG. 15 and is connected to the logic circuit 122 as indicated by the side elevational sectional view 15C of FIG. 15, whereafter the solid-state imaging element 120 is formed by a similar method. Therefore, description with reference to the drawings is omitted.

Also, in such a configuration as described above, since circuit connection between the solid-state imaging element 120, the memory circuit 121, and the logic circuit 122 can be established through terminals formed in a wire density of fine wires by a lithography technique of semiconductors similarly as in the WoW, the number of connection terminals can be increased and reduction of the power consumption can be anticipated.

Further, since the memory circuit 121 and the logic circuit 122 are connected only where they are good chips, the yield of wafers, which is a defect of the WoW, can be decreased and occurrence of the yield loss can be reduced.

It is to be noted that, also in the case where the solid-state imaging element 120 is smaller than the logic circuit 122 but is greater than the memory circuit 121, the solid-state imaging device 111 can be manufactured by similar steps. Similarly, also in the case where the solid-state imaging element 120 is smaller than both the logic circuit 122 and the memory circuit 121, the solid-state imaging device 111 can be manufactured by similar steps.

6. Fifth Embodiment

<Example of Configuration of Solid-Slate Imaging Device in Case where Memory Circuit and Logic Circuit are Formed Directly on Wafer of Solid-State Imaging Element>

The foregoing description is directed to an example in which, after the memory circuit 121 and the logic circuit 122 are singulated and it is confirmed that they are good chips, they are formed on the wafer 102 (support substrate 132). However, a memory circuit 121 and a logic circuit 122 that have been singulated and have been confirmed as good chips may be formed directly on the solid-state imaging element 120 on the wafer 101.

Figure 18:
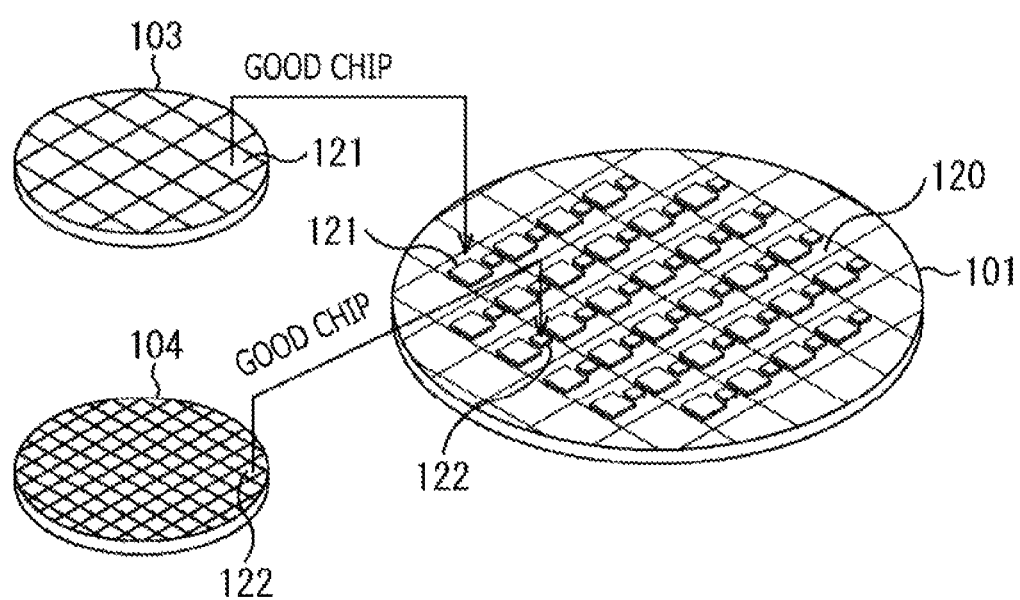
FIG. 18 is a view illustrating an example of a configuration of a solid-state imaging device of a fifth embodiment of the present disclosure.

FIG. 18 is a view illustrating a manufacturing method of a solid-state imaging device in which a memory circuit 121 and a logic circuit 122 that have been singulated and have been confirmed as good chips are formed directly on a solid-state imaging element 120 on a wafer 101.

In particular, referring to FIG. 18, a plurality of solid-state imaging elements 120 is formed on a wafer 101 by a semiconductor process. Further, a plurality of memory circuits 121 that has been subjected, after the memory circuits 121 are formed on a wafer 103 by a semiconductor process and singulated, to electric inspection and confirmed as good chips through the electric inspection and a plurality of logic circuits 122 that has been subjected, after the logic circuits 122 are formed on a wafer 104 by a semiconductor process and singulated, to electric inspection and confirmed as good chips through the electric inspection are selected and rearranged on the solid-state imaging element 120 formed on the wafer 101. In other words, since the memory circuits 121 and the logic circuits 122 having been confirmed as good chips are rearranged on the solid-state imaging element 120, the memory circuits 121 and the logic circuits 122 here are configured smaller than the solid-state imaging elements 120.

It is to be noted that an example of a configuration of a solid-state imaging device 111 having a two-layer configuration in the case where a memory circuit 121 and a logic circuit 122 having been singulated and confirmed as good chips are formed directly on the solid-state imaging element 120 on the wafer 101 is similar to that of FIG. 5. Therefore, description of the example is omitted.

<Manufacturing Method of Solid-State Imaging Device of FIG. 14>

Now, a manufacturing method of the solid-state imaging device 111 of FIG. 10 is described with reference to FIGS. 19 and 20. Side elevational sectional views 19A to 19F of FIGS. 19 and 20 depict side elevational sectional views of the solid-state imaging device 111.

Figure 19:
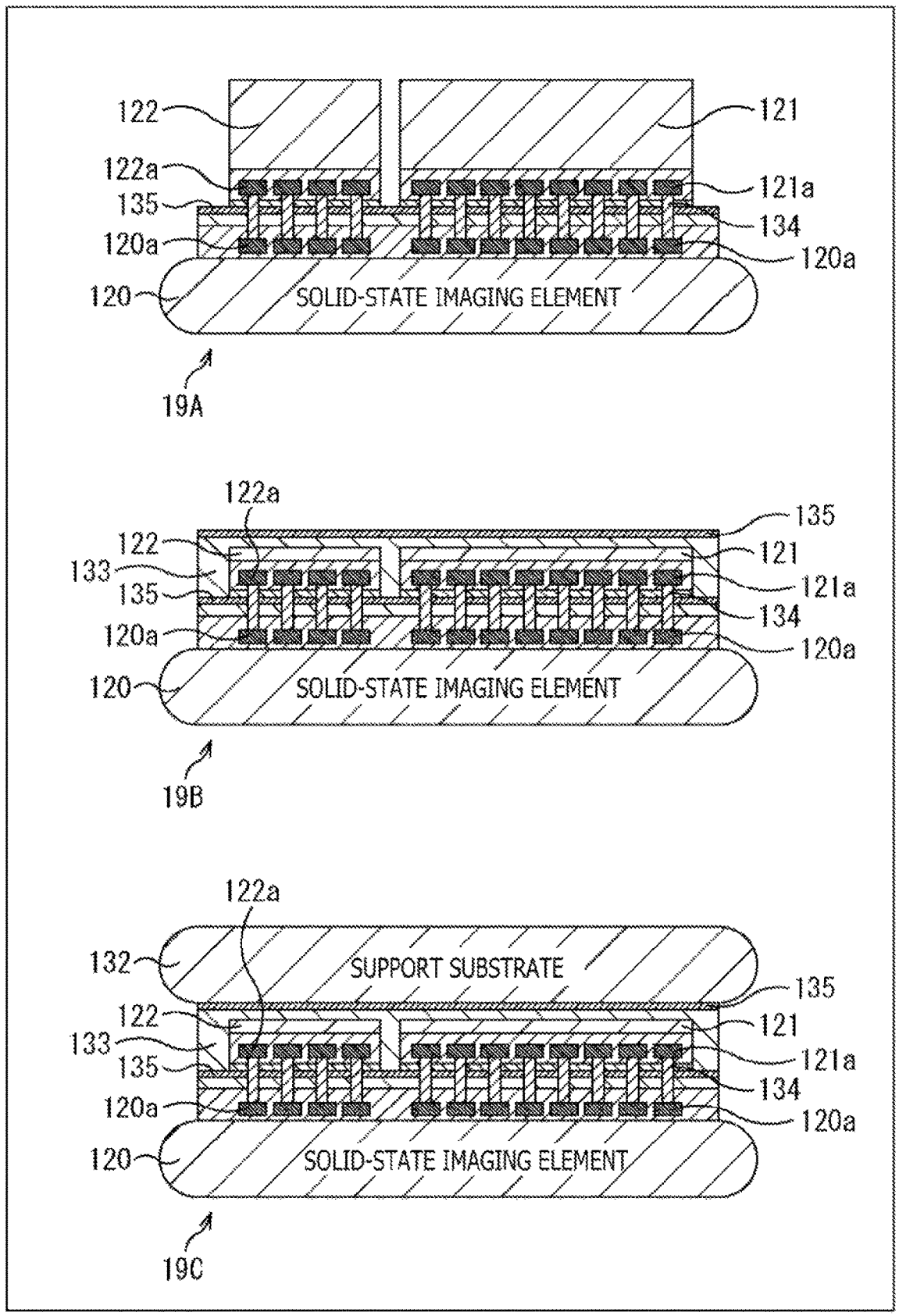
FIG. 19 is a view illustrating a manufacturing method of the solid-state imaging device of FIG. 18.
Figure 20:
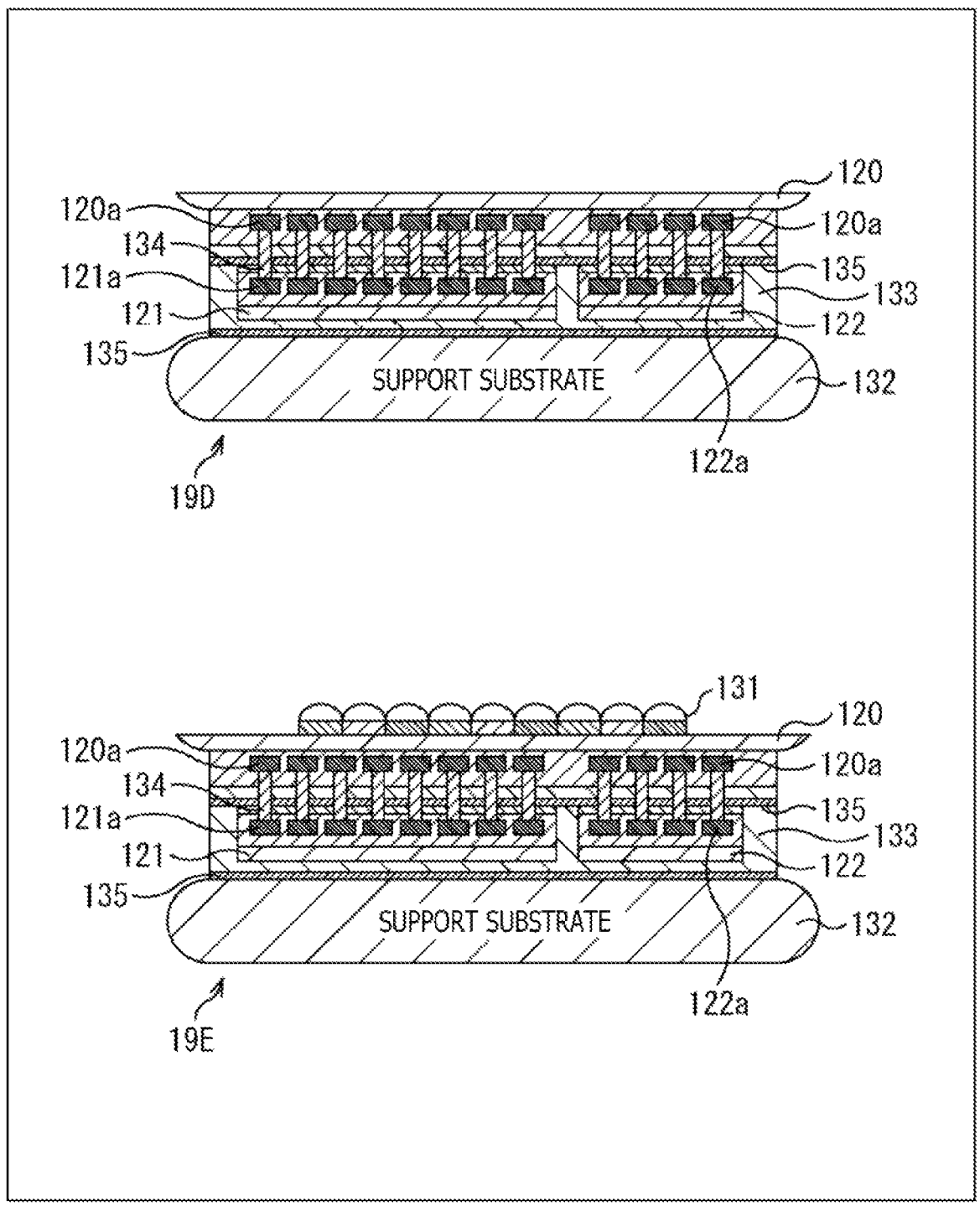
FIG. 20 is a view illustrating the manufacturing method of the solid-state imaging device of FIG. 18.

At a first step, as depicted by the side elevational sectional view 19A of FIG. 19, a memory circuit 121 and a logic circuit 122 that have been confirmed as good chips through electric inspection are formed on a solid-state imaging element 120 on a wafer 101 such that they have such a layout as depicted in the lower stage of FIG. 5 and wires 134 are formed on terminals 120a and 121a. Further, positioning is performed such that wires 134 from the terminals 121a of the memory circuit 121 and terminals 122a of the logic circuit 122 and wires 134 from terminals 120a of the solid-state imaging element 120 of the wafer 101 are positioned in an appropriately opposing relation to each other and are connected by CuCu joining and besides opposing layers are joined together by oxide film joining to form an oxide film joining layer 135.

At a second step, as depicted by the side elevational sectional view 19B of FIG. 19, the silicon layer on the memory circuit 121 and an upper lace portion in the figure of the logic circuit 122 is thinned to a height that does not have an influence on properties of the device and an oxide film 133 that functions as an insulating film is formed such that the chip including the rearranged memory circuit 121 and logic circuit 122 is embedded therein.

At a third step, as depicted by the side elevational sectional view 15C of FIG. 19, a support substrate 132 is joined to an upper portion of the memory circuit 121 and the logic circuit 122. At this time, layers at which the support substrate 132 and the memory circuit 121 and logic circuit 122 are opposed to each other are joined together by oxide film joining to form an oxide film joining layer 135.

At a fourth step, as depicted by the side elevational sectional view 19D of FIG. 20, upside down is performed such that the solid-state imaging element 120 comes to the top and the silicon layer that is an upper layer in the figure of the solid-state imaging element 120 is thinned.

At a fifth step, as depicted by the side elevational sectional view 19E of FIG. 20, an on-chip lens and on-chip color filter 131 is provided on the solid-state imaging element 120 and singulation is performed to complete a solid-state imaging device 111.

Figure 21:
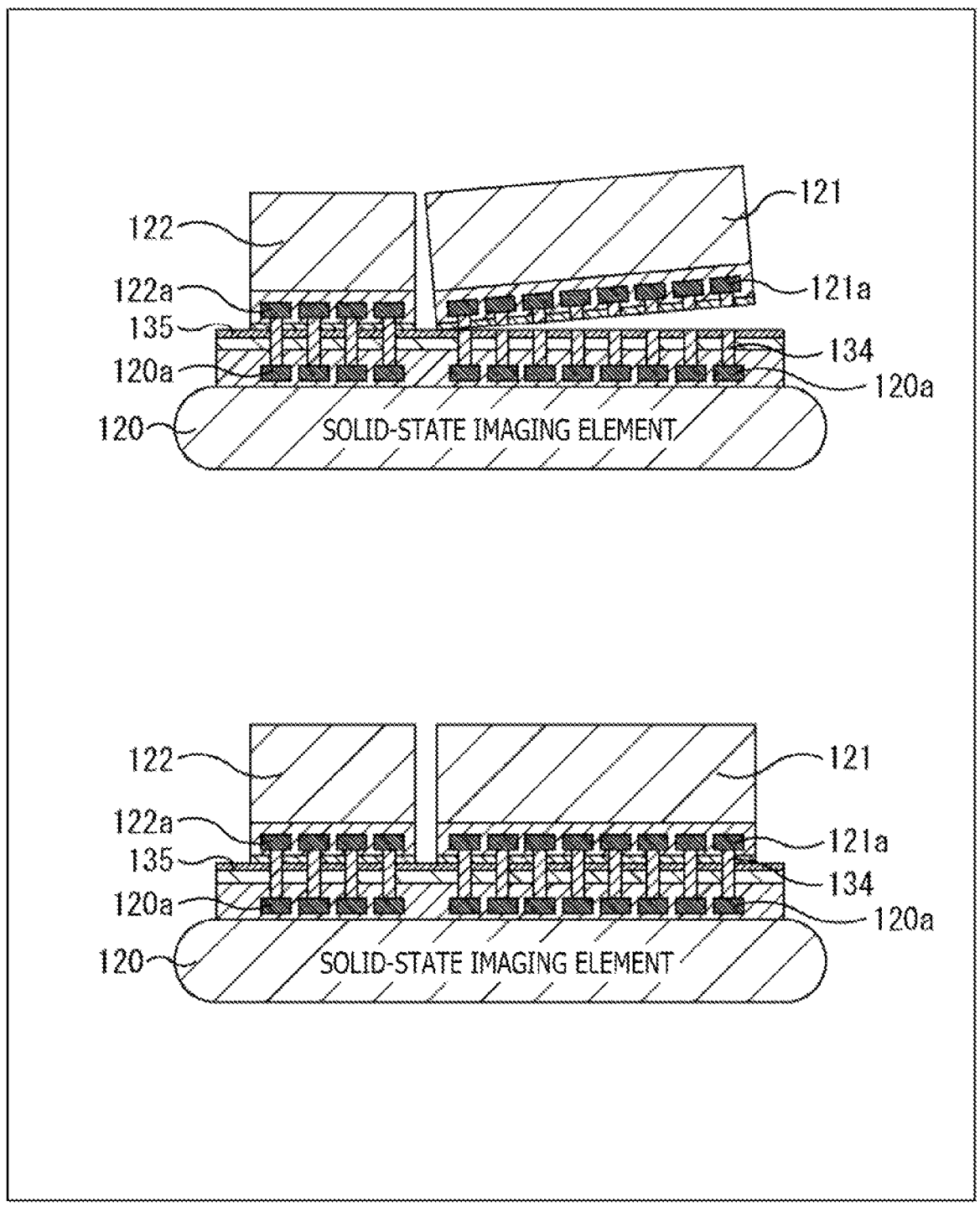
FIG. 21 is a view illustrating the manufacturing method of the solid-state imaging device of FIG. 18.

It is to be noted that, at the first step, when the memory circuit 121 and the logic circuit 122 are to be rearranged and joined to the solid-state imaging element 120, after they are individually subjected to hydrophilic treatment, they are contacted with each other in such a state that part of the singulated memory circuit 121 or logic circuit 122 such as an end side or an end point is positioned with certainly with respect to the solid-state imaging element 120, for example, as depicted in the upper stage of FIG. 21. Then, as depicted in the lower stage of FIG. 21, the memory circuit 121 or the logic circuit 122 is gradually contacted with the solid-state imaging element 120 beginning, from among portions of the same, with a portion near to the portion contacted with the solid-state imaging element 120 until it is entirely contacted and joined by oxide film joining.

After a portion such as an end side or an end point of the memory circuit 121 or the logic circuit 122 is positioned with high accurately and contacted the solid-state imaging element 120, the memory circuit 121 or the logic circuit 122 is gradually contacted beginning with a portion near to the contacted portion until it is rearrange in this manner. Consequently, the alignment accuracy of the memory circuit 121 and the logic circuit 122 with the solid-state imaging element 120 can be improved.

Further, since the memory circuit 121 and the logic circuit are gradually joined entirely after part of the memory circuit 121 or the logic circuit 122 and the solid-state imaging element 120 are contacted with each other in the state in which they are positioned in this manner, it is possible to loin them while voids (air bubbles) appearing in the joining face are gradually pushed out.

As a result, since appearance of voids in a joining face can be suppressed, even if the solid-state imaging device 111 is placed into a high temperature state at a different manufacturing step or upon operation, air in voids (air bubbles) is suppressed from expanding and exploding and the product accuracy can be improved. It is to be noted that, also at the first step in the first embodiment described hereinabove with reference to the side elevational sectional view 6A of FIG. 6, the entirety of the memory circuit 121 and the logic circuit may be joined gradually after part of the memory circuit 121 or the logic circuit 122 and the solid-state imaging element 120 are contacted in a positioned state.

Figure 22:
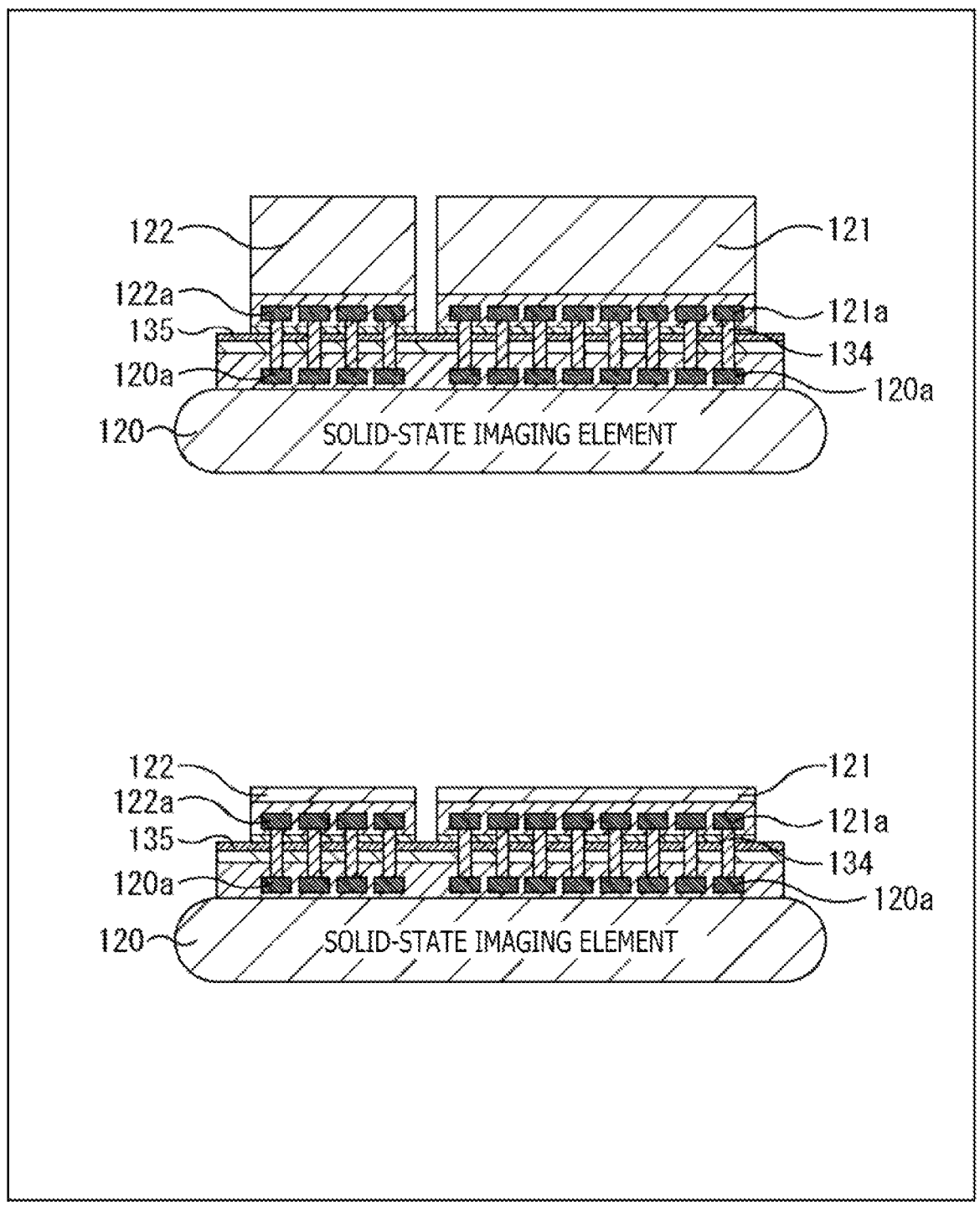
FIG. 22 is a view illustrating the manufacturing method of the solid-state imaging device of FIG. 18.

Further, at the second step, after the memory circuit 121 and logic circuit 122 and the solid-state imaging element 120 are joined together as depicted at the upper stage of FIG. 22 (similarly to the lower stage of FIG. 21), the silicon layer at an upper face portion in the figures of the memory circuit 121 and the logic circuit 122 is thinned to a height with which the properties of the device are not influenced as depicted at the lower stage of FIG. 22. Then, the memory circuit 121 and the logic circuit 122 are embedded into an insulating film including the oxide film 133 and an oxide film joining layer 135 is formed on the flattened uppermost face, by which such a configuration as indicated by the side elevational sectional view 19B of FIG. 19 is obtained.

By such manufacturing steps as described above, the solid-state imaging device 111 including the first layer in which the solid-state imaging element 120 is formed and the second layer in which the memory circuit 121 and the logic circuit 122 are formed is manufactured.

As a result, since the memory circuit 121 and the logic circuit 122 are connected to the solid-state imaging element 120, the step of arranging them on a support substrate is eliminated and the man-hours can be reduced. Further, since the support substrate partly becomes unnecessary in manufacture, the manufacturing cost can be reduced. Furthermore, since the memory circuit 121 and the logic circuit 122 are rearranged on the solid-state imaging element 120 in a state in which they are directly positioned relative to each other, the alignment accuracy of the memory circuit 121 and the logic circuit 122 with respect to the solid-state imaging element. 120 can be improved.

7. Modification of Fifth Embodiment

<Modification of Solid-State Imaging Device in Case where Memory Circuit and Logic Circuit are Formed Directly on Wafer of Solid-State Imaging Element>

Although the solid-state imaging apparatus described above is configured such that the memory circuit 121 and the logic circuit 122 are embedded in an insulating film including the oxide film 133 and the oxide film joining layer 135 is formed on a flattened uppermost face so as to have such a configuration as depicted in the side elevational sectional view 19B of FIG. 19, high heat resistant resin may be applied or laminated in place of the oxide film 133.

Figure 23:
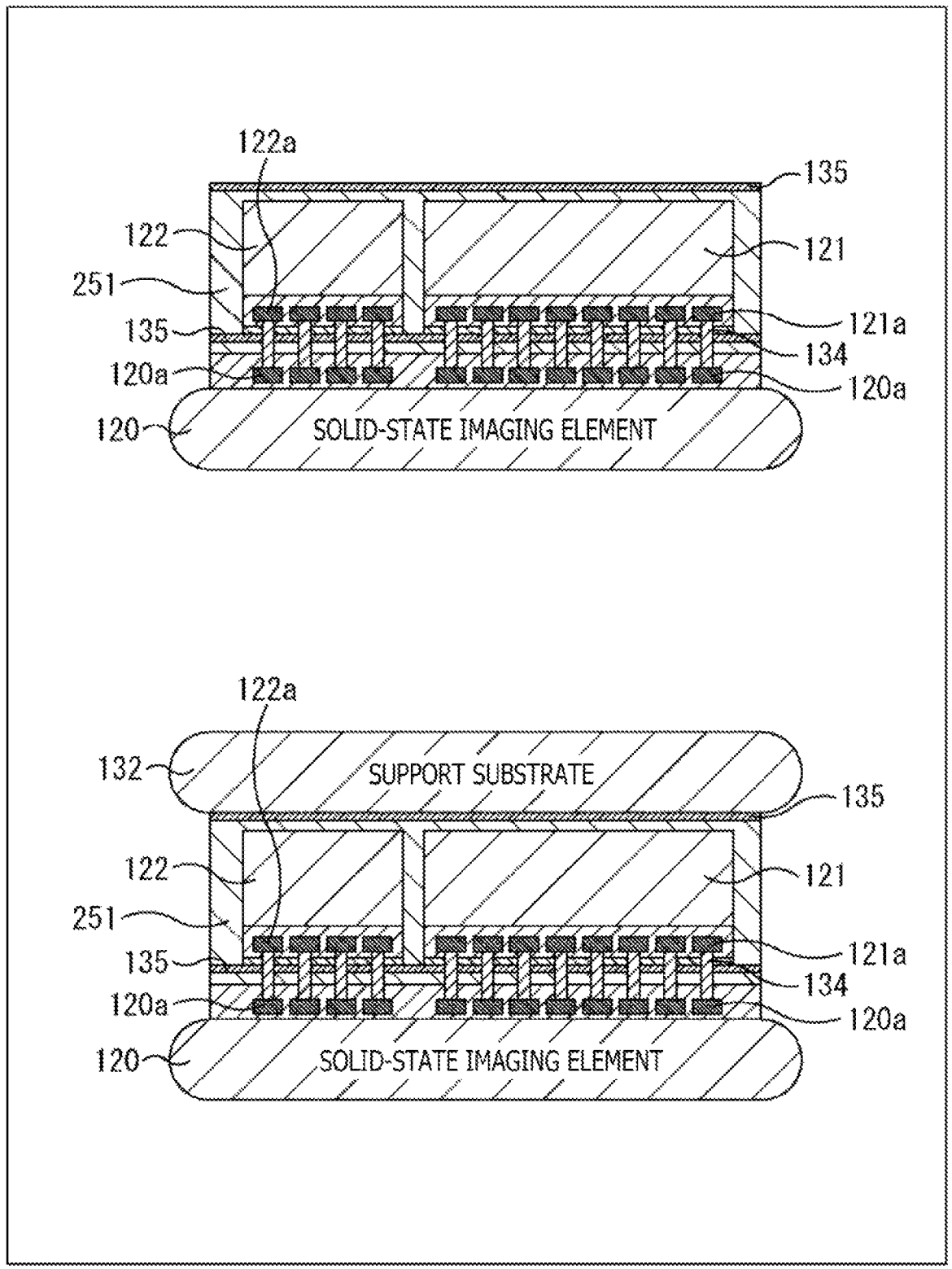
FIG. 23 is a view illustrating an example of a configuration of a solid-state imaging device that is a modification of the fifth embodiment of the present disclosure.

In particular, after a memory circuit 121 and a logic circuit 122 are formed on a solid-state imaging element 120 on a wafer 101, a high heat resistant resin 251 including an organic film or the like may be applied to or laminated on the memory circuit 121 and the logic circuit 122 as depicted at the upper stage of FIG. 23.

By joining the support substrate 132 in a state in which the high heat resistant resin 251 remains in the applied or laminated state as depicted at the lower stage of FIG. 23, it becomes possible to paste the support substrate 132 without thinning a silicon layer at an upper face portion of the memory circuit 121 and the logic circuit 122, and the tan-hours can be reduced.

It is to be noted that the oxide film 133 that serves as an embedding member as an insulating film for the memory circuit 121 and the logic circuit 122 preferably is a Si-based oxide film such as, for example, SiO2, SiO and SRO. Further, for the high heat resistant resin 241, a polyimide-based film of PI, PBO or the like or a polyamide-based film is preferably used as a high heat resistant material including an organic film.

8. Sixth Embodiment

<Example of Configuration of Solid-State Imaging Device in Case where Memory Circuit and Logic Circuit are Formed in Plural Layers on Wafer on which Solid-State Imaging Element is Formed>

The foregoing description is directed to an example in which a memory circuit 121 and a logic circuit 122 singulated and confirmed as good chips are rearranged in one layer on a solid-state imaging element 120 formed on a wafer 101 to form a solid-state imaging device. However, a memory circuit 121 and a logic circuit 122 confirmed as good chips may be rearranged in a plurality of layers to form a solid-state imaging device.

Figure 24:
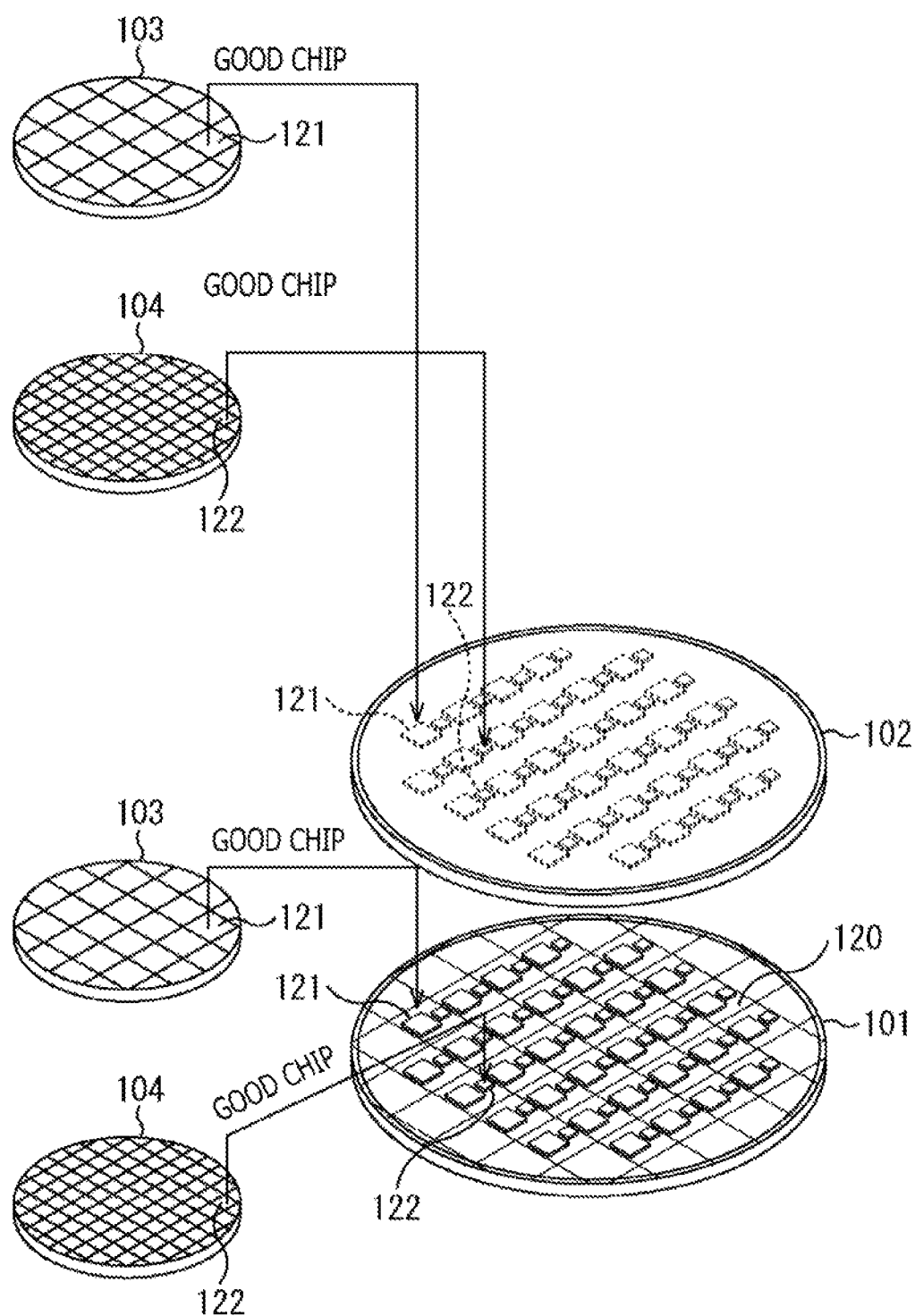
FIG. 24 is a view illustrating an overview of a manufacturing method of a solid-state imaging device of a sixth embodiment of the present disclosure.

FIG. 24 is a view illustrating a stacked structure of a wafer configured by the WoW technology applied to a solid-state imaging device that is manufactured by forming memory circuits 121 and logic circuits 122, which have been singulated and confirmed as good chips, in two layers on a solid-state imaging element 120 formed on a wafer 101 of the present disclosure.

In FIG. 24, a wafer 102 on which memory circuits 121 and logic circuits 122 are rearranged and a wafer 101 on which memory circuits 121 and logic circuits 122 are rearranged on a solid-state imaging element 120 are stacked from above in the figure. It is to be noted that, in FIG. 24, the wafer 102 and the wafer 101 are configured such that individual faces thereof on which the memory circuit 121 and the logic circuit 122 are rearranged are opposed to each other. In particular, in FIG. 24, that the memory circuits 121 and the logic circuits 122 on the wafer 102 are indicated by broken lines represents that the face thereof on which the memory circuit 121 and the logic circuit 122 are reconfigured are opposed to the wafer 101.
<Example of Configuration of Solid-State Imaging Device Including Wafers Stacked by WoW Technology in FIG. 24>

Such wafers stacked by the WoW technology as depicted in FIG. 24 are singulated to form the solid-state imaging device of the present disclosure. The solid-state imaging device of the present disclosure has such a configuration as, for example, depicted by the side elevational sectional view of FIG. 25.

Figure 25:
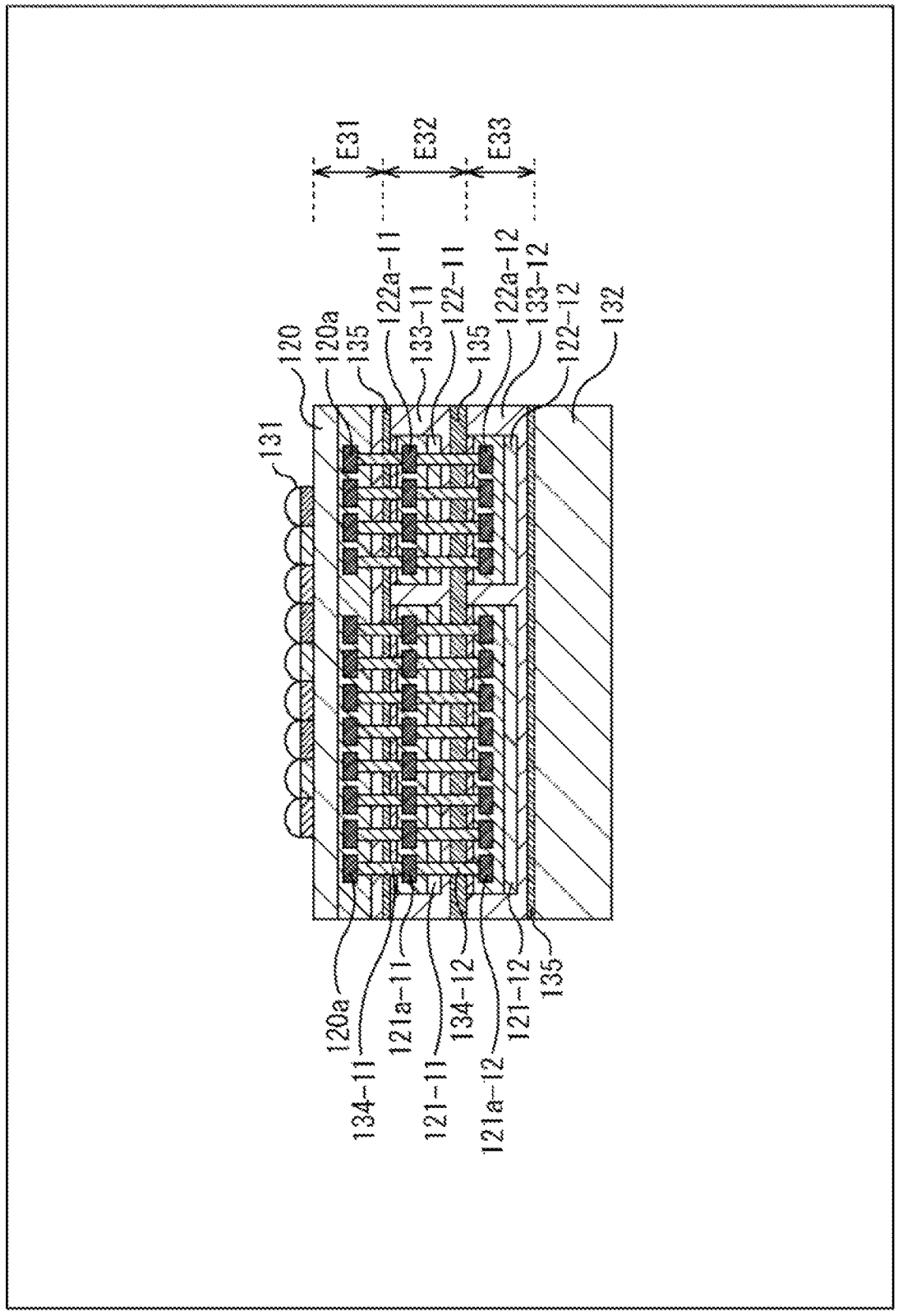
FIG. 25 is a view illustrating an example of a configuration of a solid-state imaging device of a sixth embodiment of the present disclosure.

In particular, the solid-state imaging device 111 of FIG. 25 includes an on-chip lens and on-chip color filter 131, a solid-state imaging element 120, a memory circuit 121-11 and a logic circuit 122-11 in a first layer from above, a memory circuit 121-11 and a logic circuit 122-12 in a second layer from above, and a support substrate 132.

In particular, as depicted in FIG. 25, the solid-state imaging device 111 of FIG. 24 has: a semiconductor element layer E31 including a solid-state imaging element 120 including a wafer 101; a semiconductor element layer E32 including a memory circuit 121-11 and a logic circuit 122-11 of the first layer formed directly by rearrangement on the solid-state imaging element 120; and a semiconductor element layer E33 including a memory circuit 121-12 and a logic circuit 122-12 of the second layer formed on the wafer 102.

Terminals 120a of the solid-state imaging element 120 are electrically connected to terminals 121a-11 of the memory circuit 121-11 and terminals 122a-11 of the logic circuit 122-11 of the semiconductor element layer E32 by wires 134-11 connected by CuCu connection. Further the terminals 121a-11 of the memory circuit 121-11 and the terminals 122a-11 of the logic circuit 122-11 of the semiconductor element layer E32 are electrically connected to terminals 121a-12 of the memory circuit 121-12 and terminals 122a-12 of the logic circuit 122-12 of the semiconductor element layer E33 by wires 134-12 connected by CuCu connection.

In a space around the solid-state imaging element 120, and the memory circuits 121-11 and 121-12 and the logic circuits 122-11 and 122-12 of the semiconductor element layers E32 and E33, and the support substrate 132 an oxide film 133 is formed. Further, on the boundary between semiconductor element layer E31 on which the solid-state imaging element 120 is formed and the semiconductor element layer E32 in which the memory circuit 121-11 and the logic circuit 122-11 are formed and embedded in the oxide film 133, the oxide film joining layer 135 is formed and the layers are joined together by oxide film joining. Further, on the boundary between the semiconductor element layer E32 in which the memory circuit 121-11 and the logic circuit 122-11 are formed and embedded in the oxide film 133 and the semiconductor element layer E33 in which the memory circuit 121-12 and the logic circuit 122-12 are formed and embedded in the oxide film 133, the oxide film joining layer 135 is formed and the layers are joined together by oxide film joining. On the boundary between the support substrate 132 and the semiconductor element layer E33 in which the memory circuit 121-12 and the logic circuit 122-12 are formed and embedded in the oxide film 133, the oxide film joining layer 135 is formed and the layers are joined together by oxide film joining.
<Manufacturing Method of Solid-State Imaging Device of FIG. 25>

Figure 27:
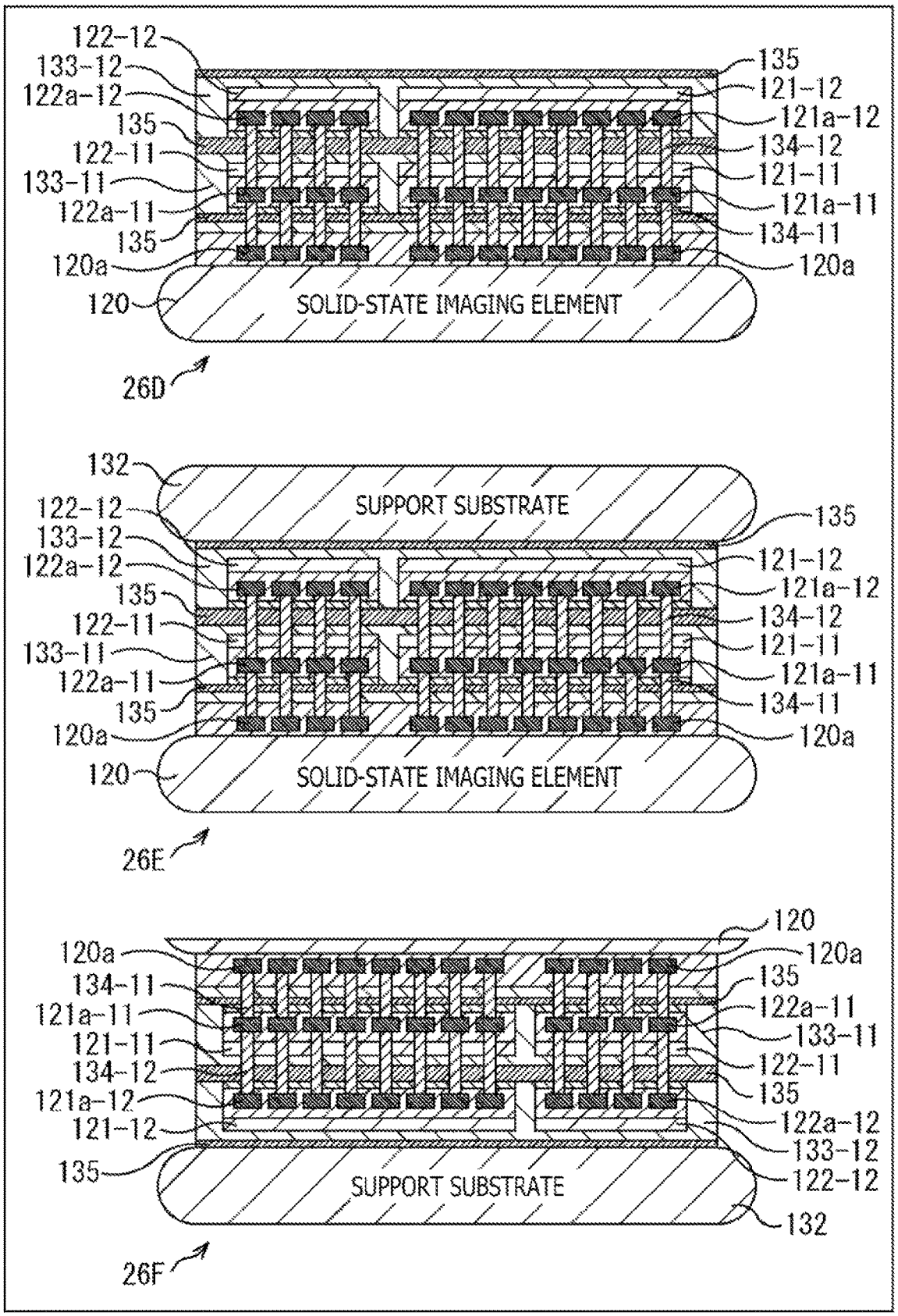
FIG. 27 is a view illustrating the manufacturing method of the solid-state imaging device of FIG. 25.
Figure 28:
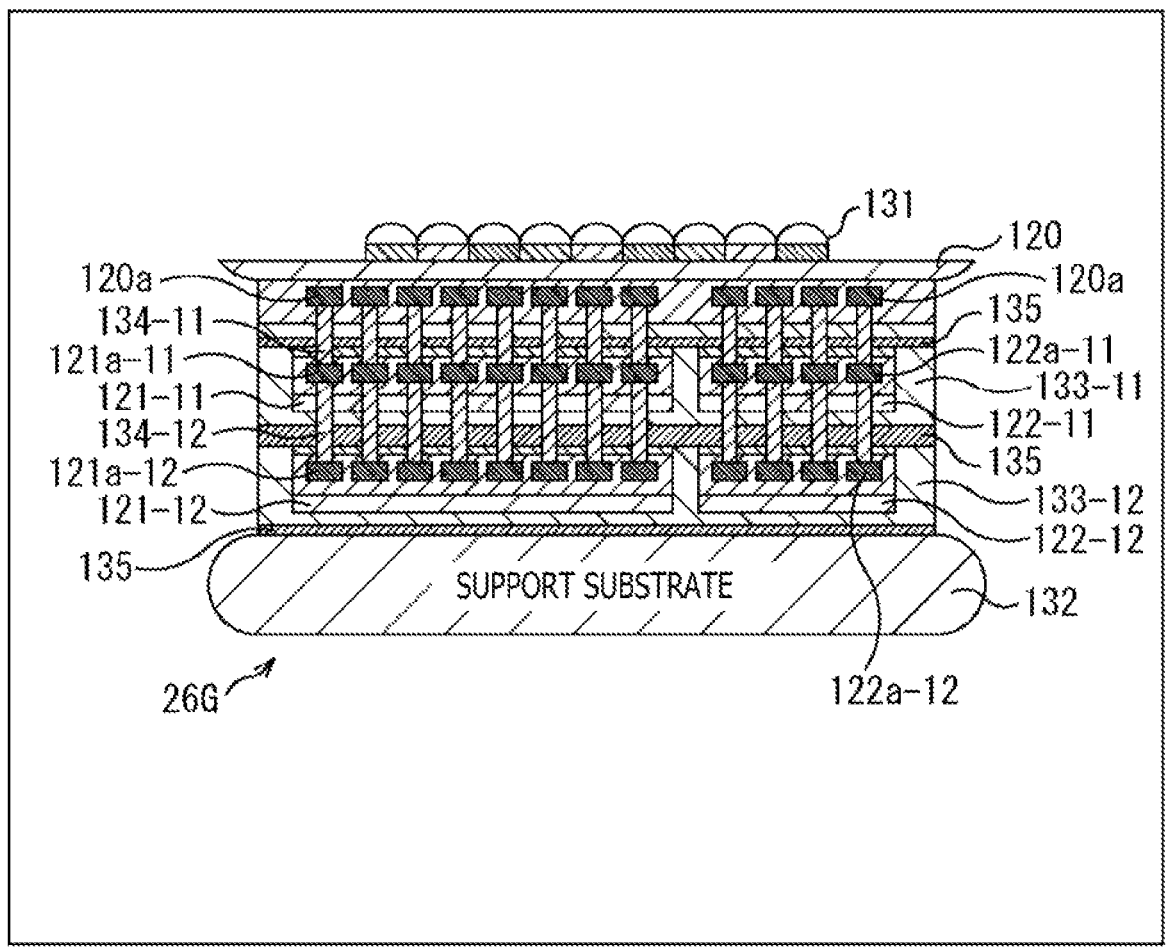
FIG. 28 is a view illustrating the manufacturing method of the solid-state imaging device of FIG. 25.

Now, a manufacturing method of the solid-state imaging device 111 of FIG. 25 is described with reference to FIGS. 26 to 28. It is to be noted that side elevational sectional views 26A to 26G of FIGS. 26 to 28 depict side elevational sectional views of the solid-state imaging device 111.

Figure 26:
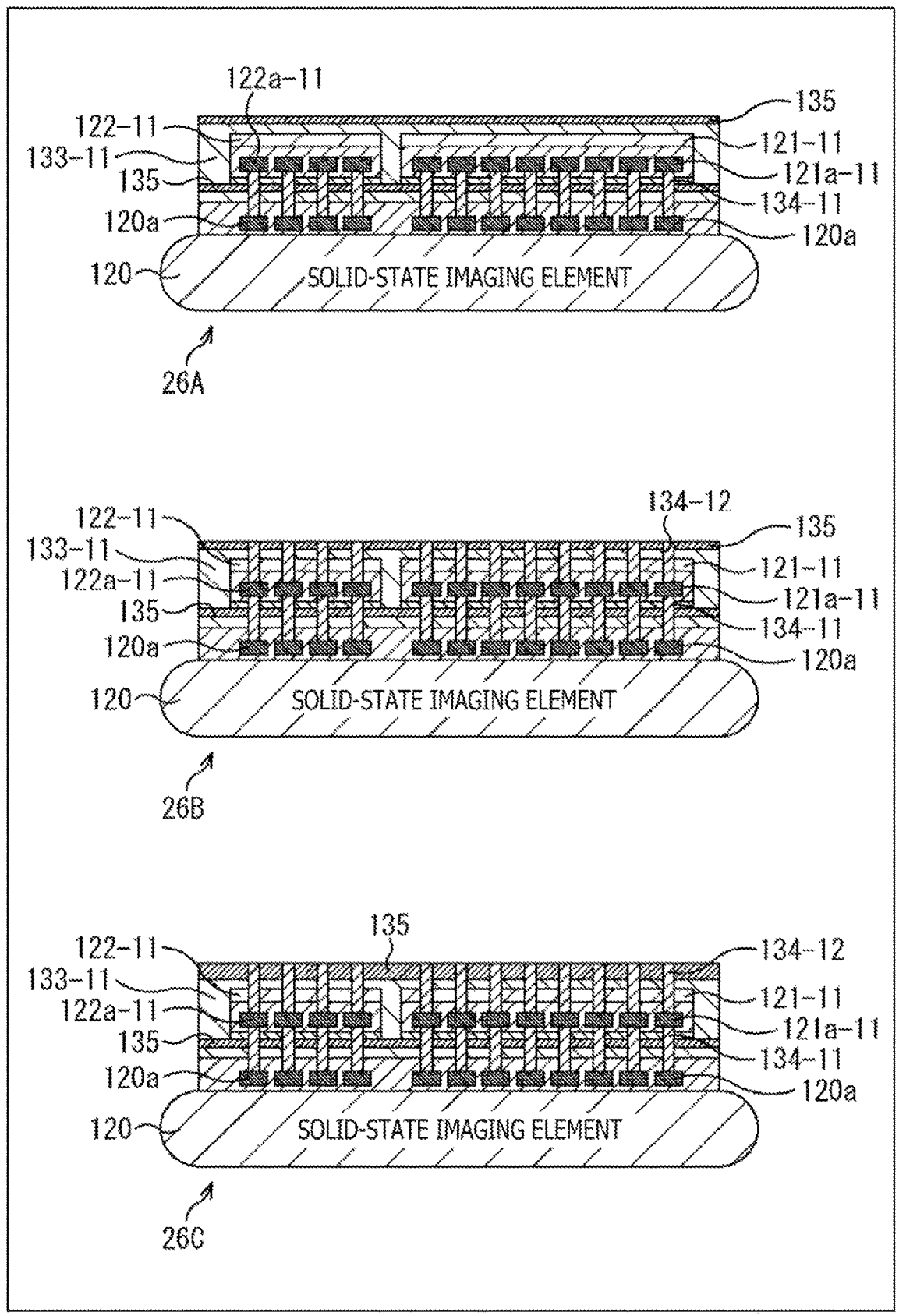
FIG. 26 is a view illustrating a manufacturing method of the solid-state imaging device of FIG. 25.

At a first step, as depicted by the side elevational sectional view 26A of FIG. 26, after electric inspection for the solid-state imaging element 120 on the wafer 101 is performed, memory circuits 121 and logic circuits 122 that are confirmed as good products are formed in such a layout as depicted at the lower stage of FIG. 5 and wires 134-11 are formed to the terminals 120a and 121a. Further, positioning is performed such that wires 134-11 from the terminals 121a-11 of the memory circuit 121-11 and the terminals 122a-11 of the logic circuit 122-11 and the wires 134-11 from the terminals 120a of the solid-state imaging element 120 in the wafer 101 are positioned in an appropriately opposed relation to each other, and they are connected to each other by CuCu joining and the opposing layers are joined together by an oxide film joining layer 135 formed by oxide film joining.

At a second step, as depicted by the side elevational sectional view 26B of FIG. 26, wires 134-12 formed, for example, from through-electrodes (TSVs) are formed for the terminals 121a-11 of the memory circuit 121-11 and the terminals 122a-11 of the logic circuit 122-11.

At a third step, as depicted by the side elevational sectional view 26C of FIG. 26, PADS for connection and an oxide film joining layer 135 for connection are formed for the wires 134-12.

At a fourth step, as depicted by the side elevational sectional view 26D of FIG. 27, terminals 121a-12 of the memory circuit 121-12 and terminals 122a-12 of the logic circuit 122-12 are formed in an electrically connected state through the wires 134-12 by a method similar to the method described hereinabove with reference to the side elevational sectional views 19A and 19B of FIG. 19 and FIGS. 21 and 22.

At a fifth step, as depicted by the side elevational sectional view 26E of FIG. 27, a support substrate 132 is joined to an upper portion of the memory circuit 121-12 and the logic circuit 122-12. At this time, the opposing layers of the support substrate 132 and the memory circuit 121-12 and logic circuit 122-12 are joined together by an oxide film joining layer 135 formed by oxide film joining.

At a sixth step, as depicted by the side elevational sectional view 26F of FIG. 27, upside down is performed such that the solid-state imaging element 120 comes to the top and the silicon layer that is a layer at the top in the figure of the solid-state imaging element 120 is thinned.

At a seventh step, as depicted by the side elevational sectional view 26G of FIG. 23, an on-chip lens and on-chip color filter 131 is provided on the solid-state imaging element 120, and singulation is performed to complete the solid-state imaging device 111.

By such joining as described above, the memory circuit 121 and the logic circuit 122 can be stacked in a plurality of layers.

It is to be noted that, although the foregoing description is directed to an example in which the memory circuit 121 and the logic circuit 122 are formed in two layers, they may otherwise be stacked in three or more layers by using a similar method.

9. Example of Connection to Solid-State Imaging Element

<First Connection Example>

Although the foregoing description is directed to an example in which, in regard to joining, oxide film coupling is applied to portions other than terminals and CuCu joining is applied to terminals to form wires 134 to establish electric connection, other connection methods may be used.

Figure 29:
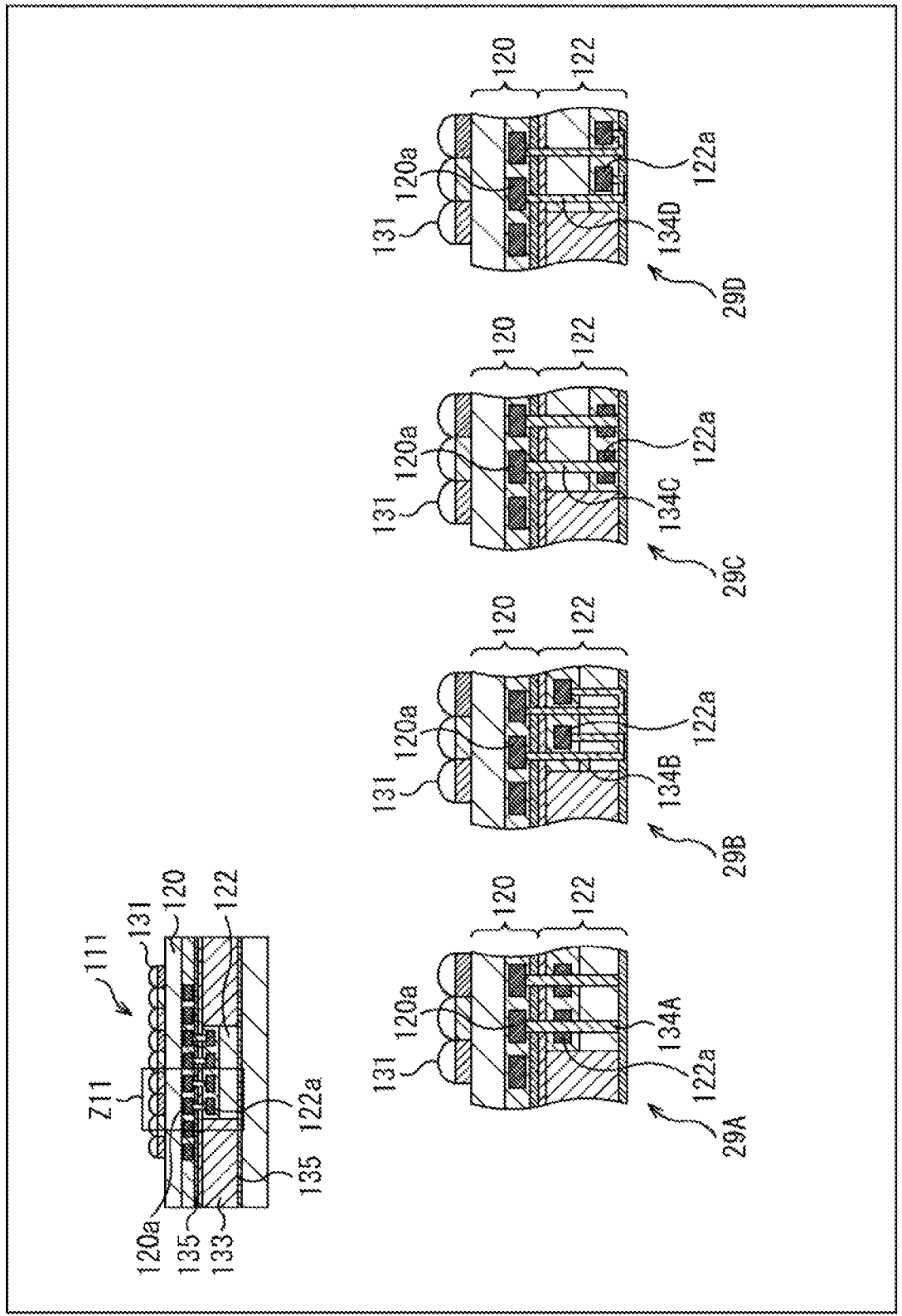
FIG. 29 is a view illustrating a first connection example to the solid-state imaging element.

FIG. 29 depicts connection examples 29A to 29D in the case where terminals 120a and 122a of a solid-state imaging element 120 and a logic circuit 122 within a range indicated by a frame Z11 of a solid-state imaging device 111 at a left upper stage are connected to each other.

In the connection example 29A, the terminals 122a of the logic circuit 122 and the terminals 120a of the solid-state imaging element 120 are arranged at a same position in a horizontal direction in the figure, and the terminals 122a of the logic circuits 122 are disposed in a displaced relation to the boundary side with the solid-state imaging element 120 in a vertical direction in the figure. Further, through-vias are formed such that they extend through the terminals 122a and 120a from the rear face side (lower side in the figure) of the solid-state imaging device 111, and a wire 134A is formed in each through-via.

In the connection example 29B, the terminals 122a of the logic circuit 122 and the terminals 120a of the solid-state imaging element. 120 are arranged in a displaced relation from each other in the horizontal direction in the figure while the terminals 122a of the logic circuit 122 are arranged in a displaced relation to the boundary side with the solid-state imaging element 120 in the vertical direction in the figure. Further, through-vies are formed such that they extend through the terminals 122a and 120a independently of each other from the rear face side (lower side in the figure) of the solid-state imaging device 111. Further, wires 134B are formed in the through-vias, and wires are connected to them on the surface on the rear face side.

In the connection example 29C, the terminals 122a of the logic circuit 122 and the terminals 120a of the solid-state imaging element 120 are arranged at a same position in the horizontal direction in the figure while the terminals 122a of the logic circuit 122 are arranged in a displaced relation to the rear face side (lower side in the figure) from the solid-state imaging element 120 in the vertical direction in the figure. Further, through-vias are formed such that they extend through the terminals 122a and 120a from the rear face side (lower side in the figure) of the solid-state imaging device 111, and wires 134C are formed in the through-vias.

In the connection example 29D, the terminals 122a of the logic circuit 122 and the terminals 120a of the solid-state imaging element 120 are arranged in a displaced relation from each other in the horizontal direction in the figure while the terminals 122a of the logic circuit 122 are arranged in a displaced relation to the rear face side (lower side in the figure) from the solid-state imaging element 120 in the vertical direction in the figure. Further, vias are formed such that they extend through the terminals 122a and 120a independently of each other from the rear face side (lower side in the figure) of the solid-state imaging device 111, and wires 134D are formed in the vias and wires are connected to them on the surface on the rear face side.

<Manufacturing Method of Solid-State Imaging Device in which Connection Examples to Solid-State Imaging Element of FIG. 29 are Used>

Figure 30:
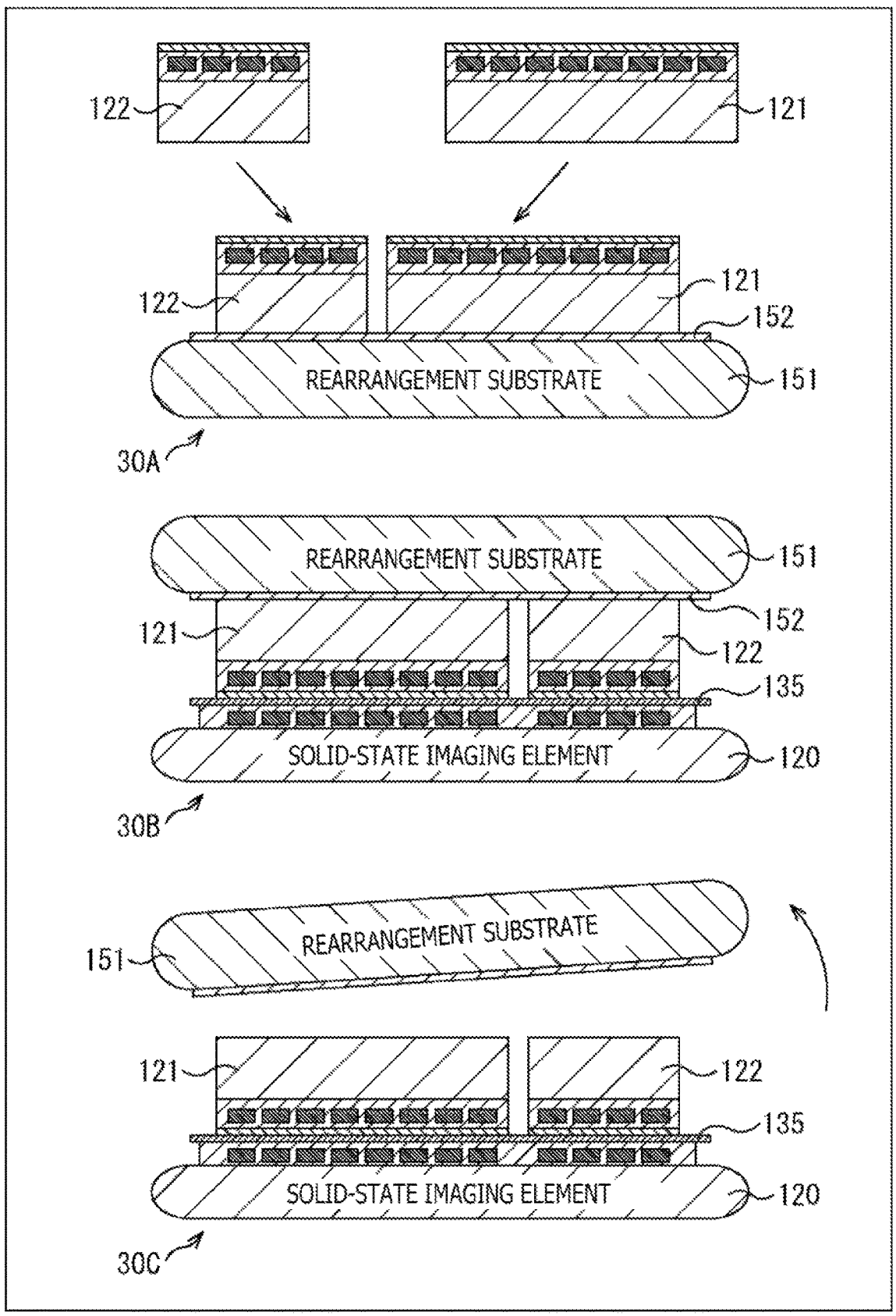
FIG. 30 is a view illustrating a manufacturing method of the solid-state imaging device of FIG. 29.
Figure 31:
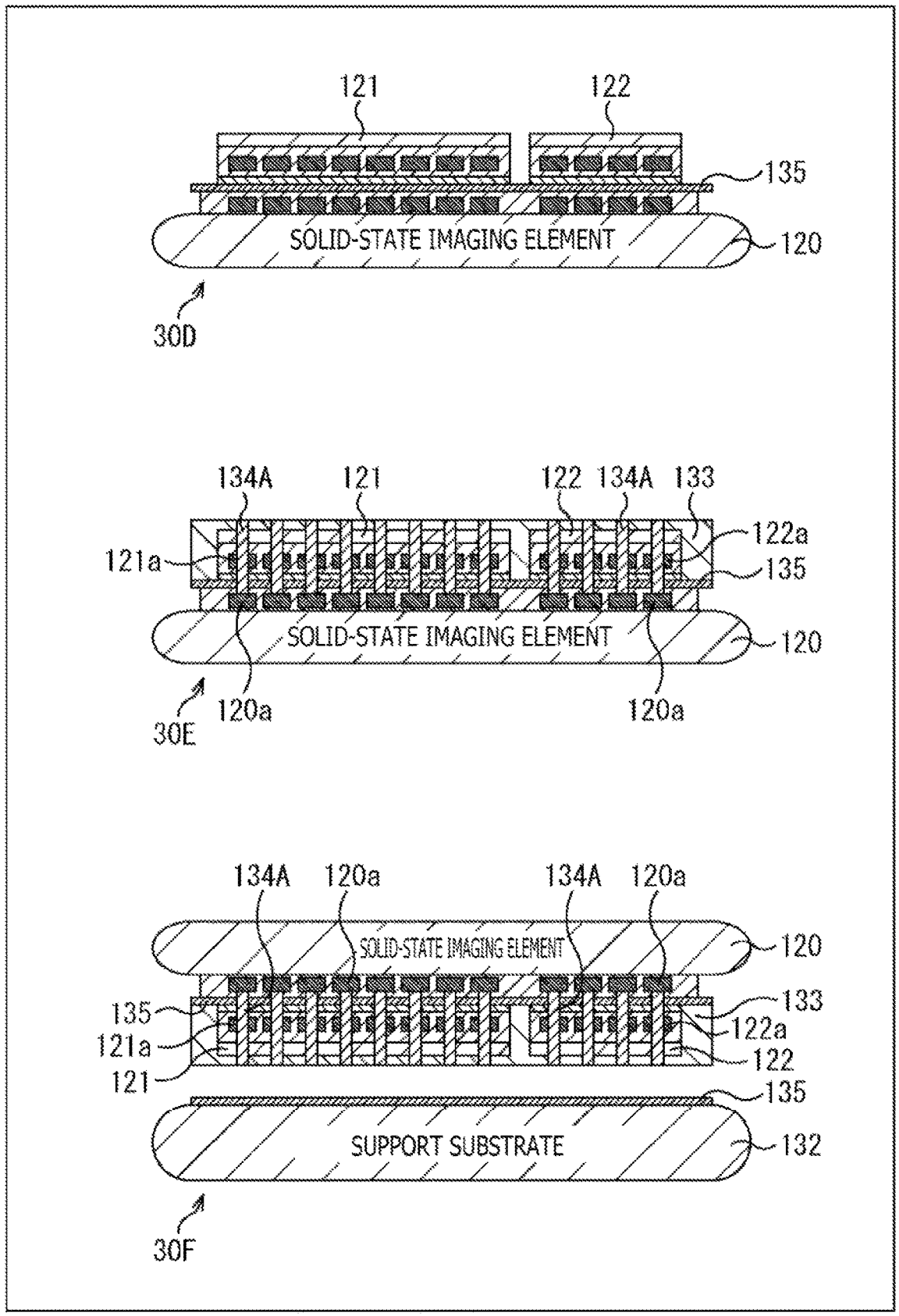
FIG. 31 is a view illustrating the manufacturing method of the solid-state imaging device of FIG. 29.
Figure 32:
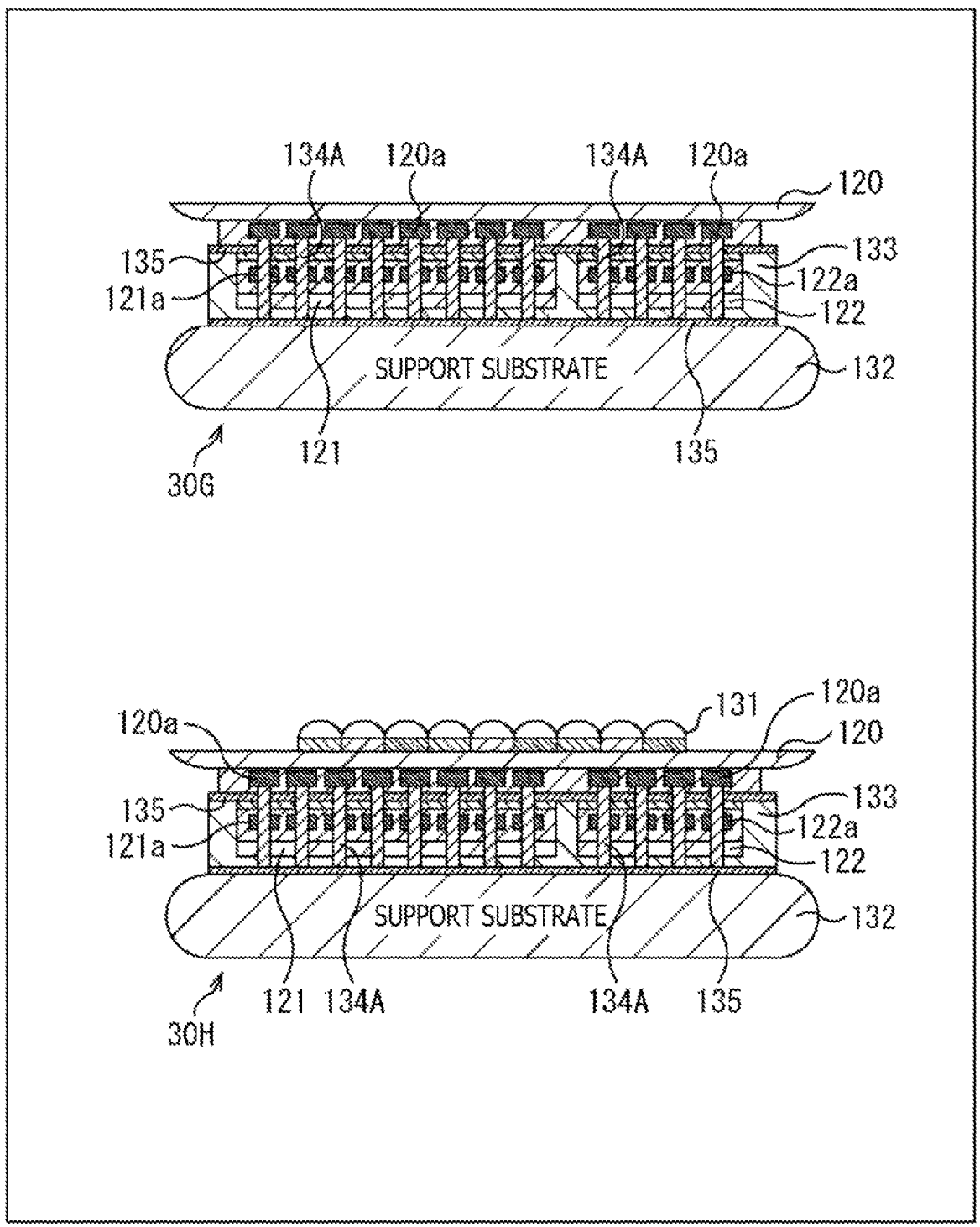
FIG. 32 is a view illustrating the manufacturing method of the solid-state imaging device of FIG. 29.

Now, a manufacturing method of the solid-state imaging device 111 for which the connection examples of FIG. 29 are used is described with reference FIGS. 30 to 32. It is to be noted that side elevational sectional views 30A to 30H of FIGS. 30 to 32 depict side elevational sectional views of the solid-state imaging device 111. Here, the connection example 29A is described here.

At a first step, as depicted by the side elevational sectional view 30A of FIG. 30, after electric inspection is performed, memory circuits 121 and logic circuits 122 confirmed as good products are rearranged on the rearrangement substrate 151 corresponding to the wafer 102. The rearrangement substrate 151 has adhesive 152 applied thereto, and the memory circuits 121 and the logic circuits 122 are rearranged on and fixed to the rearrangement substrate 151 by the adhesive 152. It is to be noted that, after a portion such as an end face or an end point of the memory circuit 121 or the logic circuit 122 is contacted with the solid-state imaging element 120, the other portion of the memory circuit 121 or the logic circuit 122 is gradually contacted, joined and rearranged beginning with a portion near to the contacted portion as described hereinabove with reference to FIG. 22.

At a second step, as depicted by the side elevational sectional view 30B of FIG. 30, upside down is performed such that the upper face of the memory circuit 121 and the logic circuit 122 depicted in the side elevational sectional view 30A comes to the bottom, and an oxide film joining layer 135 is formed on the solid-state imaging element 120 to couple them to the solid-state imaging element 120 by oxide film coupling.

At a third step, as depicted by the side elevational sectional view 30C of FIG. 30, the rearrangement substrate 151 is debonded, exfoliated and removed together with the adhesive 152.

At a fourth step, as depicted by the side elevational sectional view 30D of FIG. 31, the silicon layer at an upper face portion in the figure of the memory circuit 121 and the logic circuit 122 is thinned to a width that does not have an influence on performances of the device.

At a fifth step, as depicted by the side elevational sectional view 30E of FIG. 31, an oxide film 133 that functions as an insulating film is formed such that a chip including the rearranged memory circuit 121 and logic circuit 122 is embedded in the oxide film 133 and then the oxide film 133 is flattened. Further, the terminals 121a of the memory circuit 121 and the terminals 120a of the solid-state imaging element 120 are arranged at a same position in the horizontal direction, and through-vias are formed so as to extend through the terminals 120a and 121a. Thereafter, metal is embedded into the through-vias to form a wire 134A in each of the through-vias.

At a sixth step, as depicted by the side elevational sectional view 30F of FIG. 31, the configuration depicted in the side elevational sectional view 30E is reversed, and an oxide film joining layer 135 is formed on the support substrate 132 and then the configuration is coupled to the support substrate 132 by oxide film coupling.

At a seventh step, as depicted by the side elevational sectional view BOG of FIG. 32, the silicon layer of the solid-state imaging element 120 is thinned.

At an eighth step, as depicted by the side elevational sectional view 30H of FIG. 32, an on-chip lens and on-chip color filter 131 is provided on the solid-state imaging element 120 and singulation is performed, and a solid-state imaging device 111 is completed therewith.

By such steps as described above, the wires 134A are formed in the through-vias formed to extend from the rear face side to establish a state in which the solid-state imaging element 120 and the memory circuit 121 and logic circuit 122 are electrically connected to each other, and the solid-state imaging device 111 is manufactured thereby.

It is to be noted that also the wires 134B to 134D depicted in the connection examples 29B to 29C can be manufactured by similar steps although they are different in terms of the position, depth and number of through-vias.

Also, in such a configuration as described above, since circuit connection between the solid-state imaging element 120 and the memory circuit 121 and logic circuit 122 can be established through terminals formed in a wire density of fine wires by a lithography technique of semiconductors similarly as in the WoW, the number of connection terminals can be increased and reduction of the power consumption can be anticipated.

<Second Connection Example>

Although the foregoing description is directed to an example in which a through-via is formed from the rear face side (from the opposite side to the imaging face) of the solid-state imaging device 111 and a wire for electrically connecting a terminal is formed, a wire may be formed by forming a through-via from the front face side (imaging face side) and pouring metal into the through-via.

Figure 33:
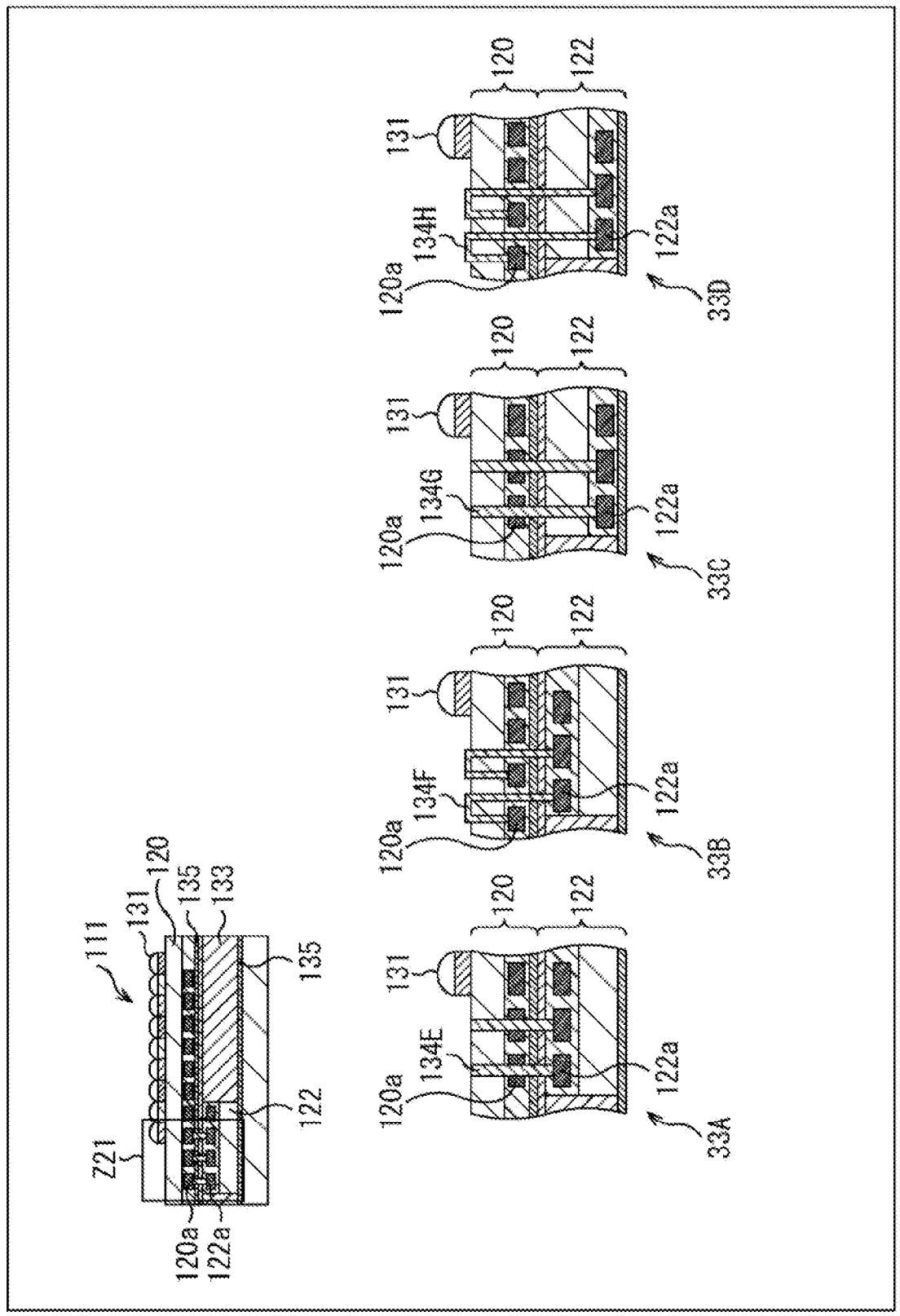
FIG. 33 is a view illustrating a second connection example to the solid-state imaging element.

FIG. 33 depicts connection examples 33A to 33D in the case where the terminals 120a and 122a of the solid-state imaging elements 120 and the logic circuits 122 within a range indicated by a frame Z21 of the solid-state imaging device 111 at the left upper stage are connected to each other.

In the connection example 33A, the terminals 122a of the logic circuits 122 and the terminals 120a of the solid-state imaging elements 120 are arranged at a same position in the horizontal direction in the figure and the terminals 122a of the logic circuits 122 are arranged in a displaced relation to the boundary side with the solid-state imaging element 120 in the vertical direction in the figure. Further, through-vias are formed such that they extend in a skewered state through the terminals 122a and 120a from the front face side (upper side in the figure) of the solid-state imaging device 111 and wires 134E are formed in the through-vias.

In the connection example 33B, the terminals 122a of the logic circuits 122 and the terminals 120a of the solid-state imaging elements 120 are arranged in a displaced relation from each other in the horizontal direction in the figure and the terminals 122a of the logic circuits 122 are arranged in a displaced relation to the boundary side with the solid-state imaging element 120 in the vertical direction in the figure. Further, through-vias are formed such that they extend independently of each other through the terminals 122a and 120a from the front face side (upper side in the figure) of the solid-state imaging device 111 and wires 134F are formed in the through-vias, and the wires are connected on the surface on the front face side.

In the connection example 33C, the terminals 122a of the logic circuits 122 and the terminals 120a of the solid-state imaging elements 120 are arranged at a same position in the horizontal direction in the figure and the terminals 122a of the logic circuits 122 are arranged in a displaced relation to the rear face side (lower side in the figure) to the solid-state imaging element 120 in the vertical direction in the figure. Further, through-vias are formed such that they extend in a skewered state through the terminals 122a and 120a from the front face side (upper side in the figure) of the solid-state imaging device 111 and wires 134G are formed in the through-vias.

In the connection example 33D, the terminals 122a of the logic circuits 122 and the terminals 120a of the solid-state imaging elements 120 are arranged in a displacement relation from each other in the horizontal direction in the figure and the terminals 122a of the logic circuits 122 are arranged in a displaced relation to the rear face side (lower side in the figure) to the solid-state imaging element 120 in the vertical direction in the figure. Further, through-vias are formed such that they extend independently of each other through the terminals 122a and 120a from the front face side (upper side in the figure) of the solid-state imaging device 111 and wires 134H are formed in the through-vias, and the wires are connected on the surface on the rear face side.

It is to be noted that, since it is necessary to form the through-vias from the imaging plane, all of the wires 134E to 134H are formed on the outside of the pixel region of the solid-state imaging elements 120 in the horizontal direction.

<Manufacturing Method of Solid-State Imaging Device in which Connection Examples to Solid-State Imaging Element of FIG. 33 are Used>

Figure 34:
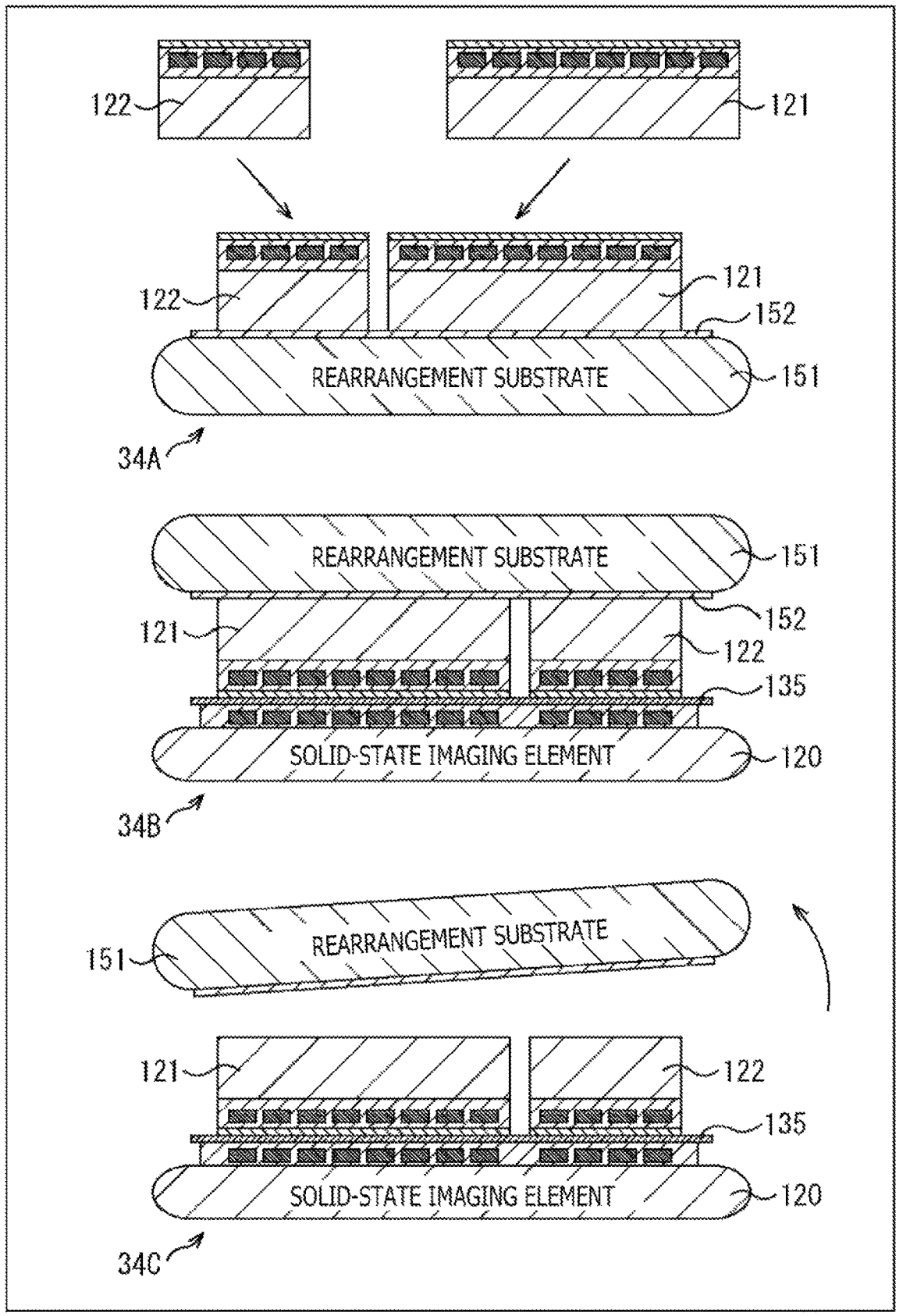
FIG. 34 is a view illustrating a manufacturing method of the solid-state imaging device of FIG. 33.
Figure 35:
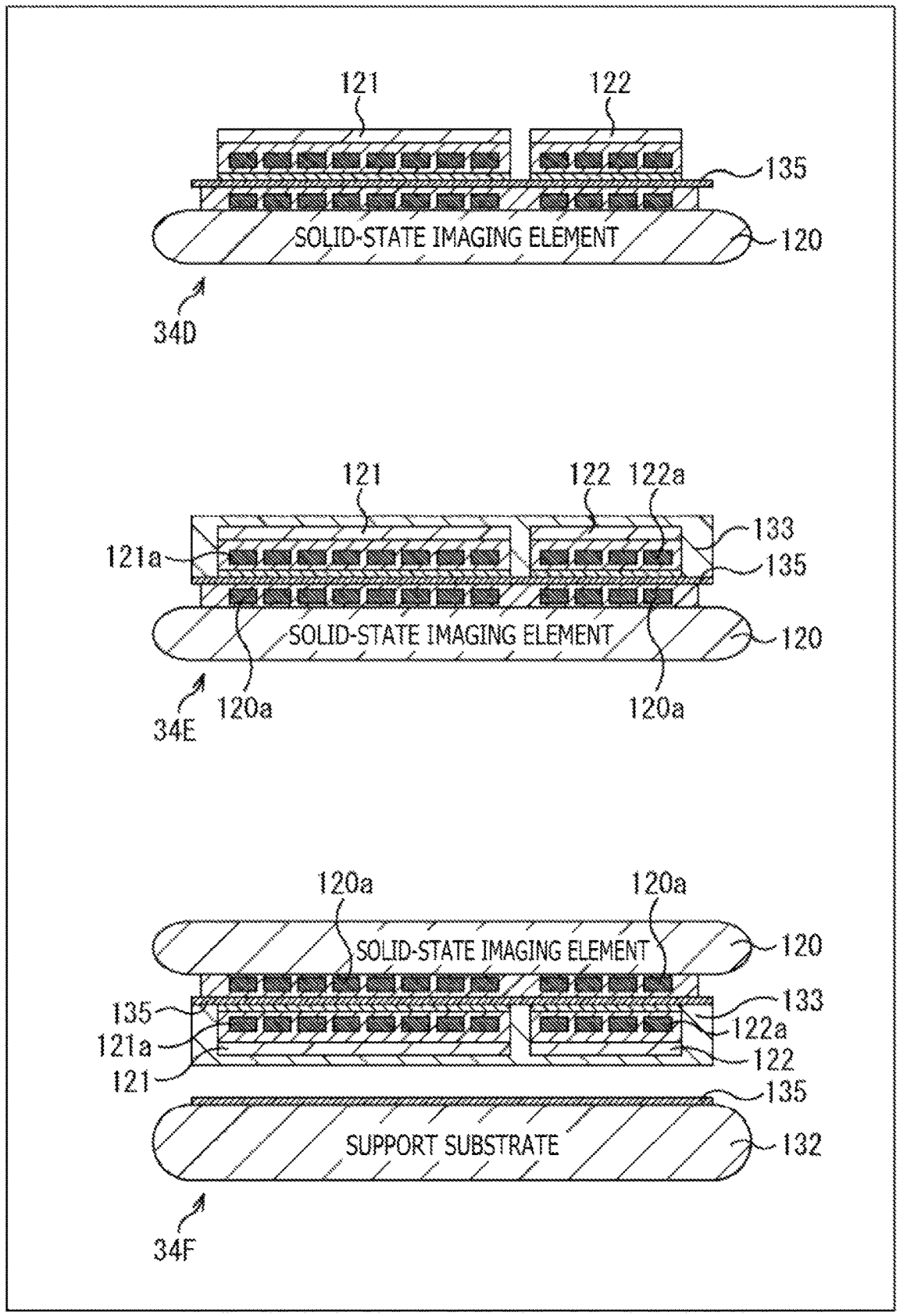
FIG. 35 is a view illustrating the manufacturing method of the solid-state imaging device of FIG. 33.
Figure 36:
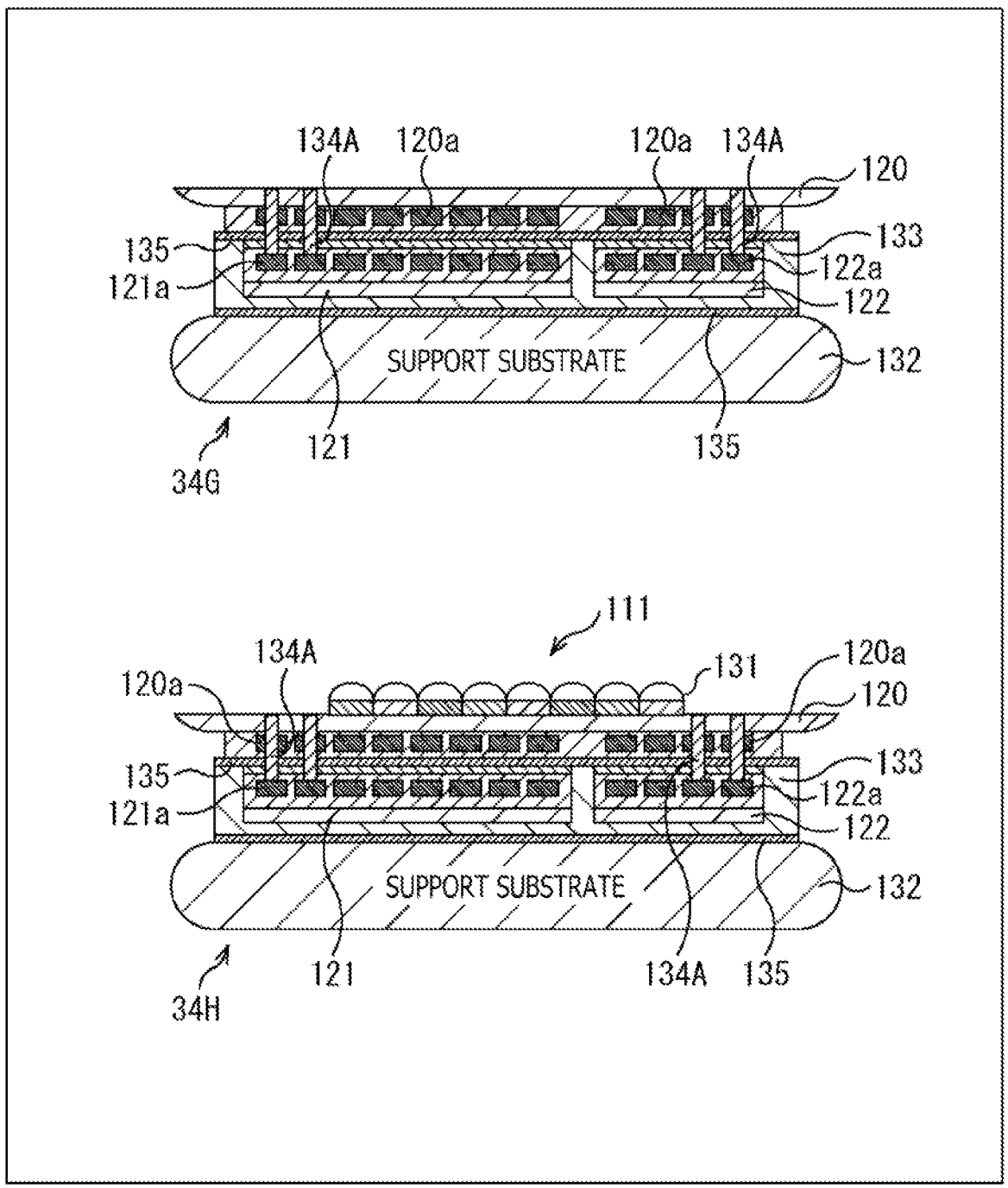
FIG. 36 is a view illustrating the manufacturing method of the solid-state imaging device of FIG. 33.

Now, a manufacturing method of the solid-state imaging device 111 for which the connection examples of FIG. 33 are used is described with reference to FIGS. 34 to 36. It is to be noted that side elevational sectional views 34A to 34H of FIGS. 34 to 36 depict side elevational sectional views of the solid-state imaging device 111. Further, description here is given of the connection example 33A.

At a first step, as depicted by the side elevational sectional view 34A of FIG. 34, after electric inspection is performed, a memory circuit 121 and a logic circuit 122 configured as good products are rearranged on a rearrangement substrate 151 corresponding to a wafer 102. The rearrangement substrate 151 has adhesive 152 applied thereto, and the memory circuit 121 and the logic circuit 122 are rearranged on and fixed to the rearrangement substrate 151 by the adhesive 152. It is to be noted that, after a portion such as an end face or an end point of the memory circuit 121 or the logic circuit 122 is contacted with the solid-state imaging element 120, the other portion of the memory circuit 121 or the logic circuit 122 is gradually contacted, joined and rearranged beginning with a portion near to the contacted portion as described hereinabove with reference to FIG. 22.

At a second step, as depicted by the side elevational sectional view 34B of FIG. 34, upside down is performed such that the upper face of the memory circuit 121 and the logic circuit 122 depicted in the side elevational sectional view 34B now becomes a lower face, and an oxide film joining layer 135 is formed on the solid-state imaging element 120 to achieve oxide film joining.

At a third step, as depicted in the side elevational sectional view 34C of FIG. 34, the rearrangement substrate 151 is debonded, exfoliated and removed together with the adhesive 152.

At a fourth step, as depicted by the side elevational sectional view 34D of FIG. 35, the silicon layer at an upper face portion in the figure of the memory circuit 121 and the logic circuit 122 is thinned to an extent that does not have an influence on the performances of the device.

At a fifth step, as depicted by the side elevational sectional view 34E of FIG. 35, an oxide film 133 that functions as an insulating film is formed such that the chip including the rearranged memory circuit 121 and logic circuit 122 is embedded in the oxide film 133 and is flattened.

At a sixth step, as depicted by the side elevational sectional view 34F of FIG. 35, the configuration depicted in the side elevational sectional view 34F is reversed and an oxide film joining layer 135 is formed on the support substrate 132 to achieve oxide film joining.

At a seventh step, as depicted by the side elevational sectional view 34G of FIG. 36, the silicon layer of the solid-state imaging element 120 is thinned. Further, the terminals 121a of the memory circuit 121 and the terminals 120a of the solid-state imaging element 120 are arranged at a same position in the horizontal direction, and through-vias are formed so as to extend through the terminals 120a and 121a from the front face side such that the terminals 120a and 121a are placed into a skewered state. Then, metal is embedded into the through-vias to form wires 134E.

At an eighth step, as depicted by the side elevational sectional view 34H of FIG. 36, an on-chip lens and on-chip color filter 131 is provided on the solid-state imaging element 120, and singulation is performed to complete the solid-state imaging device 111.

By such steps as described above, the wires 134A are formed by the through-vias formed from the front face side (imaging face side) to establish a state in which the solid-state imaging element 120 and the memory circuit 121 and logic circuit 122 are electrically connected to each other, and the solid-state imaging device 111 is manufactured thereby.

It is to be noted that also the wires 134F to 134H depicted in the connection examples 33B to 33C can be manufactured by similar steps although they are different in terms of the position, depth and number of through-vias.

Also, in such a configuration as described above, since circuit connection between the solid-state imaging element 120 and the memory circuit 121 and logic circuit 122 can be established through terminals formed in a wire density of fine wires by a lithography technique of semiconductors similarly as in the WoW, the number of connection terminals can be increased and reduction of the power consumption can be anticipated.

10. Modification of Example of Connection to Solid-State Imaging Element

<First Modification of Connection Example to Solid-State Imaging Element>

The electric connection between the solid-state imaging element 120 and the memory circuit 121 and logic circuit 122 may be different from the connection examples of FIGS. 29 and 33.

Figure 37:
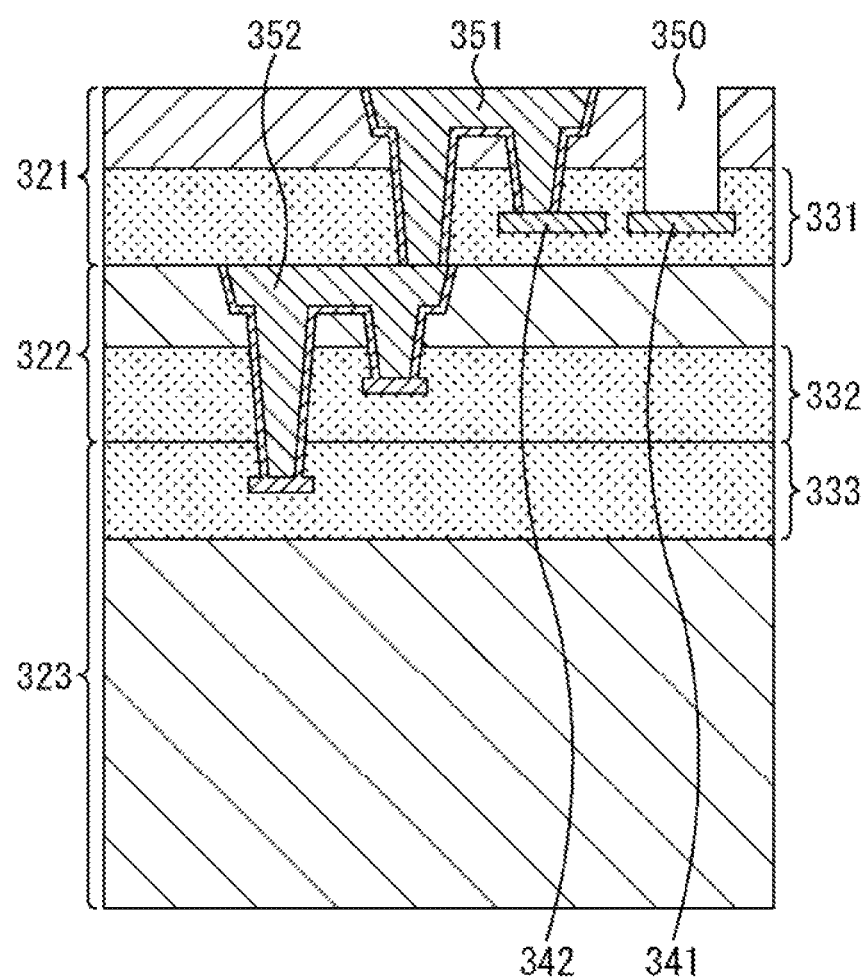
FIG. 37 is a view illustrating a first modification of the connection example to the solid-state imaging element.

FIG. 37 depicts a modification of the electric connection example between the solid-state imaging element 120 and the memory circuit 121 and logic circuit 122 of the solid-state imaging device 111.

In FIG. 37, a first semiconductor substrate 321, a second semiconductor substrate 322 and a third semiconductor substrate 323 are stacked from above, and it is assumed that a solid-state imaging element 120 is formed in the first semiconductor substrate 321 while the memory circuit 121 is formed in the second semiconductor substrate 322 and the logic circuit 122 is formed in the third semiconductor substrate 323. It is to be noted that the substrates in which the memory circuit 121 and the logic circuit 122 are formed may be replaced with each other.

Further, in the first semiconductor substrate 321, the second semiconductor substrate 322, and the third semiconductor substrate 323, multilayer wiring layers 331, 332, and 333 for the solid-state imaging element 120, the memory circuit 121, and the logic circuit 122 are formed, respectively. Further, in FIG. 37, the multilayer wiring layer 332 is directed to the third semiconductor substrate 323, and the multilayer wiring layers 332 and 333 are structured such that they are pasted to each other on the boundary between the second semiconductor substrate 322 and the third semiconductor substrate 323.

Furthermore, pads 341 and 342 for external connection including metal such as, for example, aluminum are provided, and a signal to and from an external apparatus connected through a pad hole 350 is inputted and outputted through a pad 341 connected to the pad 342.

As depicted in FIG. 37, the pad hole 350 is formed in the first semiconductor substrate 321 such that it extends to the pad 341 from the rear face side (light receiving face side) of the first semiconductor substrate 321. Further, the pad 342 is formed in the multilayer wiring layer 331 of the first semiconductor substrate 321.

Further, in the configuration of FIG. 37, a contact 351 used for electric connection between the first semiconductor substrate 321 and the second semiconductor substrate 322 and a contact 352 used for electric connection between the second semiconductor substrate 322 and the third semiconductor substrate 323 are provided. The contact. 351 and the contact 352 are configured as twin contacts.

In particular, for electric connection between the solid-state imaging element 120 and the memory circuit 121 and logic, circuit 122, the twin contacts 351 and 352 may be used as depicted in FIG. 37.

<Second Modification of Connection Example to Solid-State Imaging Element>

Figure 38:
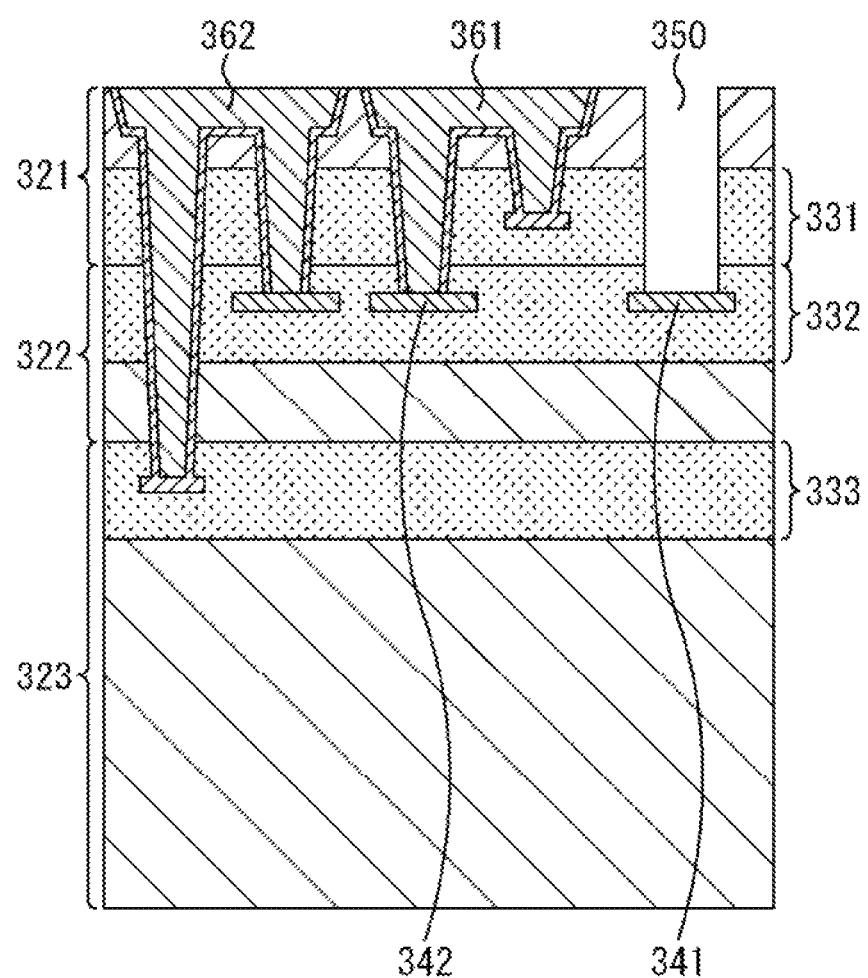
FIG. 38 is a view illustrating second modification of the connection example to the solid-state imaging element.

As depicted in FIG. 38, the multilayer wiring layer 331 of the first semiconductor substrate 321 may be directed to the second semiconductor substrate 322 side (upper side in the figure) such that the multilayer wiring layers 331 and 332 are pasted to each other on the boundary between the first semiconductor substrate 321 and the second semiconductor substrate 322.

In the configuration of FIG. 38, different from that of the case of FIG. 37, the pad 342 is provided in the multilayer wiring layer 332 of the second semiconductor substrate 322. Further, in the first semiconductor substrate 321, the pad hole 350 is formed so as to extend to the pad 341 from the rear face side (light receiving face side) of the first semiconductor substrate 321.

Further, in the configuration of FIG. 38, a contact 361 used for electric connection between the first semiconductor substrate 321 and the second semiconductor substrate 322 and a contact 362 used for electric connection between the second semiconductor substrate 322 and the third semiconductor substrate 323 are provided. The contacts 361 and 362 are configured as twin contacts.

In the case of the configuration of FIG. 38, different from that of the case of FIG. 37, the contact 362 extends through the first semiconductor substrate 321 and the second semiconductor substrate 322 to the multilayer wiring layer 333 of the third semiconductor substrate 323.

In particular, as depicted in FIG. 38, for electric connection between the solid-state imaging element 120 and the memory circuit 121 and logic circuit 122, the twin contacts 361 and 362 may be used.

<Third Modification of Connection Example to Solid-State Imaging Element>

Figure 39:
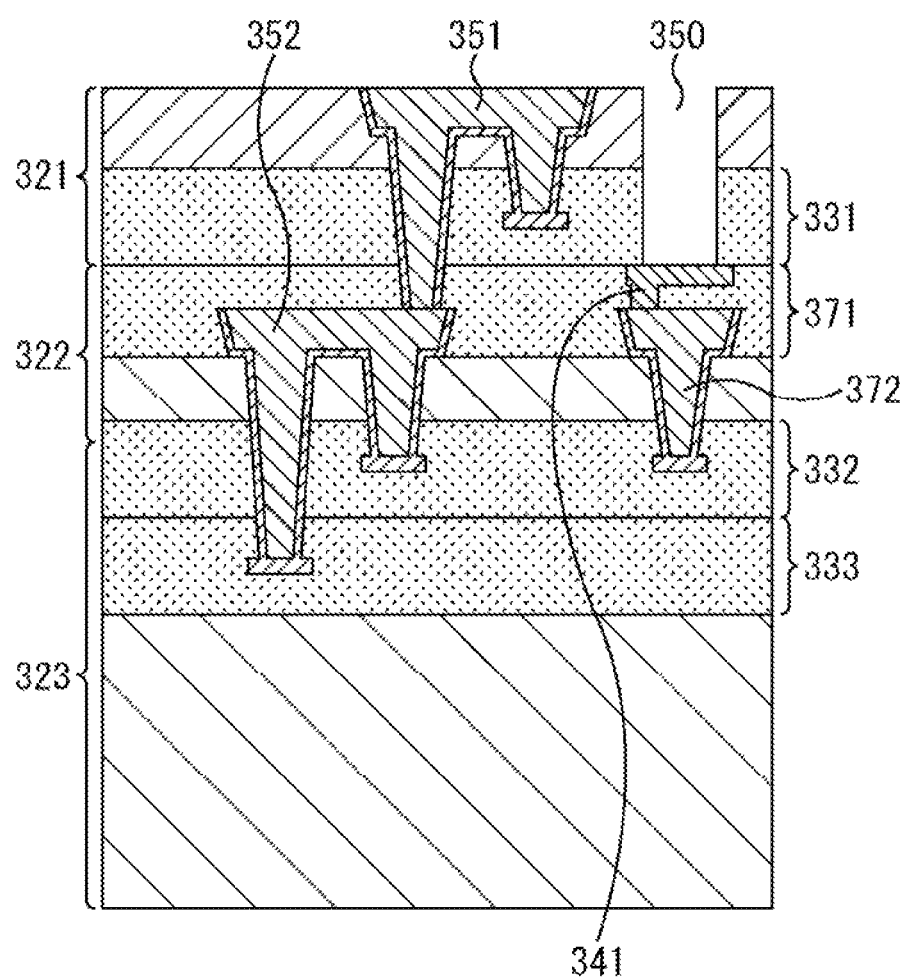
FIG. 39 is a view illustrating a third modification of the connection example the solid-state imaging element.

In the configuration of FIG. 39, the first semiconductor substrate 321 and the second semiconductor substrate 322 are pasted to each other such that an insulating film layer 371 for the second semiconductor substrate 322 is directed to the third semiconductor substrate 323 side (lower side in the figure).

Further, in the configuration of FIG. 39, similarly as in FIG. 37, a contact 351 used for electric connection between the first semiconductor substrate 321 and the second semiconductor substrate 322 and a contact 352 used for electric connection between the second semiconductor substrate 322 and the third semiconductor substrate 323 are provided. The contacts 351 and 352 are configured as twin contacts.

Furthermore, in the configuration of FIG. 39, different from that of the case of FIG. 37, the insulating film layer 371 is formed between the first semiconductor substrate 321 and the second semiconductor substrate 322. Further, the pad 341 is arranged in the insulating film layer 371, and the pad 341 is connected to a contact 372 connected to the multilayer wiring layer 332 of the second semiconductor substrate 322.

Further, in the configuration of FIG. 39, the pad hole 350 is formed in the first semiconductor substrate 321 such that it extends to the pad 341 in the insulating film layer 371 from the rear face side (light receiving face side) of the first semiconductor substrate 321.

In particular, as depicted in FIG. 39, for electric connection between the solid-state imaging element 120 and the memory circuit 121 and logic circuit 122, the twin contacts 351 and 352 may be used. Further, the pad 341 may be configured so as to be connected to the insulating film layer 372 connected to the multilayer wiring layer 332 of the second semiconductor substrate 322.

<Fourth Modification of Connection Example to Solid-State Imaging Element>

Figure 40:
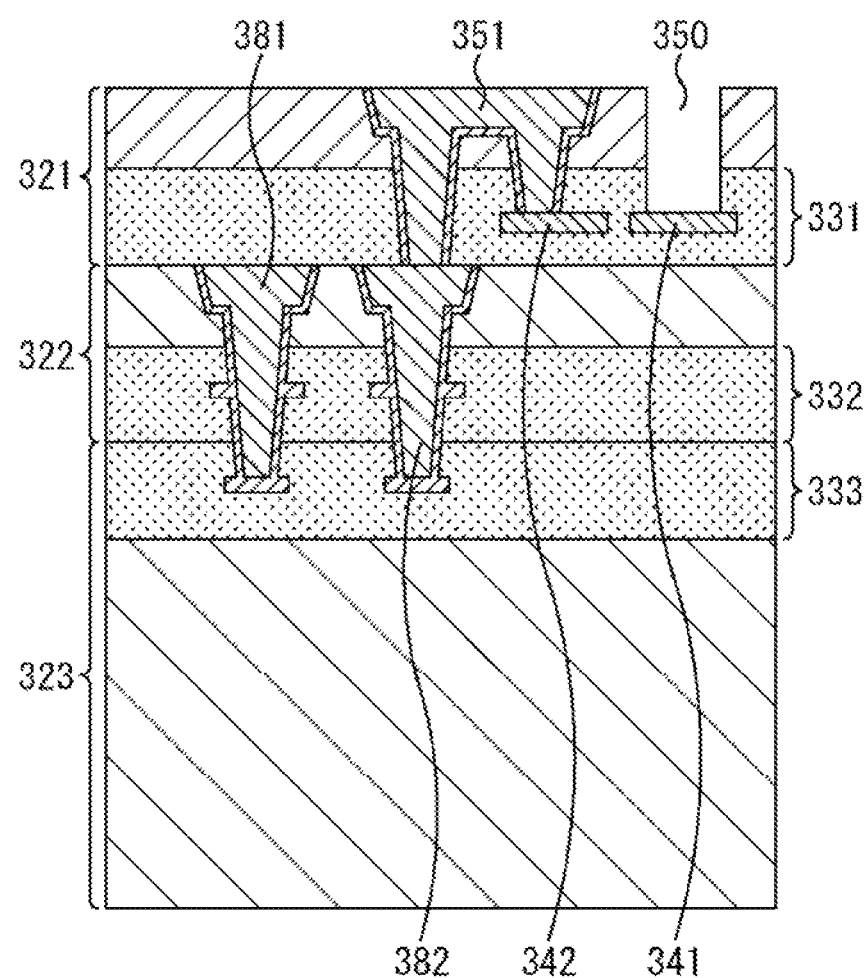
FIG. 40 is a view illustrating a fourth modification of the connection example to the solid-state imaging element.

In the configuration of FIG. 40, similarly as in that of the case of FIG. 37, the pad hole 350 is formed in the first semiconductor substrate 321 such that it extends from the rear face side (light receiving face side) of the first semiconductor substrate 321 to the pad 341. Further, the pad 342 is formed in the multilayer wiring layer 331 of the first semiconductor substrate 321.

In the configuration of FIG. 40, similarly to that in the case of FIG. 37, the first semiconductor substrate 321 and the second semiconductor substrate 322 are pasted to each other such that the multilayer wiring layer 332 of the second semiconductor substrate 322 is directed to the third semiconductor substrate 323 side (lower side in the figure).

Further, in the configuration of FIG. 40, similarly as in the case of FIG. 37, the contact 351 used for electric connection between the first semiconductor substrate 321 and the second semiconductor substrate 322 is provided. The contact 351 is configured as a twin contact.

In the configuration of FIG. 40, different from that of the case of FIG. 37, the contact 352 used for electric connection between the second semiconductor substrate 322 and the third semiconductor substrate 323 is not provided. On the other hand, contacts 331 and 382 used for electric connection between the second semiconductor substrate 322 and the third semiconductor substrate 323 are provided.

Each of the contacts 331 and 382 is formed by providing a through hole that extends through the second semiconductor substrate 322 to the multilayer wiring layer 333 of the third semiconductor substrate 323 and embedding a conductor in the through hole. In particular, each of the contacts 381 and 382 is configured so as to connect the multilayer wiring layer 332 of the second semiconductor substrate 322 and the multilayer wiring layer 333 of the third semiconductor substrate 323 only by providing one through hole.

In short, each of the contacts 381 and 382 is configured as a shared contact.

Also, in the solid-state imaging devices 111 having the configurations described above with reference to FIGS. 37 to 39, a shared contact may be used for electric connection between the first semiconductor substrate 321 and the second semiconductor substrate 322 or for electric connection between the second semiconductor substrate 322 and the third semiconductor substrate 323.

In particular, as depicted in FIG. 40, the twin contact 351 and the contacts 381 and 382 may be used for electric connection between the solid-state imaging element 120 and the memory circuit 121 and logic circuit 122.

<Fifth Modification of Connection Example to Solid-State Imaging Element>

Figure 41:
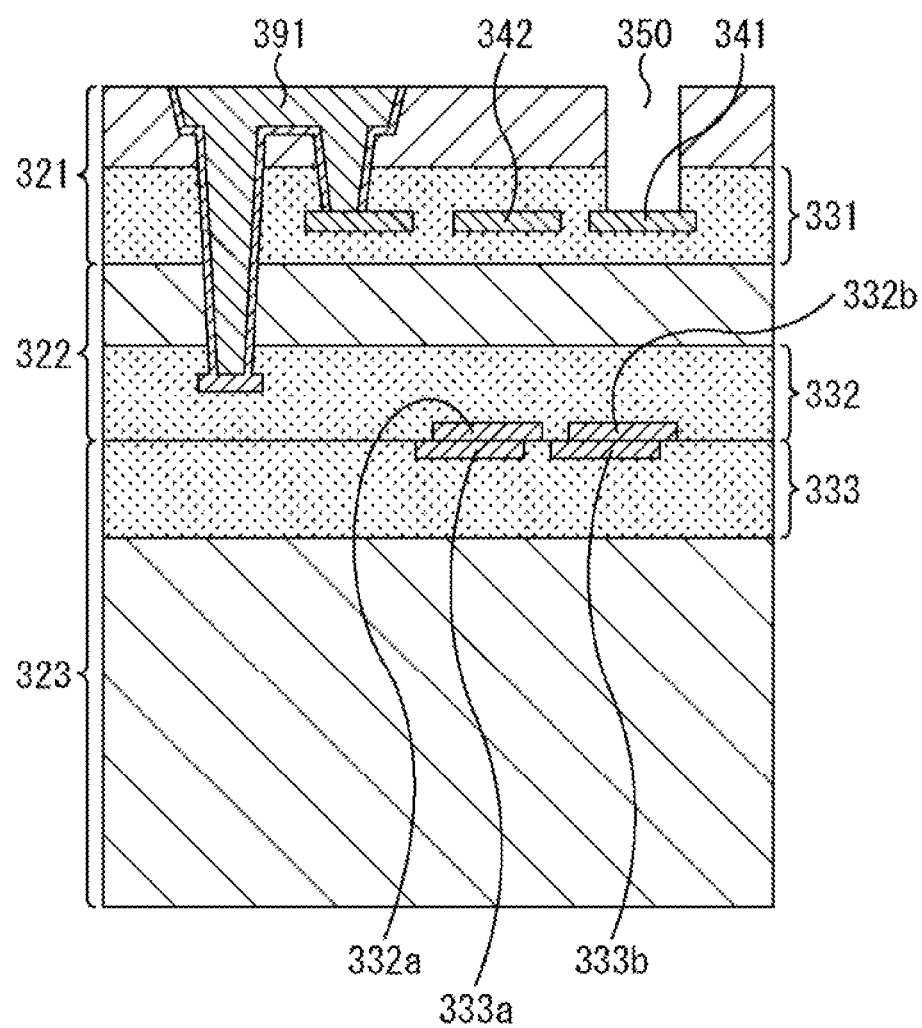
FIG. 41 is a view illustrating a fifth modification of the connection example to the solid-state imaging element.

In the configuration of FIG. 41, similarly as in the case of FIG. 37, the pad hole 350 is formed in the first semiconductor substrate 321 such that it extends to the pad 341 from the rear face side (light receiving face side) of the first semiconductor substrate 321. Further, the pad 342 is formed in the multilayer wiring layer 331 of the first semiconductor substrate 321.

Further, in the configuration of FIG. 41, similarly to that in the case of FIG. 37, the first semiconductor substrate 321 and the second semiconductor substrate 322 are pasted to each other such that the multilayer wiring layer 332 of the second semiconductor substrate 322 is directed to the third semiconductor substrate 323 side (lower side in the figure).

Furthermore, in the configuration of FIG. 41, a contact 391 used for electric connection between the second semiconductor substrate 322 and the third semiconductor substrate 323 is provided. The contact 391 is configured as a twin contact.

Further, in the configuration of FIG. 41, a metal wire 332$a$ in the multilayer wiring layer 332 of the second semiconductor substrate 322 and a metal wire 333$a$ in the multilayer wiring layer 333 of the third semiconductor substrate 323 are joined directly to each other. Furthermore, a metal wire 332$b$ in the multilayer wiring layer 332 and a metal wire 333$b$ in the multilayer wiring layer 333 are joined directly to each other. Consequently, the second semiconductor substrate 322 and the third semiconductor substrate 323 are electrically connected to each other.

In short, in the case of the configuration of FIG. 41, not a contact but direct joining is used for electric connection between the second semiconductor substrate 322 and the third semiconductor substrate 323. Accordingly, the manufacturing step can be simplified and the area on the substrate can be reduced.

In particular, as depicted in FIG. 41, for electric connection between the solid-state imaging element 120 and the memory circuit 121 and logic circuit 122, the twin contact 391 and the metal wires 332$a$, 333$a$ and 332$b$, 333$b$ may be used.

<Modification of Connection Example to Solid-State Imaging Element of Sixth Embodiment>

Figure 42:
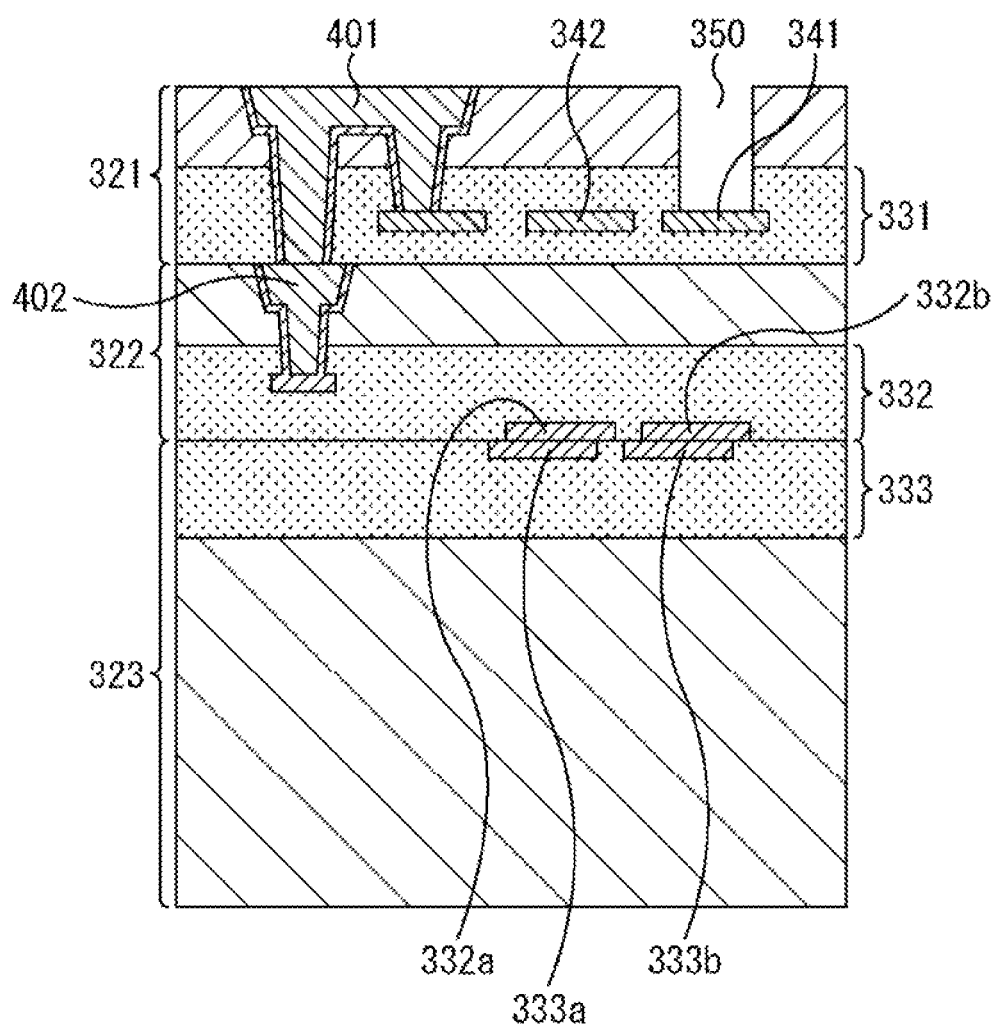
FIG. 42 is a view illustrating a sixth modification of the connection example to the solid-state imaging element.

In the configuration of FIG. 42, different from that of the case of FIG. 41, contacts 401 and 402 used for electric connection between the first semiconductor substrate 321 and the second semiconductor substrate 322 are provided. In particular, in the case of the configuration of FIG. 42, a lower side end portion of the left side in the figure of the contact 401 is connected to an upper side end portion in the figure of the contact 402 to electrically connect the first semiconductor substrate 321 and the second semiconductor substrate 322 to each other. It is to be noted that the contact 401 is configured as a twin contact.

In the configuration of FIG. 42, it is not necessary to provide a hole that extends to the multilayer wiring layer 332 from the light receiving face, for example, as in the formation of the contact 391 of FIG. 41. Therefore, it is possible to perform formation of a contact more simply.

The configuration of the other part in FIG. 42 is similar to that of the case of FIG. 41, and therefore, detailed description of the same is omitted.

In particular, as depicted in FIG. 42, for electric connection between the solid-state imaging element 120 and the memory circuit 121 and logic circuit 122, the twin contacts 401 and 402 and the metal wires 332$a$, 333$a$ and 332$b$, 333$b$ may be used.

11. Heat Dissipation Structure

Since the solid-state imaging element 120 of high picture quality and a high frame rate is likely to generate heat, heat dissipation measures are required. Since the solid-state imaging element 120 performs optical sensing, the surface to be sensed takes in light, and therefore, a lens 431 is arranged at a preceding stage to the solid-state imaging element 120 and a space 432 of air exists as depicted by a side elevational sectional view 43A of FIG. 43.

Heat generated in the solid-state imaging element 120 moves in response to the thermal conductivity of the material. Since the thermal conductivity of the air is approximately 7000 times the thermal conductivity of silicon, almost all of the generated heat is dissipated not through the space 432 of the air but through the material contacting with the solid-state imaging element 120. Accordingly, for example, in such a configuration as depicted in the side elevational sectional view 43A of FIG. 43, heat generated by the solid-state imaging element 120 moves to and is dissipated by the oxide film 133 and logic circuit 122 and the support substrate 132 as indicated by arrow marks.

Figure 43:
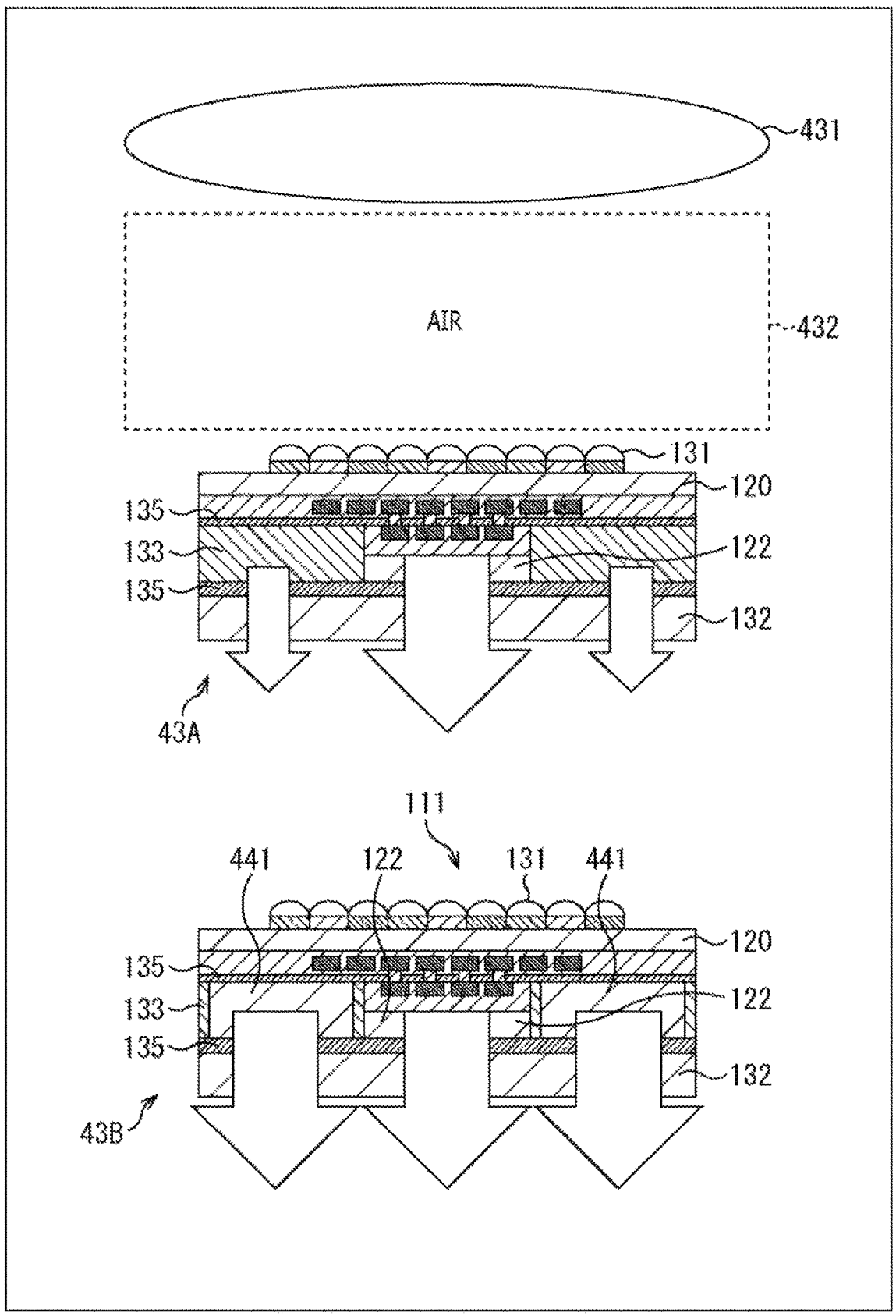
FIG. 43 is a view illustrating a heat dissipation structure of the solid-state imaging device.

As depicted by the side elevational sectional view 43A of FIG. 43, the logic circuit 122 (or memory circuit 121) is covered therearound with the oxide film 133 in order to bury the height for flattening.

Since the thickness of the oxide film joining layer 135 of each substrate is very small, the heat resistance is low. However, the height of the logic circuit 122 (or the memory circuit 121) is great in comparison with the thickness of the oxide film joining layer 135, and the thermal conductivity of the oxide film 133 is lower than that of silicon that is the material of the logic circuit 122 (or the memory circuit 121). Therefore, the heat mobility differs between an area in which the logic circuit 122 (or the memory circuit 121) is connected and another area that is covered with the oxide film 133.

It is to be noted that, in the side elevational sectional view 43A of FIG. 43, a magnitude of an arrow mark represents a magnitude of the heat mobility, and it is represented that, as the arrow mark becomes great, the heat mobility becomes high and the heat dissipation efficiency becomes high. In particular, in the side elevational sectional view 43A of FIG. 43, it is represented that, since the thermal conductivity of the logic circuit 122 (or the memory circuit 121) is higher than that of the oxide film 133, the heat dissipation efficiency of the logic circuit 122 (or the memory circuit 121) is higher.

Therefore, as depicted by the side elevational sectional view 43B of FIG. 43, a dummy circuit 441 including silicon and similar to a member configuring the logic circuit 122 (or the memory circuit 121) may be provided in an area of the oxide film 133 in which the logic circuit 122 (or the memory circuit 121) is not formed. Since the thermal conductivity of silicon configuring the dummy circuit 441 is higher than the thermal conductivity of the oxide film 133, heat dissipation can be performed more efficiently than where heat is dissipated through the oxide film 133 as indicated by arrow marks.

Figure 44:
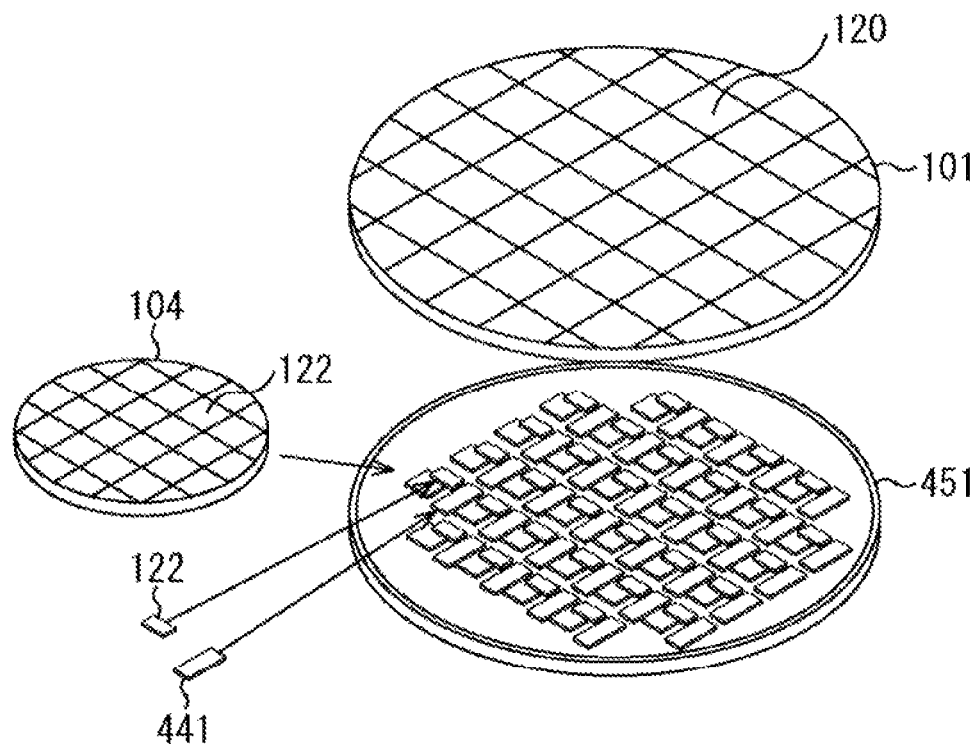
FIG. 44 is a view illustrating a manufacturing method of the solid-state imaging device.

As depicted by the side elevational sectional view 43B of FIG. 43, in the case where the dummy circuit 441 is provided, when the WoW technology is applied for manufacturing, from among logic circuits 122 formed on the wafer 104 by a semiconductor process, those logic circuits 122 that are determined as good products as a result of electric inspection are rearranged on a wafer 451 as depicted in FIG. 44.

Thereupon, on the wafer 451, the dummy circuit 441 is rearranged in advance around the logic circuit 122 (or the memory circuit 121) on the wafer 451 such that such arrangement as depicted by the side elevational sectional view 43A of FIG. 43 is obtained. Then, after the wafer 101 on which the solid-state imaging element 120 is formed by a semiconductor process is positioned and stacked on the wafer 451, it is singulated to complete a solid-state imaging device 111.

<First Modification of Heat Dissipation Structure>

Although the foregoing description is directed to an example in which the dummy circuit 441 is arranged in place of the oxide film 133 around the logic circuit 122 or the memory circuit 121, a dummy wire including metal having a higher thermal conductivity may be included for the dummy circuit 441.

Figure 45:
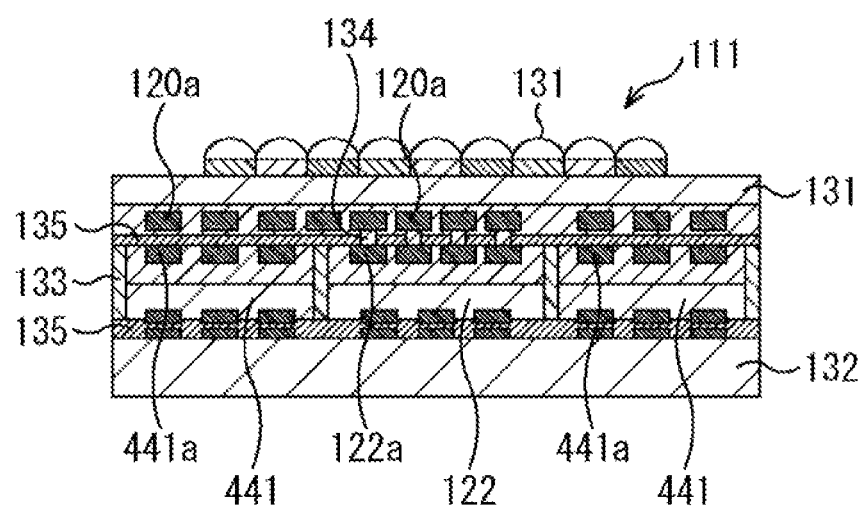
FIG. 45 is a view illustrating a first modification of the heat dissipation structure of the solid-state imaging device.

For example, the dummy circuit 441 may further include a dummy wire 441a as depicted in FIG. 45.

In particular, in the case of FIG. 45, since the dummy wire 441a including a metal having a thermal conductivity higher than that of silicon is included in the dummy circuit 441, heat can be dissipated in a higher efficiency.

<Second Modification of Heat Dissipation Structure>

Although the foregoing description is directed to an example in which the dummy circuit 441 including the dummy wire 441a is provided in place of the oxide film 133 around the logic circuit 122 or the memory circuit 121 to improve the heat dissipation efficiency, a high thermal conductivity material member may be pasted to the rear side of the support substrate 132 to improve the heat dissipation efficiency.

Figure 46:
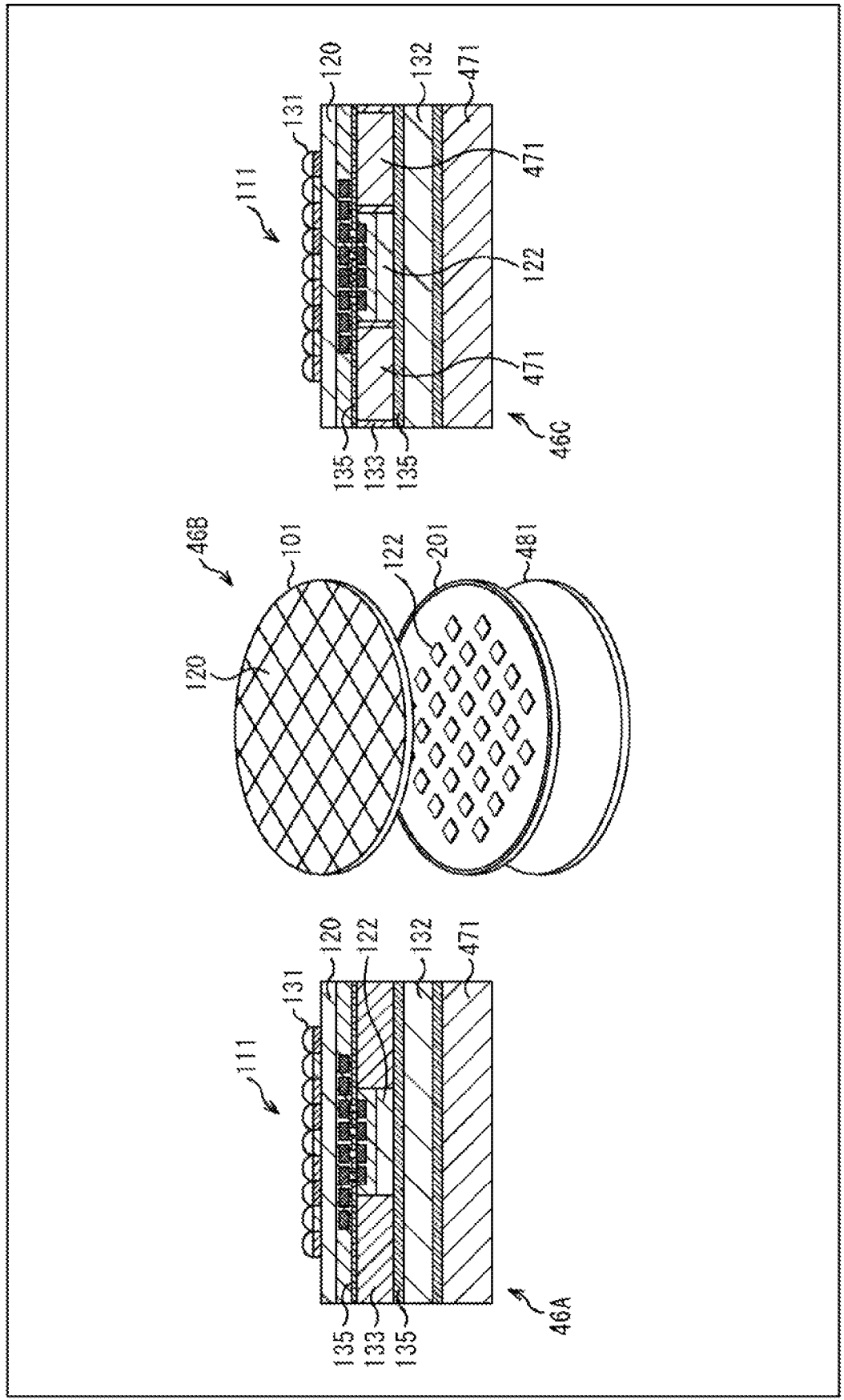
FIG. 46 is a view illustrating a second modification of the heat dissipation structure of the solid-state imaging device.

FIG. 46 depicts an example of a configuration of the solid-state imaging device 111 in which a high thermal conductive material is pasted to the rear side of the support substrate 132.

In particular, as depicted by the side elevational sectional view 46A, a high thermal conductivity material member 471 including a high thermal conductivity material is pasted to the rear side (lower side in the figure) of the support substrate 132. The high thermal conductivity material member 471 is, for example, SiC, AlN, SIN, Cu, Al, C or the like.

In the case where the high thermal conductivity material member 471 is pasted to the rear side of the support substrate 132, when the WoW technology is used for manufacturing, as depicted by the perspective view 46B, a wafer 481 including the high thermal conductivity material member 471 is stacked under the wafer 201 on which, from among logic circuits 122 formed on the wafer 104 by a semiconductor process, those logic circuits 122 that are deemed as good products as a result of electric inspection are rearranged.

In particular, in this case, three wafers including the wafer 101 on which the solid-state imaging elements 120 are formed by a semiconductor process, wafer 201 on which the logic circuits 122 of good products are rearranged and wafer 481 including the high thermal conductivity material member 471 are stacked from above in the figure.

Further, as depicted by the side elevational sectional view 46C of FIG. 46, the high thermal conductivity material member 471 may be formed in a space around the logic circuit 122 and embedded into the oxide film 133.

<Third Modification of Heat Dissipation Structure>

Although the foregoing description is directed to an example in which the high thermal conductivity material member 471 is pasted to the rear side of the support substrate 132 to improve the heat dissipation efficiency, a heat radiation mechanism of the water cooled type may be provided further by providing a waterway for circulating cooling water in the high thermal conductivity material member 471.

Figure 47:
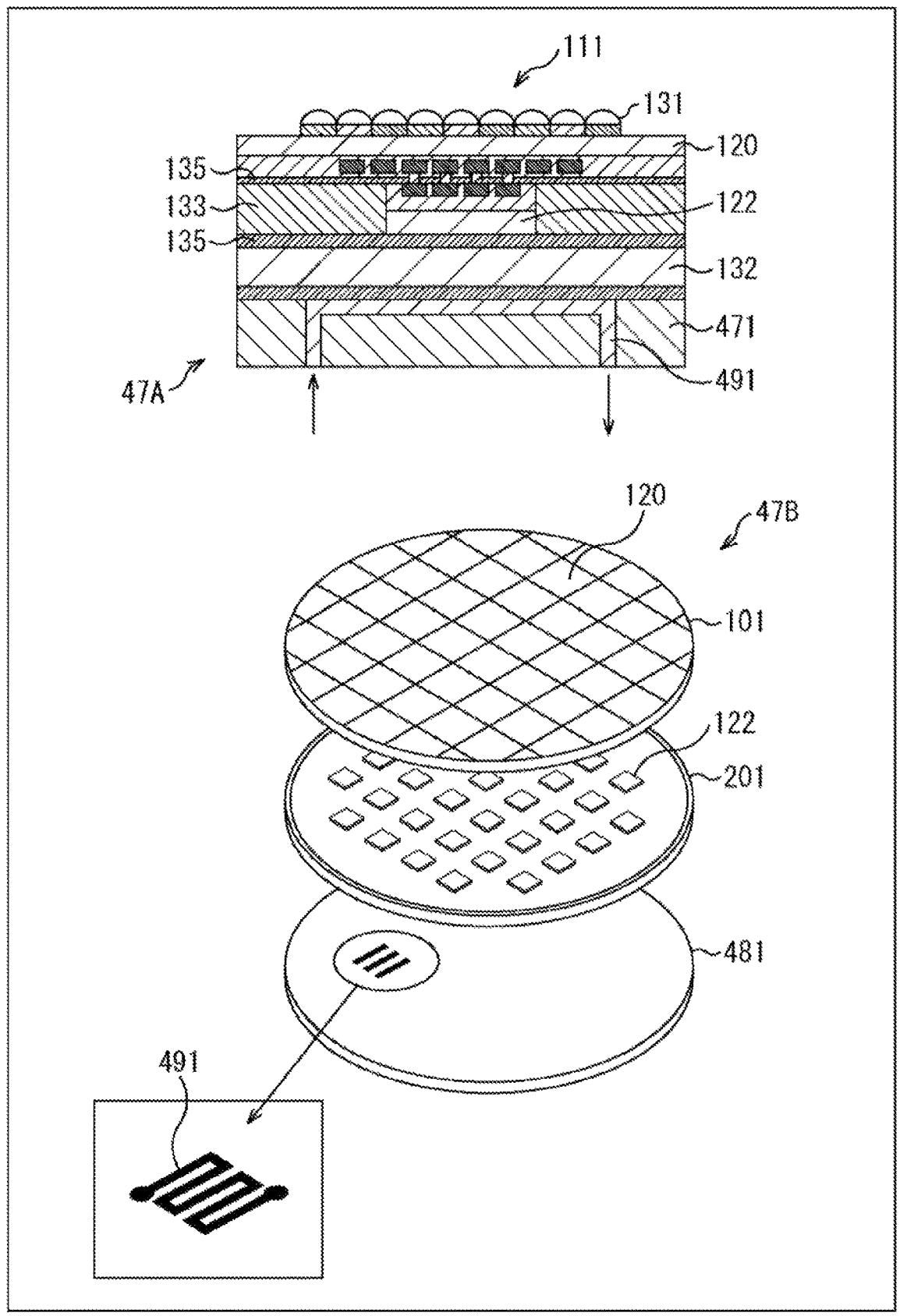
FIG. 47 is a view illustrating a third modification of the heat dissipation structure of the solid-state imaging device.

FIG. 47 depicts an example of a configuration of the solid-state imaging device 111 in which a heat dissipation mechanism of the water cooled type is formed to further improve the heat dissipation efficiency.

In particular, although the solid-state imaging device 111 of FIG. 47 has, as depicted by the side elevational sectional view 47A of FIG. 47, a basic configuration similar to the configuration of the solid-state imaging device 111 described hereinabove with reference to FIG. 46, a waterway 491 for cooling water is further provided in the high thermal conductivity material member 471.

By circulating cooling water in the waterway 491, a heat dissipation mechanism of the water cooled type is formed, and this makes it possible to dissipate heat generated by the solid-state imaging element 120 through the cooling water and dissipate heat more efficiently.

In the case where the heat dissipation mechanism of the water cooled type is provided, as depicted by the perspective view 47B of FIG. 47, the wafers 101 and 201 to be stacked are stacked on the wafer 481 in a state in which the waterway 491 is formed such that it is positioned relative to the solid-state imaging element 120 and the logic circuit 122 of the wafers 101 and 201 to be stacked.

<Fourth Modification of Heat Dissipation Structure>

Figure 48:
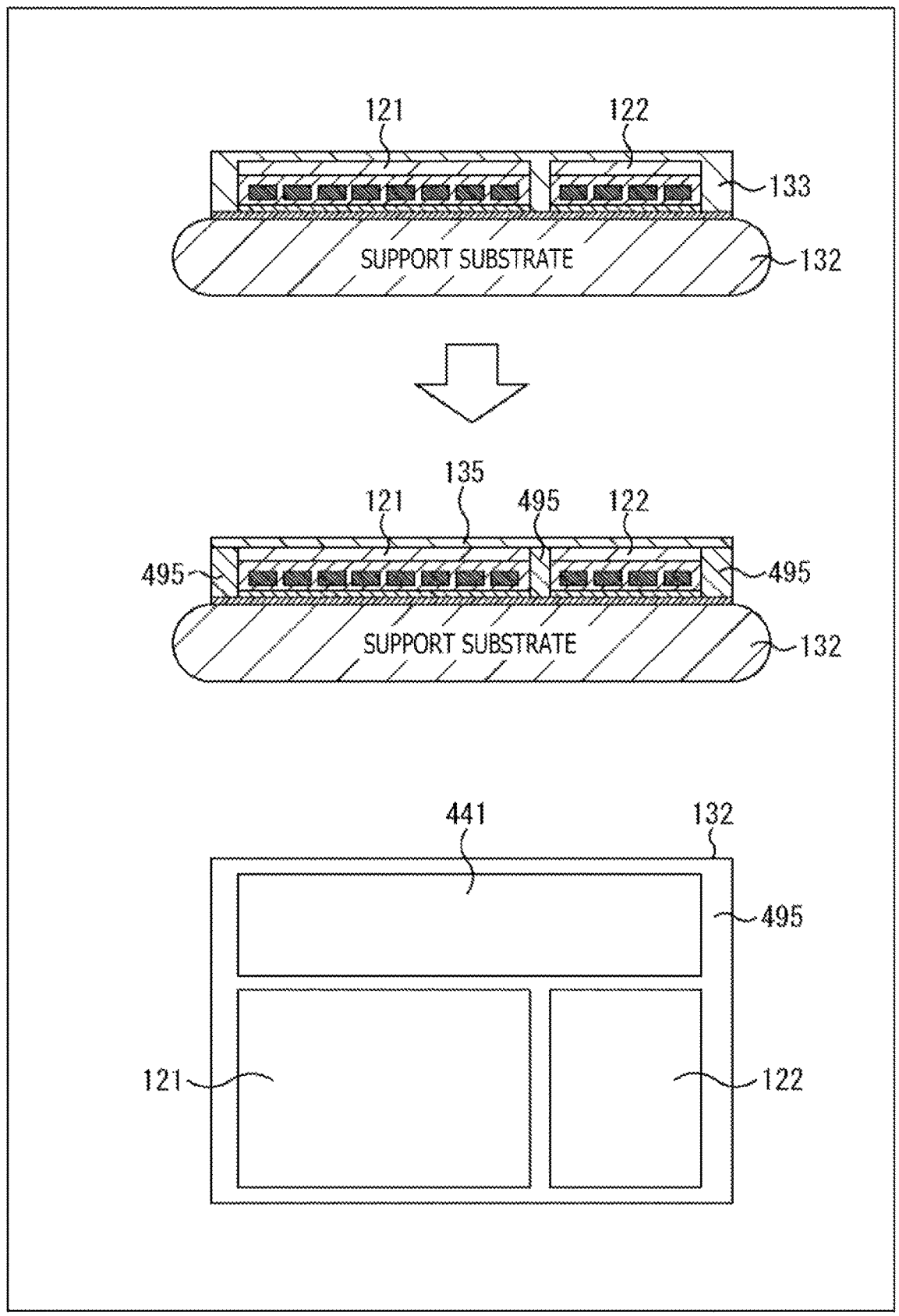
FIG. 48 is a view illustrating a fourth modification of the heat dissipation structure of the solid-state imaging device.

Although the foregoing description is directed to an example in which a region that forms a gap is filled up with the oxide film 133 around the memory circuit 121 and the logic circuit 122 as depicted by the left upper portion of FIG. 48, much time is required to fill up the oxide film 133, and therefore, the process cost increases.

Therefore, a gap in a peripheral portion of the memory circuit 121 and the logic circuit 122 may be filled with an organic material member 495 including an organic material in place of the oxide film 133 as depicted by the right upper portion of FIG. 48 to form a heat dissipation structure.

However, if a peripheral portion of the memory circuit 121 and the logic circuit 122 is filled up with the organic material member 495, then when the oxide film joining layer 135 is formed on the uppermost face, the flatness of the oxide film joining layer 135 is damaged by an influence of heat or warping or swelling is generated by a difference in linear expansion coefficient of the embedded material. Thus, pasting of the support substrate 132 is sometimes disabled.

Therefore, as indicated by the lower portion of FIG. 48, preferably the layout is formed so as to minimize the gap based on the shape of the shape of the memory circuit 121, logic circuit 122 and dummy circuit 441. By performing layout of them so as to minimize the gap in this manner, the amount of use of the organic material member 495 is made to the minimum necessity. Consequently the influence of heat when the oxide film joining layer 135 is formed on the uppermost face and the influence of warping or swelling caused by a difference in linear expansion coefficient of the embedded material can be minimized, and pasting to the support substrate 132 can be implemented.

12. Example of Application to Electronic Equipment

The imaging element described above can be applied to various electronic equipment such as, for example, an imaging apparatus such as a digital still camera or a digital video camera, a portable telephone set having an imaging function or ether equipment having an imaging function.

Figure 49:
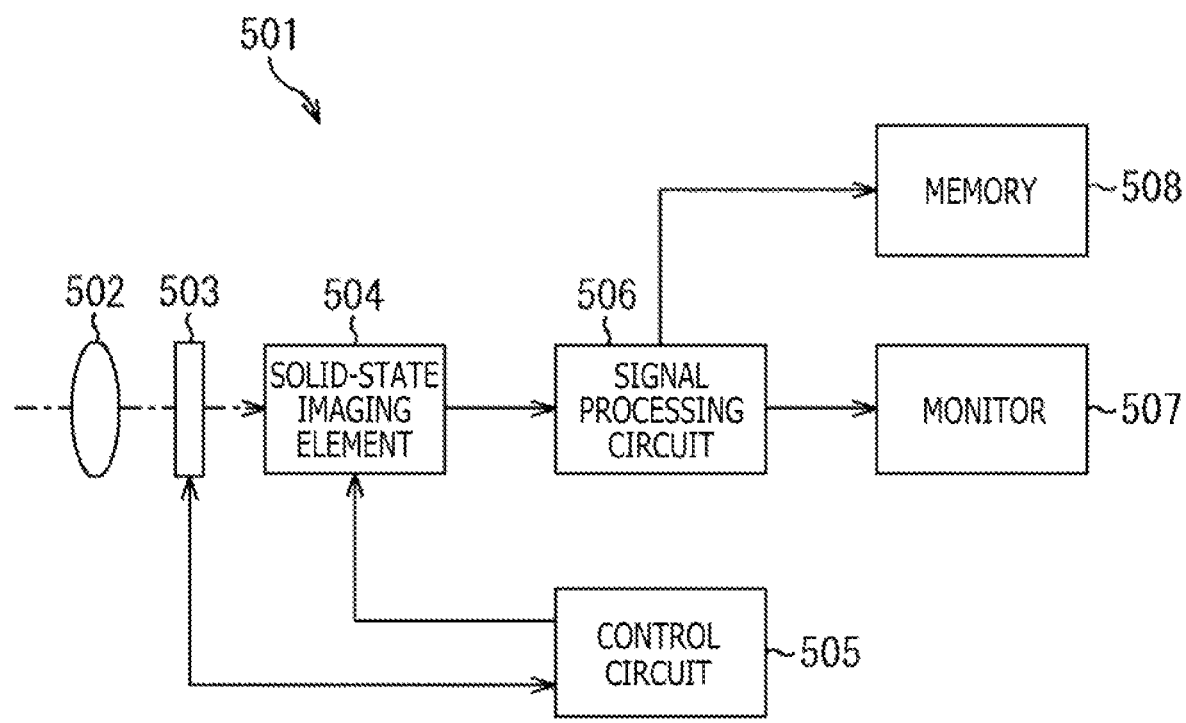
FIG. 49 is a block diagram depicting an example of a configuration of an imaging apparatus as electronic equipment to which the configuration of the imaging apparatus of the present disclosure is applied.

FIG. 49 is a block diagram depicting an example of a configuration of an imaging apparatus as electronic equipment to which the present technology is applied.

The imaging apparatus 501 depicted in FIG. 49 includes an optical system 502, a shutter device 503, a solid-state imaging element 504, a drive circuit 505, a signal processing circuit 506, a monitor 507 and a memory 508 and can capture a still image and a moving image.

The optical system 502 includes one or a plurality of lenses and introduces light (incident light) from an imaging target to the solid-state imaging element 504 such that an image is formed on a light receiving face of the solid-state imaging element 504.

The shutter device 503 is arranged between the optical system 502 and the solid-state imaging element 504 and controls a light irradiation period and a light blocking period to the solid-state imaging element 504 under the control of the drive circuit 505.

The solid-state imaging element 504 includes a package including the solid-state imaging element described hereinabove. The solid-state imaging element 504 accumulates signal charge for a period of time in response to light of an image formed on the light receiving face thereof through the optical system 502 and the shutter device 503. The signal charge accumulated in the solid-state imaging element 504 is transferred in accordance with a driving signal (timing signal) supplied from the drive circuit 505.

The drive circuit 505 outputs driving signals for controlling transfer operation of the solid-state imaging element 504 and shutter operation of the shutter device 503 to drive the solid-state imaging element 504 and the shutter device 503, respectively.

The signal processing circuit 506 performs various signal processes for signal charge outputted from the solid-state imaging element 504. An image (image data) obtained by the signal processes performed by the signal processing circuit 506 is supplied to and displayed on the monitor 507 or is supplied to and stored (recorded) into the memory 508.

Also, in the imaging apparatus 501 configured in this manner, by applying the solid-state imaging device 111 described hereinabove to the optical system 502 and the solid-state imaging element 204, the yield can be improved and the cost required for manufacture can be reduced.

13. Example of Use of Imaging Element

Figure 50:
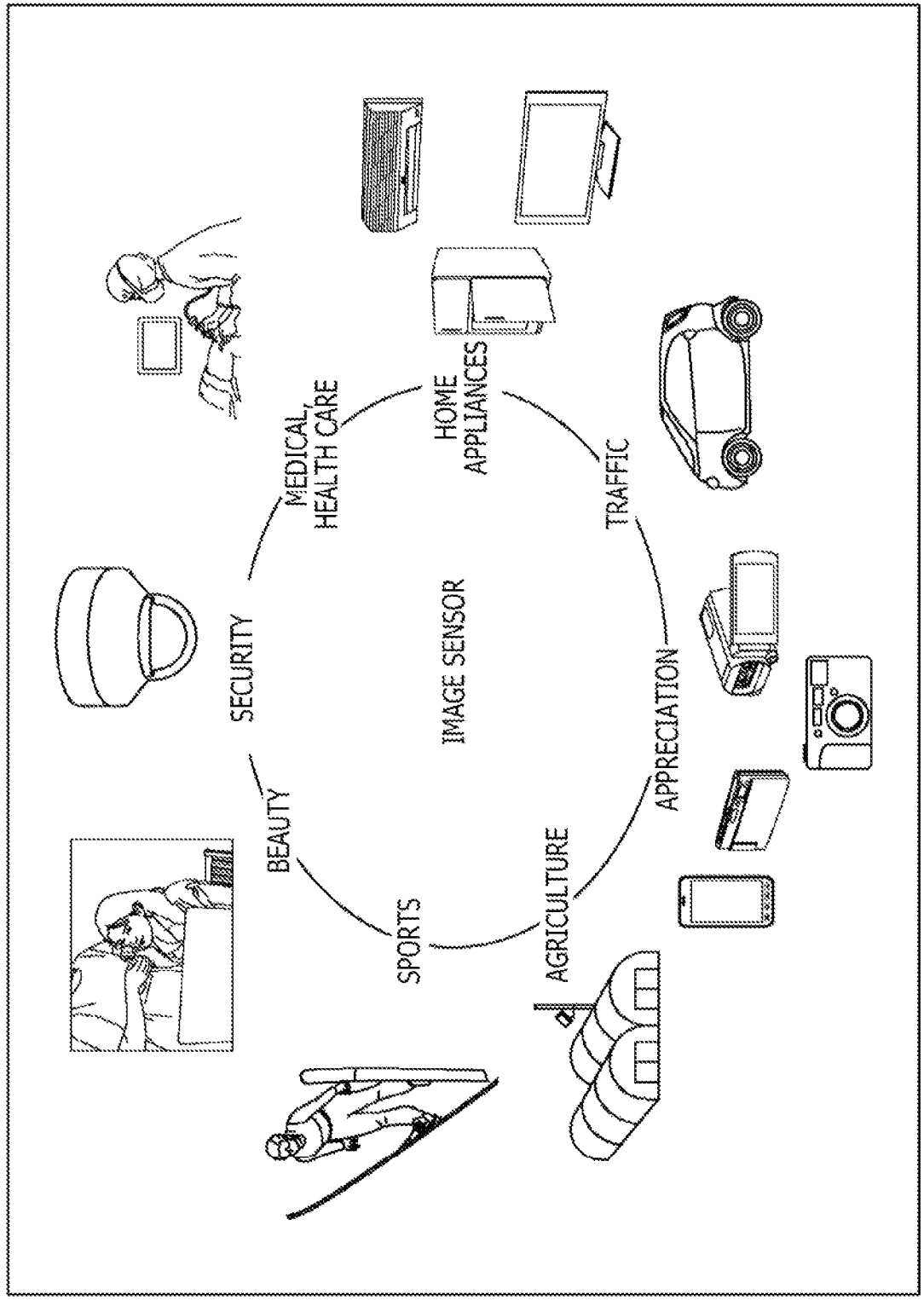
FIG. 50 is a view illustrating an example of use of the imaging apparatus to which the technology of the present disclosure is applied.

FIG. 50 is a view depicting examples of use where the solid-state imaging device 111 described hereinabove is used.

The imaging element described above can be used for various cases in which visible rays, infrared rays, ultraviolet rays, X-rays or the like are used, for example, as described below.

- An apparatus that captures an image to be used for appreciation such as a digital camera, a portable apparatus with a camera function and so forth
- An apparatus used in traffic such as automotive sensors for capturing the front, back, surrounding, inside and so forth of an automobile for safe driving such as automatic stop, recognition of a state of the driver and so forth, surveillance cameras for monitoring a traveling vehicle or a road, distance measurement sensors that perform distance measurement between vehicles and so forth and like sensors
- An apparatus used in home appliances such as a TV, a refrigerator, an air conditioner and so forth in order to image a gesture of a user to perform apparatus operation according to the gesture
- An apparatus for medical use or health care use such as an endoscope, an apparatus for angiography by light reception of infrared rays and so forth
- An apparatus for security use such as surveillance cameras for security applications, cameras for person authentication and so forth
- An apparatus for beauty such as skin measuring instruments for imaging the skin, microscopes for imaging the scalp and so forth
- An apparatus for sports use such as action cameras wearable cameras and so forth for sports applications
- An apparatus for agricultural use such as cameras for monitoring the state of the fields, produces and so forth

14. Example of Application to Endoscopic Surgery System

The technology according to the present disclosure (present technology) can be applied to various products. For example, the technology according to the present disclosure may be applied to an endoscopic surgery system.

Figure 51:
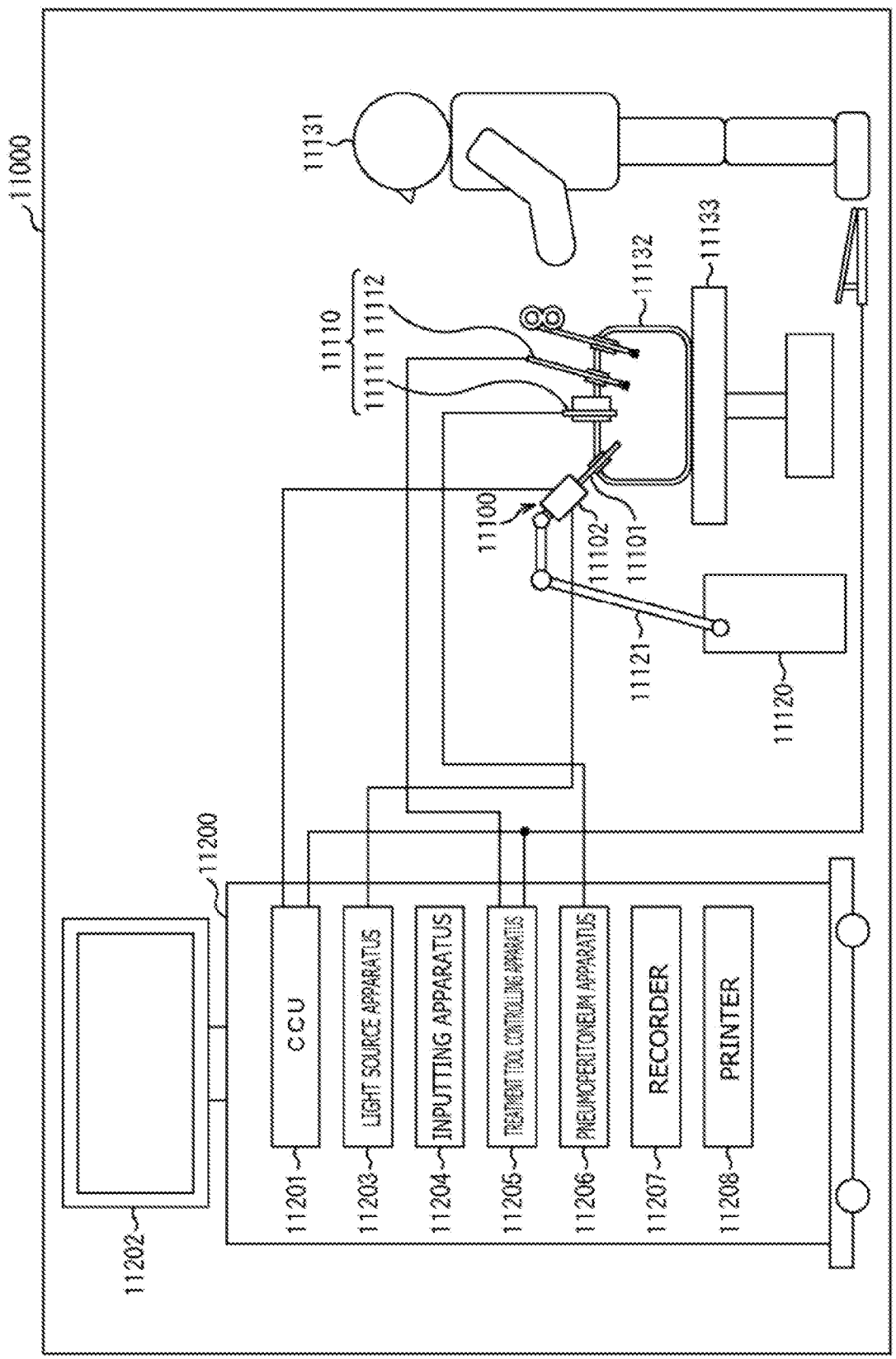
FIG. 51 is a view depicting an example of a schematic configuration of an endoscopic surgery system.

FIG. 51 is a view depicting an example of a schematic configuration of an endoscopic surgery system to which the technology according to an embodiment of the present disclosure (present technology) can be applied.

In FIG. 51, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development, process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11203 is an apparatus capable of printing various kinds of information relating to surgery in various forms such as a text, an image or a graph.

It is to be noted that the light source apparatus 11203 which supplies irradiation light, when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 52:
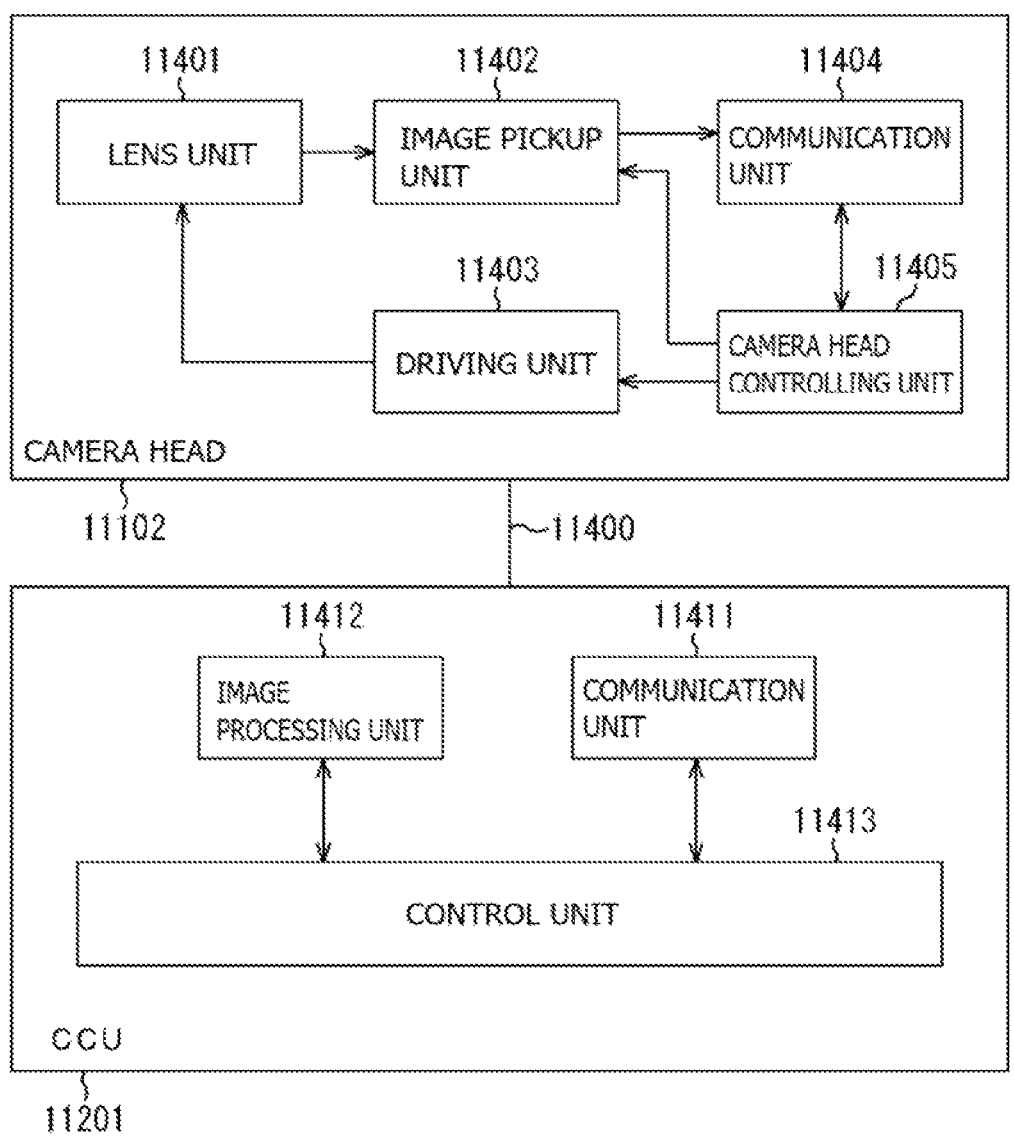
FIG. 52 is a block diagram depicting an example of a functional configuration of a camera head and a camera control unit (CCU).

FIG. 52 is a block diagram depicting an example of a functional configuration of the camera head 11102 and the CCU 11201 depicted in FIG. 51.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 1201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready tor both of electrical and optical communications.

Here, while, in the example depicted, communication is performed by wired communication using the transmission cable 11400, the communication between the camera head 11102 and the CCU 11201 may be performed by wireless communication.

An example of an endoscopic surgery system to which the technology according to the present disclosure can be applied has been described. The technology according to the present disclosure can be applied to the endoscope 11100, (image pickup unit 11402 of the) camera head 11102, and so forth among the components described hereinabove. In particular, the solid-state imaging device 111 of the present disclosure can be applied to the image pickup unit 10402. By applying the technology of the present disclosure to the endoscope 11100, (image pickup unit 11402 of the) camera head 11102 or the like, it is possible to improve the yield and reduce the cost required for manufacture.

It is to be noted here that, although the endoscopic surgery system has been described as an example, the technology according to the present disclosure may be further applied, for example, to a microscopic surgery system or the like.

15. Example of Application to Mobile Body

The technology according to the present disclosure (present technology) can be applied to various products. For example, the technology according to the present disclosure may be implemented as an apparatus incorporated in a mobile body of any type such as, for example, an automobile, an electric vehicle, a hybrid electric vehicle, a motorcycle, a bicycle, a personal mobility, an airplane, a drone, a ship, a robot and so forth.

Figure 53:
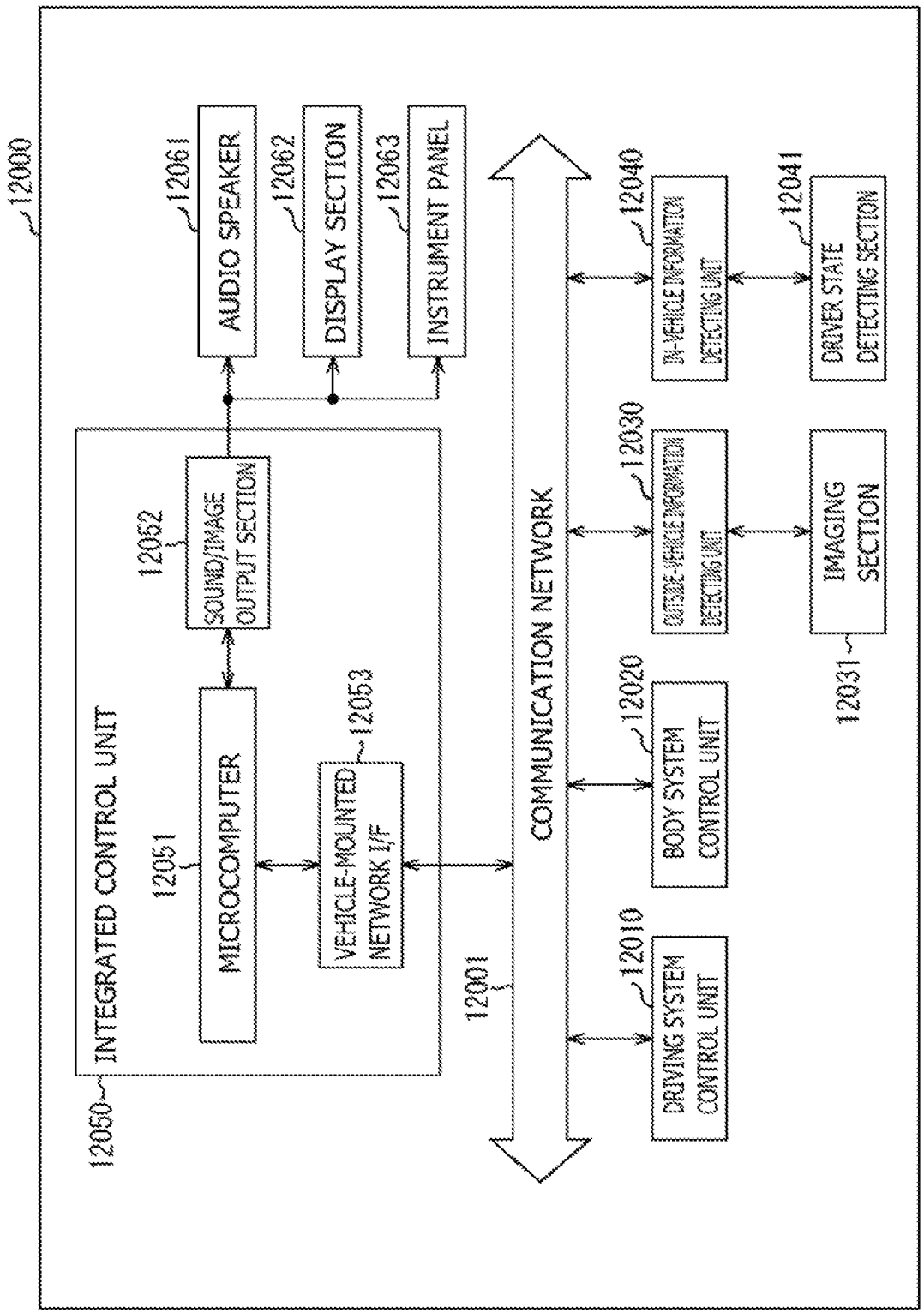
FIG. 53 is a block diagram depicting an example of schematic configuration of a vehicle control system.

FIG. 53 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 53, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 53, an audio speaker 12061, a display section 12062, and an instrument panel 12063 are illustrated as the output device. The display section 12062 may, for example, include at least one of an on-board display and a head-up display.

Figure 54:
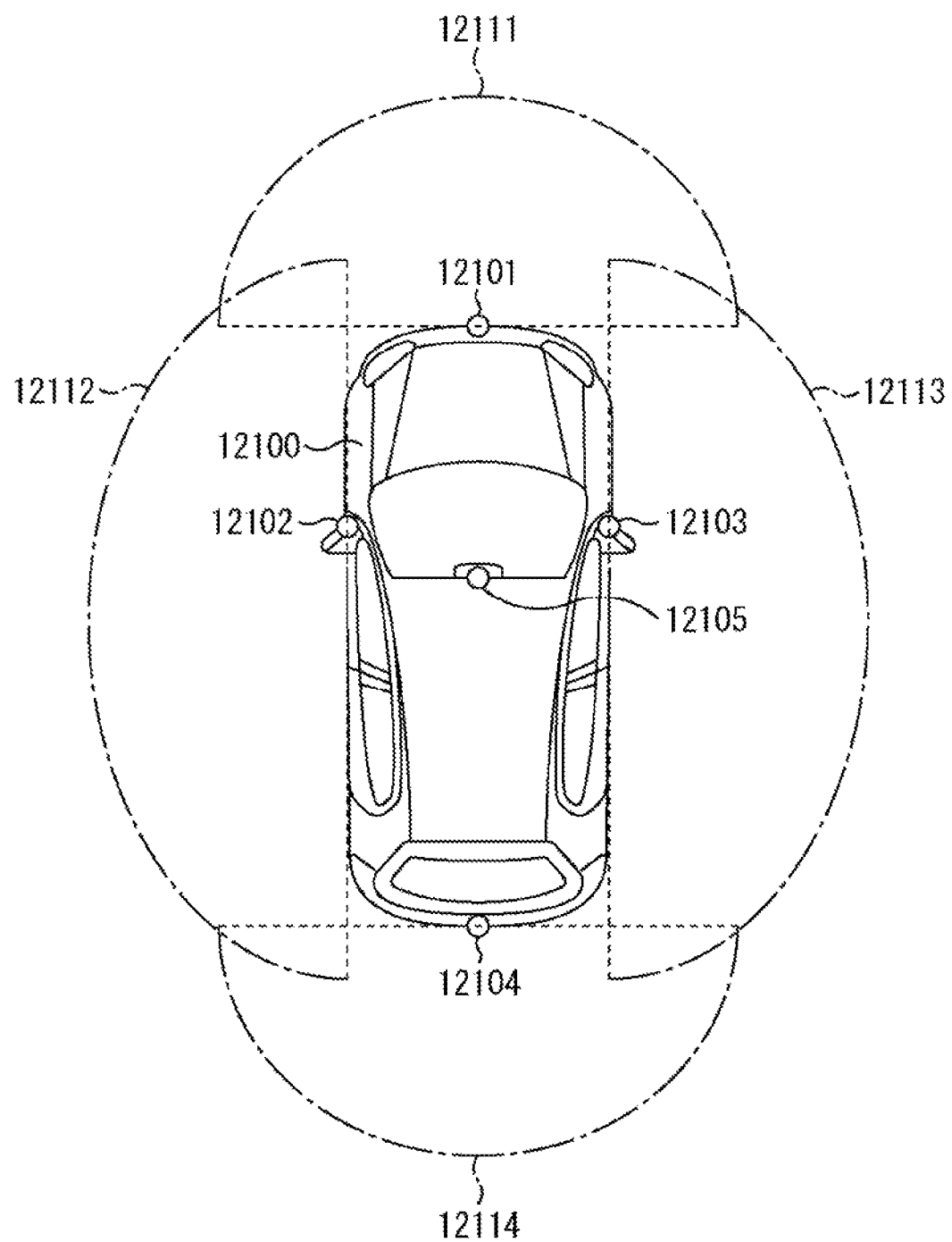
FIG. 54 is a diagram of assistance in explaining an example of installation positions of an outside-vehicle information detecting section and an imaging section.

FIG. 54 is a diagram depicting an example of the installation position of the imaging section 12031.

In FIG. 54, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 54 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle control system to which the technology according to the present disclosure can be applied has been described. The technology according to the present disclosure can be applied, for example, to the imaging section 12031 and so forth from among the components described above. In particular, the solid-state imaging device 111 of the present disclosure can be applied to the imaging section 12031. By applying the technology according to the present disclosure to the imaging section 12031, it is possible to improve the yield and reduce the cost required for manufacture.

The technology according to the present disclosure can be applied to such a solid-state imaging device as described above.

It is to be noted that the present disclosure can have such configurations as described below.

<1> A backside illumination type solid-state imaging device including:
　a first, semiconductor element including an imaging element configured to generate a pixel signal in a unit of a pixel;
　a second semiconductor element in which signal processing circuits necessary for signal processing of the pixel signal are embedded by an embedding member; and
　a wire that electrically connects the first semiconductor element and the second semiconductor element;
　the first semiconductor element and the second semiconductor element being stacked by oxide film joining.

<2> The backside illumination type solid-state imaging device according to <1>, in which
　the first semiconductor element is greater than the second semiconductor element.

<3> The backside illumination type solid-state imaging device according to <1>, in which
　the first semiconductor element is smaller than the second semiconductor element.

<4> The backside illumination type solid-state imaging device according to any one of <1> to <3>, in which
　the signal processing circuits include a first signal processing circuit and a second signal processing circuit, and
　the second semiconductor element has therein the first signal processing circuit and the second signal processing circuit arranged in a juxtaposed relation in a horizontal direction and embedded by the embedding member.

<5> The backside illumination type solid-state imaging device according to any one of <1> to <4>, in which
　the signal processing circuits include a first signal processing circuit and a second signal processing circuit,
　the wire includes a first wire and a second wire,
　the second semiconductor element has therein the first signal processing circuit embedded by the embedding member,
　the solid-state imaging device includes a third semiconductor element in which the second signal processing circuit is embedded by the embedding member,
　the first wire electrically connects the first semiconductor element and the second semiconductor element to each other,
　the second wire electrically connects the second semiconductor element and the third semiconductor element to each other, and
　the second semiconductor element and the third semiconductor element are stacked by oxide film joining.

<6> The backside illumination type solid-state imaging device according to any one of <1> to <5>, in which
　the wire is joined by CuCu joining.

<7> The backside illumination type solid-state imaging device according to any one of <1> to <5>, in which
　the wire electrically connects the first semiconductor element and the second semiconductor element through a through-via.

<8> The backside illumination type solid-state imaging device according to <7>, in which the wire electrically connects the first semiconductor element and the second semiconductor element through a through-via formed from an imaging face side of the imaging element.

<9> The backside illumination type solid-state imaging device according to <7>, in which
the wire electrically connects the first semiconductor element and the second semiconductor element through a through-via formed from a face on an opposite side to an imaging face of the imaging element.

<10> The backside illumination type solid-state imaging device according to any one of <1> to <9>, in which
the embedding member includes an oxide film.

<11> The backside illumination type solid-state imaging device according to any one of <1> to <9>, in which
the embedding member includes an organic material.

<12> The backside illumination type solid-state imaging device according to <11>, in which,
in the second semiconductor element, the signal processing circuits are laid out such that a gap between the signal processing circuits is minimized, and the gap is filled with the embedding member including the organic material.

<13> The backside illumination type solid-state imaging device according to any one of <1> to <12>, in which,
in the second semiconductor element, in addition to the signal processing circuits, a dummy circuit configured from a semiconductor element and including a dummy wire is embedded by the embedding member.

<14> The backside illumination type solid-state imaging device according to any one of <1> to <13>, in which
a heat dissipation member that includes a member having a thermal conductivity higher than a predetermined thermal conductivity and dissipates heat is stacked on a face of the second semiconductor element opposite to a face on which the first semiconductor element is stacked.

<15> The backside illumination type solid-state imaging device according to <14>, in which
the heat dissipation member includes Sic, AlN, SIN, Cu, Al, and C.

<16> The backside illumination type solid-state imaging device according to <14>, in which
the heat dissipation member includes a waterway for circulating cooling water.

<17> The backside illumination type solid-state imaging device according to any one of <1> to <16>, in which
the signal processing circuits include a logic circuit, a memory circuit, a power supply circuit, an image signal compression circuit, a clock circuit, and an optical communication conversion circuit.

<18> The backside illumination type solid-state imaging device according to any one of <1> to <17>, in which
the signal processing circuits are embedded in the first semiconductor element, by the embedding member.

<19> The backside illumination type solid-state imaging device according to <18>, in which
the signal processing circuits are each embedded by the embedding member after contacted at part, thereof in a positioned state with the first semiconductor element and gradually joined to the first semiconductor element beginning with a portion around the contacted portion.

<20> The backside illumination type solid-state imaging device according to <19>, in which
the part includes an end side and an end point of the signal processing circuit.

<21> The backside illumination type solid-state imaging device according to <19>, in which
the signal processing circuit is smaller than the first semiconductor element.

<22> The backside illumination type solid-state imaging device according to any one of <1> to <17>, in which
the signal processing circuits are each embedded by the embedding member after contacted at part, thereof in a positioned state with the second semiconductor element and gradually joined to the second semiconductor element beginning with a portion around the contacted portion.

<23> The backside illumination type solid-state imaging device according to <22>, in which
the part includes an end side and an end point of the signal processing circuit.

<24> A manufacturing method for a backside illumination type solid-state imaging device that includes
a first semiconductor element including an imaging element configured to generate a pixel signal in a unit of a pixel,
a second semiconductor element in which signal processing circuits necessary for signal processing of the pixel signal are embedded by an embedding member, and
a wire that electrically connects the first semiconductor element and the second semiconductor element,
the first semiconductor element and the second semiconductor element being stacked by oxide film joining, wherein
a first wafer including the imaging element formed by a semiconductor process and
a second wafer in which the signal processing circuit decided as a good product by electric inspection from among the signal processing circuits formed by a semiconductor process is rearranged and embedded by the embedding member
are stacked by oxide film joining such that the wire between the first semiconductor element and the second semiconductor element is electrically connected and then are singulated.

<25> An imaging apparatus including:
a backside illumination type solid-state imaging device that includes
a first semiconductor element including an imaging element configured to generate a pixel signal in a unit of a pixel,
a second semiconductor element in which signal processing circuits necessary for signal processing of the pixel signal are embedded by an embedding member, and
a wire that electrically connects the first semiconductor element and the second semiconductor element,
the first semiconductor element and the second semiconductor element being stacked by oxide film joining.

<26> Electronic equipment including:
a backside illumination type solid-state imaging device that includes
a first semiconductor element including an imaging element configured to generate a pixel signal in a unit of a pixel,
a second semiconductor element in which signal processing circuits necessary for signal processing of the pixel signal are embedded by an embedding member, and
a wire that electrically connects the first semiconductor element and the second semiconductor element, the first semiconductor element and the second semiconductor element being stacked by oxide film joining.

REFERENCE SIGNS LIST 101 to 104 Wafer, 111 Solid-state imaging device, 120 Solid-state imaging element, 120a Terminal, 121 Memory circuit, 121a, 121a-1, 121a-2 Terminal, 122 Logic circuit, 122a Terminal, 131 On-chip lens and on-chip color filter, 132 Support substrate, 133 Oxide film, 134, 134-1, 134-2, 134A to 134H Wire, 135 Oxide film joining layer, 151 Rearrangement substrate, 152 Adhesive, 161, 171 Support, substrate, 321 First semiconductor substrate 322 Second semiconductor substrate, 323 Third semiconductor substrate, 331 to 333 Multilayer wiring layer, 351, 352, 361, 362, 372, 381, 382, 391, 401, 402 Contact, 441 Dummy circuit, 441a Dummy wire, 471 High thermal conductivity material member, 491 Waterway, 495 Organic material member

What is claimed is:

1. A semiconductor device comprising:
   a first section including:
   a first semiconductor element including a first semiconductor substrate and a first multilayer wiring layer; and
   a second section including:
   a second semiconductor element including a second semiconductor substrate and a second multilayer wiring layer; and
   a third semiconductor element including a third semiconductor substrate and a third multilayer wiring layer,
   wherein the first semiconductor element and the second semiconductor element are bonded together such that the first multilayer wiring layer and the second multilayer wiring layer face each other,
   wherein the first semiconductor element and the third semiconductor element are bonded together such that the first multilayer wiring layer and the third multilayer wiring layer face each other,
   wherein a size of the first semiconductor element is larger than a size of the second semiconductor element and a size of the third semiconductor element,
   wherein the size of the second semiconductor element is larger than the size of the third semiconductor element,
   wherein a center point of each of the first semiconductor element, the second semiconductor element and the third semiconductor element is aligned,
   wherein the first, second, and third multilayer wiring layers include a plurality of terminals,
   wherein the plurality of terminals of the first and second multilayer wiring layers are directly bonded,
   wherein the plurality of terminals of the first and third multilayer wiring layers are directly bonded, and
   wherein the first semiconductor element is disposed between the second and third semiconductor elements.

2. The semiconductor device according to claim 1, wherein the first semiconductor element is larger than the second semiconductor element.

3. The semiconductor device according to claim 1, wherein the first semiconductor element is smaller than the second semiconductor element.

4. The semiconductor device according to claim 1, wherein signal processing circuits necessary for signal processing of a pixel signal are embedded by an embedding member, wherein the signal processing circuits are laid out such that a gap between the signal processing circuits is minimized, and the gap is filled with the embedding member, wherein the signal processing circuits include a first signal processing circuit and a second signal processing circuit, and wherein the second semiconductor element has therein the first signal processing circuit and the second signal processing circuit arranged in a juxtaposed relation in a horizontal direction and embedded by the embedding member.

5. The semiconductor device according to claim 1, further comprising:
   a first terminal on the first semiconductor element connected by a wire to a second terminal on the second semiconductor element, wherein the wire electrically connects the first semiconductor element and the second semiconductor element through a through-via,
   wherein the first semiconductor element and the second semiconductor element are stacked by oxide film joining.

6. The semiconductor device according to claim 5, wherein the wire is joined by CuCu joining.

7. The semiconductor device according to claim 5, wherein the wire electrically connects the first semiconductor element and the second semiconductor element through the through-via formed from an imaging face side of the semiconductor device.

8. The semiconductor device according to claim 5, wherein the wire electrically connects the first semiconductor element and the second semiconductor element through the through-via formed from a face on an opposite side to an imaging face of the semiconductor device.

9. The semiconductor device according to claim 4, wherein the embedding member includes an oxide film.

10. The semiconductor device according to claim 4, wherein the embedding member includes an organic material.

11. The semiconductor device according to claim 4, wherein the second semiconductor element includes a dummy circuit configured from a semiconductor element and includes a dummy wire embedded by the embedding member.

12. The semiconductor device according to claim 1,
    wherein a heat dissipation member that includes a member having a thermal conductivity higher than a predetermined thermal conductivity and dissipates heat is stacked on a face of the second semiconductor element opposite to a face on which the first semiconductor element is stacked.

13. The semiconductor device according to claim 12, wherein the heat dissipation member includes SiC, AlN, SIN, Cu, Al, and C.

14. The semiconductor device according to claim 12, wherein the heat dissipation member includes a waterway for circulating cooling water.

15. The semiconductor device according to claim 4,
    wherein the signal processing circuits include a logic circuit, a memory circuit, a power supply circuit, an image signal compression circuit, a clock circuit, and an optical communication conversion circuit.

16. The semiconductor device according to claim 4,
    wherein the signal processing circuits are each embedded by the embedding member after being joined to the second semiconductor element beginning with a portion around a contacted portion.

17. The semiconductor device according to claim 16, wherein the portion includes an end side and an end point of each signal processing circuit.

18. The semiconductor device according to claim 16, wherein each signal processing circuit is smaller than the first semiconductor element.

19. The semiconductor device according to claim 16, wherein the portion includes an end side and an end point of the signal processing circuit.

20. A manufacturing method for a semiconductor device that includes:
   a first section including:
      a first semiconductor element including a first semiconductor substrate at and a first multilayer wiring layer; and
   a second section including:
      a second semiconductor element including a second semiconductor substrate and a second multilayer wiring layer; and
      a third semiconductor element including a third semiconductor substrate and a third multilayer wiring layer,
   wherein the first semiconductor element and the second semiconductor element are bonded together such that the first multilayer wiring layer and the second multilayer wiring layer face each other,
   wherein the first semiconductor element and the third semiconductor element are bonded together such that the first multilayer wiring layer and the third multilayer wiring layer face each other,
   wherein a size of the first semiconductor element is larger than a size of the second semiconductor element and a size of the third semiconductor element,
   wherein the size of the second semiconductor element is larger than the size of the third semiconductor element,
   wherein a center point of each of the first semiconductor element, the second semiconductor element and the third semiconductor element is aligned,
   wherein the first, second, and third multilayer wiring layers include a plurality of terminals,
   wherein the plurality of terminals of the first and second multilayer wiring layers are directly bonded,
   wherein the plurality of terminals of the first and third multilayer wiring layers are directly bonded, and
   wherein the first semiconductor element is disposed between the second and third semiconductor elements.

21. An imaging apparatus comprising:
   a semiconductor device that includes:
      a first section including:
         a first semiconductor element including a first semiconductor substrate at a first side and a first multilayer wiring layer at a second side that is an opposite side of the first side; and
      a second section including:
         a second semiconductor element including a second semiconductor substrate and a second multilayer wiring layer; and
         a third semiconductor element including a third semiconductor substrate and a third multilayer wiring layer,
      wherein the first semiconductor element and the second semiconductor element are bonded together such that the first multilayer wiring layer and the second multilayer wiring layer face each other,
      wherein the first semiconductor element and the third semiconductor element are bonded together such that the first multilayer wiring layer and the third multilayer wiring layer face each other,
      wherein a size of the first semiconductor element is larger than a size of the second semiconductor element and a size of the third semiconductor element,
      wherein the size of the second semiconductor element is larger than the size of the third semiconductor element,
      wherein a center point of each of the first semiconductor element, the second semiconductor element and the third semiconductor element is aligned,
      wherein the first, second, and third multilayer wiring layers include a plurality of terminals,
      wherein the plurality of terminals of the first and second multilayer wiring layers are directly bonded,
      wherein the plurality of terminals of the first and third multilayer wiring layers are directly bonded, and
      wherein the first semiconductor element is disposed between the second and third semiconductor elements.

22. Electronic equipment comprising:
   a semiconductor device that includes:
      a first section including:
         a first semiconductor element including a first semiconductor substrate at a first side and a first multilayer wiring layer at a second side that is an opposite side of the first side; and
      a second section including:
         a second semiconductor element including a second semiconductor substrate and a second multilayer wiring layer; and
         a third semiconductor element including a third semiconductor substrate and a third multilayer wiring layer,
      wherein the first semiconductor element and the second semiconductor element are bonded together such that the first multilayer wiring layer and the second multilayer wiring layer face each other,
      wherein the first semiconductor element and the third semiconductor element are bonded together such that the first multilayer wiring layer and the third multilayer wiring layer face each other,
      wherein a size of the first semiconductor element is larger than a size of the second semiconductor element and a size of the third semiconductor element,
      wherein the size of the second semiconductor element is larger than the size of the third semiconductor element,
      wherein a center point of each of the first semiconductor element, the second semiconductor element and the third semiconductor element is aligned,
      wherein the first, second, and third multilayer wiring layers include a plurality of terminals,
      wherein the plurality of terminals of the first and second multilayer wiring layers are directly bonded,
      wherein the plurality of terminals of the first and third multilayer wiring layers are directly bonded, and
      wherein the first semiconductor element is disposed between the second and third semiconductor elements.

\* \* \* \* \*